United States Patent [19]
Kumar

[11] Patent Number: 6,005,894
[45] Date of Patent: Dec. 21, 1999

[54] AM-COMPATIBLE DIGITAL BROADCASTING METHOD AND SYSTEM

[76] Inventor: Derek D. Kumar, 2313 Blackthorn Dr., Champaign, Ill. 61821

[21] Appl. No.: 08/832,813

[22] Filed: Apr. 4, 1997

[51] Int. Cl.$^6$ .................................................. H04L 27/02
[52] U.S. Cl. .......................... 375/270; 375/301; 375/321; 332/170; 329/357; 455/47; 455/109
[58] Field of Search ..................................... 375/267, 270, 375/277, 299, 301, 321, 341, 347; 332/170; 329/357; 455/47, 48, 101, 103, 104, 109, 180.1, 203, 204; 381/16; 714/777, 795

[56] References Cited

U.S. PATENT DOCUMENTS

| | | |
|---|---|---|
| 4,124,779 | 11/1978 | Berens et al. . |
| 4,569,073 | 2/1986 | Kahn . |
| 4,589,127 | 5/1986 | Loughlin . |
| 4,688,255 | 8/1987 | Kahn . |
| 5,005,169 | 4/1991 | Bronder et al. . |
| 5,265,122 | 11/1993 | Rasky et al. . |
| 5,271,041 | 12/1993 | Montreuil ................................ 375/344 |
| 5,278,844 | 1/1994 | Murphy et al. . |
| 5,315,583 | 5/1994 | Murphy et al. . |
| 5,359,625 | 10/1994 | Vander Mey et al. . |
| 5,428,610 | 6/1995 | Davis ....................................... 370/312 |
| 5,465,396 | 11/1995 | Hunsinger et al. . |
| 5,469,452 | 11/1995 | Zehavi . |
| 5,499,271 | 3/1996 | Plenge et al. . |
| 5,546,420 | 8/1996 | Seshadri et al. . |
| 5,559,830 | 9/1996 | Dapper et al. . |
| 5,588,022 | 12/1996 | Dapper et al. . |
| 5,592,471 | 1/1997 | Briskman . |
| 5,615,227 | 3/1997 | Schumacher, Jr. et al. . |
| 5,745,575 | 4/1998 | Hunsinger et al. . |
| 5,757,854 | 5/1998 | Hunsinger et al. ..................... 375/260 |

FOREIGN PATENT DOCUMENTS

WO9602101   1/1996   WIPO .

OTHER PUBLICATIONS

B.W. Kroeger and A.J. Vigil, "Improved IBOC DAB Technology for AM and FM Broadcasting", presented on Oct. 11, 1996, pp. 1–10, at the National Association of Broadcaster (NAB) Radio Show in Los Angeles, CA on Oct. 11, 1996.

*Reference Data for Engineers: Radio, Electronics, Computer, and Communications* (E.C. Jordan, editor). Indianpolis: Howard W. Sams and Co., seventh ed., pp. 1.3, 33.3 –33.11, 35.2–35.22, 1985.

J.A.C. Bingham, "Multicarrier Modulation for Data Transmission: An Idea Whose Time Has Come", IEEE Communications Magazine, vol. 28, No. 5, pp. 5–14, May 1990.

(List continued on next page.)

*Primary Examiner*—Young T. Tse
*Attorney, Agent, or Firm*—Joseph A. Rhoa

[57] ABSTRACT

A method and system are provided for the transmission and reception of a composite radio-frequency (RF) signal including a supplemental signal, preferably representing encoded digital information, together with an analog signal which represents monophonic analog audio in the AM-band. The analog monophonic component of the composite signal may be received by conventional AM-band audio receivers. In certain embodiments, the analog signal is a single-sideband large-carrier or vestigial-sideband large-carrier signal, and the composite RF signal includes a digital signal whose spectrum is substantially confined in one inner sideband. In other embodiments, a baseband digital signal is combined with an analog monophonic audio signal and transmitted in upper inner and lower inner sidebands using nonlinear compatible quadrature amplitude modulation (NC-QAM). Additional digital signals' spectrum occupies the lower outer and upper outer sidebands. In certain embodiments, for each transmitted codeword, part of the codeword information is replicated by modulated signals in both the upper outer and lower outer sidebands, preferably with diversity delay between the outer sideband signals.

27 Claims, 20 Drawing Sheets

Microfiche Appendix Included
(2 Microfiche, 151 Pages)

OTHER PUBLICATIONS

F.G. Stremler, *Introduction to Communication Systems.* Reading, MA: Addison–Wesley Publishing Co., 2nd Ed., App. H, pp. 679–687.

"Digital Audio Radio; Lab. Tests; Transmission Qual. Failure Characterization and Analog Compatibility", published by Elec. Ind. Assoc. (EIA) Consumer Elec. Group (CEG), Digital Audio Radio (DAR) subcommittee, Aug. 11, 1995, Sec. A, AI.

"MF–AM Stereo Broadcasting: the choice of modulation", IEEE Transactions on Broadcasting, vol. 25, No. 1, pp. 79–87, Mar. 1989.

K. Brandenburg and M. Bosi, "Overview of MPEG–Audio: Current and Future Standards for Low Bit–Rate Audio Coding", 99th AES Convention, New York, preprint, 4130 Fl., Oct. 6–9, pp. 1–26, 1995.

N. S. Jayant and E. Y. Chen, "Audio Compression: Technology and Applications", AT&T Technical Journal, pp. 23–34, Mar./Apr. 1955.

A.J. Viterbi, J.K. Wolf, E.Zehavi, and R. Padovani, "A Pragmatic Approach to Trellis–Coded Modulation", IEEE Communications Magazine, vol. 27, No. 7, pp. 11–19, Jul. 1989.

J.L. Ramsey, "Realization of Optimum Interleavers", IEEE Trans. on Information Theory, vol. 16, No. 3, pp. 338–345, May 1970.

W.Y. Zou and Y. Wu, "COFDM: An Overview", IEEE Trans. on Broadcasting, vol. 41, No. 1, pp. 1–8, Mar. 1995.

S.D. Stearns and R.A. David. Signal Processing Algorithms in Fortran and C. Englewood Cliffs, NJ: PTR Pren. Hall, Inc., 1993, pp. 297–302.

C.W. Trueman and S.J. Kubina, "Initial Assessment of Re–radiation From Power Lines", IEEE Trans. on Broadcasting, vol. 31 No. 3, pp. 51–65, Sep. 1985.

N.M. Maslin. *HF Communications: A Systems Approach.* New York: Plenum Press, 1987, pp. 87–98.

Y. Sakaie and R. Priemer, "An Amplitdue Modulated Stereo System", IEEE Transactions on Broadcasting, vol. 26, No. 4, pp. 125–132, Dec. 1980.

D.M. Funderburk and S. Park, "A Digital Receiver Design for AM Stereo Signals Using A General Purpose Digital Signal Processor", IEEE Trans. on Consumer Elec., vol. 40, No. 1, pp. 64–74, Feb. 1994.

Q1876 Pragmatic Trellis Decoder Data Sheet, Qualcomm Inc., VLSI Prod. 6455 Lusk Blvd., San Diego, CA 92121.

EIA Test Laboratory, 1994–95 Tests for AT&T Amati, USADR FM–2, USADR, FM–1, and AT&T Amati DSB and LSB (68 pages).

USA Digital Radio In–Band On–Channel Digital Audio Broad–cast System Description, Apr. 9, 1995 (6 pages).

USADR, FM–1 System Description (1995) (10 pages).

USADR, FM–2 System Description (1995) (13 pages).

USADR, AM IBOC DAB System Description (1995) (4 pages).

Jayant, N., Status Report or PACT and MPAC: Perceptual Audio Coders from AT&T (10 pages).

Chen, et al., AT&T–DAR Systems, Apr. 1995 (11 pages).

Jayant, N.S., The AT&T DAR System Update, pp. 389–403 (1994).

Eureka 147/DAB System Description (17 pages).

The Eureka 147 Project, Digital Audio Broadcasting (DAB) System, A Brief Description (8 pages).

G. Plenge, "DAB—A New Sound Broadcasting System. Status of the Development—Routes to its Introduction", (translated) EBU Review—Technical, No. 246, pp. 87–112, Apr. 1991.

"Improved IBOC DAB Technology for AM and FM Broadcasting" by Kroeger, (1996, USADR) (10 pages).

AM-COMPATIBLE DIGITAL BROADCASTING METHOD AND SYSTEM

This invention relates to a method of communication and a transmitter and receiver system for the terrestrial radio-frequency (RF) broadcast and reception of a digitally encoded signal together with an analog signal in the conventional AM-band of broadcast frequencies. The digital signal represents general digital (bit) information and may include a compressed digital audio signal. In certain embodiments, the spectrum of the composite digital signal includes either an upper inner or lower inner sideband about the allocation center frequency, and an analog signal representing monophonic audio occupies the other inner sideband. In other embodiments, a baseband digital signal is combined with an analog monophonic signal, and the composite signal is transmitted in the upper inner and lower inner sidebands using nonlinear compatible quadrature amplitude modulation (NC-QAM). The analog monophonic signal may be received by conventional AM-band receivers using envelope detection. For applications requiring additional bit capacity, for example, digital audio, supplemental bit information is represented by generating additional digital signals in the upper outer and lower outer sidebands. The digital receiver system of the invention detects and determines bit information from the inner sideband signals and outer sideband signals. In certain embodiments, the system of the invention is robust against the effects of one-sided first and second adjacent channel interference and other frequency-selective forms of interference due to the transmission of replicas of part of the codeword information in both the upper outer and lower outer sidebands, with or without diversity delay between the upper outer and lower outer sideband information.

RELATED APPLICATIONS

This application is related to commonly owned U.S. Ser. No. 08/666,985 (U.S. Pat. No. 5,949,796), filed Jun. 19, 1996, entitled "IN-BAND ON-CHANNEL DIGITAL BROADCASTING METHOD AND SYSTEM" and U.S. Ser. No. 08/586,214 (U.S. Pat. No. 5,748,677), filed Jan. 1, 1996, entitled "REFERENCE SIGNAL COMMUNICATION METHOD AND SYSTEM," the disclosures of which are each hereby incorporated herein by reference.

CLAIM TO COPYRIGHT IN REFERENCE TO MICROFICHE APPENDIX

A portion of the disclosure of this patent application contains material which is subject to copyright protection. The copyright owner has no objection to the reproduction by anyone of the patent document as it appears in the Patent and Trademark Office files or records, but otherwise reserves all copyrights whatsoever. Software for carrying out some of the methods and systems described herein has been filed with the United States Patent and Trademark Office herewith in the form of a microfiche appendix including numerous frames, one of which being a title frame. The microfiche appendix is entitled AM-COMPATIBLE DIGITAL BROADCASTING METHOD AND SYSTEM and includes two (2) sheets of microfiche containing one hundred fifty-one (151) frames.

The microfiche includes two ASCII files: CODE.TXT and DATA.TXT, CODE.TXT including source code for redundant modulation and demodulation of sideband digital signals using pragmatic trellis coded modulation and a dynamic codeword diversity selector/combiner. DATA.TXT includes OFDM subcarrier signal representations for inner and outer sideband waveforms, as well as Hilbert transform tap weights for an SSB embodiment of the analog signal.

BACKGROUND OF THE INVENTION

There is a scarcity of contiguous amounts of available (unused) spectrum at those radio frequencies which are desirable for wide-coverage terrestrial broadcast communication systems in the high frequency (HF) band, between 3 megahertz (MHz) and 30 MHz, and especially in the low frequency (LF) band, between 300 kilohertz (kHz) and 3,000 kHz. In certain cases, the spectrum of certain conventional information-bearing signals does not entirely occupy a particular frequency allocation, and/or the existing signals may not utilize all of the signaling dimensions, for example, having only amplitude modulation or phase modulation, but not both at once. As a result, it is desirable to generate supplemental signals, especially digitally-encoded signals, in the unoccupied parts of existing bandwidth allocations and/or by making use of underutilized signaling dimensions in order to provide capacity for digital (bit) information in a manner that does not introduce significant amounts of interference to existing signals. The additional information capacity is used for the introduction of new broadcast services, for example, navigation and subscription messaging, and/or the enhancement of existing broadcast services, for example, digital audio broadcasting to provide recovered audio quality comparable to high fidelity tape and compact disc (CD) recordings.

In the United States, the commercial (expanded) AM broadcast band presently occupies a part of the LF band of frequencies between 535 kHz and 1705 kHz, inclusive. The frequency region is subdivided into a plurality of channel allocations with an interchannel frequency separation of 10 kHz (an interchannel frequency separation of 9 kHz allocations has been proposed). Licensed radio stations are subject to restrictions on permissible AM-band signal power, spectrum occupancy (i.e. bandwidth), and geographic location in order to control the expected amounts of interference between stations. Rules and regulations regarding the licensing and operation of AM-band stations are enacted and enforced by the Federal Communications Commission (FCC) in the United States. A restriction for AM-band sound broadcast signals is determined by the FCC "emissions mask". The emissions mask specifies a power spectrum density curve which defines the maximum allowable power of a discrete emission with respect to the licensed power as a function of the frequency offset from the nominal AM-band channel center frequency. Discrete emission compliance at a particular frequency is measured over a 300 Hz integration bandwidth.

Prior art FIG. 1 is a graph which illustrates an emissions mask for AM-band broadcast signals in the United States. The abscissa values are the frequency offset with respect to nominal AM-band channel allocation center frequency 1. The ordinate values are the decibel spectrum magnitudes with respect to the licensed modulated carrier power (dBc). The emissions mask is shown as bold curve 3. Conventional monophonic analog AM signal 7 is the modulated signal representation of the arithmetic sum L+R of the left (L) and right (R) conventional analog audio signals. Conventional monophonic AM signal 7 is substantially confined within, under, and/or beneath emissions mask 3. The center region of mask 3 includes upper inner 5 and lower inner 9 sidebands and occupies a two-sided bandwidth of about 20.4 kHz (i.e. 9.9 kHz+0.3 kHz+0.3 kHz+9.9 kHz) around channel center frequency 1. In the center region, the maximum emission power may be as large as the licensed power; in other words, −0 dBc. Outer sideband regions 13 and 11 are disjoint and immediately adjacent to inner sidebands 5 and 9, respectively, at positive and negative frequency offsets, respectively, with respect to center frequency 1. Upper outer sideband region 13 occupies 9.8 kHz, beginning at a positive 10.2 kHz offset and extending to a 20 kHz offset. Lower outer sideband region 11 also occupies 9.8 kHz, beginning at a negative 10.2 kHz frequency offset with respect to center frequency 1 and extending to a negative offset of 20 kHz. It will be understood by those of skill in the art that the bandwidth occupancies of sidebands 5, 9, 11, and 13 are to change.

In outer sidebands 11 and 13, the maximum power of a discrete emission is attenuated by at least 25 decibels with respect to the licensed power; in other words, −25 dBc. Conventional AM-band broadcasting uses large-carrier amplitude modulation so that a significant fraction of the RF signal power is emitted as the sinusoidal carrier component with center frequency 1. In many circumstances, analog signal 7 may be substantially confined in a spectrum region within inner sidebands 5 and 9, closer to a two-sided bandwidth of 14 kHz (±7 kHz) than 20.4 kHz around center frequency 1, with outer sidebands 11 and 13 substantially unoccupied. There are additional sideband regions defined in emissions mask 3 which are not shown in FIG. 1, beginning at ±20 kHz with respect to center frequency 1, which extend significantly beyond outer sidebands 11 and 13.

Since the bandwidth of conventional monophonic AM signal 7 does not occupy all of the spectrum allocated in inner sidebands 5 and 9 and outer sidebands 11 and 13 within emissions mask 3, it is known that one or more supplemental information-bearing signals, preferably representing digital information, may be transmitted together with conventional monophonic analog AM-band signal 7, while still remaining substantially confined within emissions mask 3. When the generation of the supplemental signal is unrelated to conventional analog AM signal 7, the spectrum of the supplemental (i.e. digital) signal is typically confined to outer sidebands 11 and 13 in order to prevent mutual interference between the analog AM signal and the digital signal. In certain circumstances, when the digital signal is related to conventional analog AM signal 7, the spectrum of the digital signal may also include part of or the entirety of inner sidebands 5 and 9. In general, the sideband regions beyond (i.e. at greater frequency offsets than) upper outer 13 and lower outer 11 sidebands are unsuitable for use in broadcasting a supplemental digital signal which provides wide geographic coverage because i) the permissible amount of emitted power in these sidebands is very small, e.g. no more than −35 dBc, and ii) signals at a such a large frequency offset from center frequency 1 may be subject to (or cause) significant amounts of interference from (or to) stations with AM-band transmitters operating on adjacent frequency channel allocations.

In certain applications, it is known that the supplemental digital signal represents a compressed digital audio signal to accomplish the goal of improving the received quality of voice and sound transmissions for broadcasting in the AM-band. U.S. Pat. No. 5,588,022 to Dapper, et. al., describes an In-band On-channel (IBOC) Digital Audio Broadcasting (DAB) communication system for use in the AM-band. In the '022 system, a digital signal, preferably representing a source-compressed high quality audio signal, is combined with a conventional analog AM signal to determine a composite RF signal which is substantially confined within the FCC emissions mask for the AM-band. IBOC DAB makes use of the existing infrastructure of transmitter systems and does not disrupt the economic model for sound broadcasting in the United States. In the '022 system, the composite RF signal is transmitted using a conventional AM transmitter and antenna system so long as the transmission system has sufficiently low distortion and wide bandwidth. A graph representing the spectrum of the signals in the '022 system is shown in prior art FIG. 2, where the composite RF signal spans a bandwidth of 40 kHz and is the additive sum of digital signals generated in upper outer 13 and lower outer 11 sidebands, conventional large carrier analog AM signal 7, and upper inner 5 and lower inner 9 sideband digital signals. Each sideband digital signal is composed of a plurality of narrowband orthogonal sinusoidal subcarriers which are generated and summed together according to the known method of Orthogonal Frequency Division Multiplexing (OFDM), also known variously as Coded Orthogonal Frequency Division Multiplexing (COFDM), Multicarrier Modulation (MCM), and Discrete Multitone Modulation [reference: J. A. C. Bingham, "Multicarrier modulation for data transmission: an idea whose time has come," *IEEE Communications Magazine*, Vol. 28, No. 5, pp. 5–14, May 1990]. The narrowband subcarriers are each digitally modulated with either binary phase-shift keying (BPSK), quaternary phase-shift keying (QPSK), or 32-ary quadrature amplitude modulation (QAM).

In FIG. 2, groups of OFDM subcarriers are generated to occupy substantially all of upper outer 13 and lower outer 11 sidebands defined under emissions mask 3. These modulated subcarriers have both an in-phase and quadrature signal component with respect to conventional monophonic analog AM signal 7. In the center region of emissions mask 3, the OFDM subcarrier group in lower inner sideband 9 and the OFDM subcarrier group in upper inner sideband 5 are generated as complementary pairs (i.e. each subcarrier in group 5 has a corresponding subcarrier in group 9 with a predetermined phase relationship) so that the resulting composite signal for the inner sidebands has a linear phase-quadrature relationship (i.e. out-of-phase by 90° or π/2 radians or positive or negative odd integer multiple thereof) to analog AM signal 7. As a result of the linear phase-quadrature relationship, the spectrum of the composite digital signal in the inner sidebands may substantially overlap in frequency the spectrum of conventional analog AM signal 7. In the '022 patent, conventional analog AM signal 7 is referred to as an I (in-phase) signal, and the composite inner sideband digital signal is referred to as a Q (quadrature) signal. The quadrature composite inner sideband digital signal is also attenuated with respect to the analog AM signal by a significant amount which varies according to each subcarrier in the composite. Since the composite inner sideband digital signal is phase-quadrature to the conventional analog AM-band signal, the two signals may be readily separated from each other in the corresponding receiver system in the absence of distortion using the known method of synchronous linear demodulation. In the '022 system, additional bit information is conveyed by OFDM digital signals generated to occupy upper outer 13 and lower outer 11 sidebands in addition to inner sidebands 5 and 9. However, unlike the composite inner sideband digital signal, the upper and lower outer sideband digital signals have both in-phase and quadrature signal components and are not phase-quadrature to conventional analog AM signal 7. In order to prevent mutual interference between the outer sideband signals and the analog AM signal, the outer sideband signals have to be substantially frequency-orthogonal to conventional analog AM signal 7. The outer sideband signals may be separated from the analog AM signal in the receiver system using bandpass filtering. The correlation processing used in the conventional demodulation of OFDM signals by the Fast Fourier Transform (FFT) mathematical algorithm inherently accomplishes some amount of bandpass filtering.

The premise that a supplemental signal can occupy the same spectrum as conventional analog AM signal 7 by generating the supplemental signal so that it is quadrature to the conventional analog AM signal was known prior to the '022 system, without consideration of whether such signal represents analog or digital information. Various such systems were developed for the application of analog AM-band stereo broadcasting. For example, the analog AM stereo system proposed by Harris [reference: F. G. Stremler. Introduction to Communication Systems. Reading, MA: Addison-Wesley Publishing Company, 2nd edition, appendix H, pp. 679–687] uses linear quadrature amplitude modulation (QAM) to generate two phase-quadrature signals which occupy the inner sidebands in AM-band emissions mask 3; see also U.S. Pat. No. 4,458,361 to Tanabe, et. al., and Y. Sakaie, et. al., "An amplitude-modulated stereo system", *IEEE Transactions on Broadcasting,* Vol. 26, No. 4, pp. 125–132, Dec. 1980. One of the signals is, or is related to, conventional monophonic L+R analog AM signal 7, and the other signal is, or is related to, an analog representation of the L–R stereo difference signal.

U.S. Pat. No. 4,688,255 to Kahn, describes a system in which a digital signal is generated to be phase-quadrature to the conventional analog AM signal. The digital signal is a narrowband phase-shift keyed (PSK) sinusoidal waveform, whose spectrum includes narrowband emissions at frequency offsets of about ±10 kHz from AM-band channel allocation center frequency 1. The spectrum of the digital signal in the '255 system does not significantly overlap the spectrum of the conventional analog AM signal so that compatibility with both monophonic and stereophonic analog AM-band signals is maintained. The amount of power in the transmitted digital signals is varied according to the analog signal power in order to minimize interference in the recovered analog audio signal. A disadvantage of the '255 system is that only a small amount of bandwidth is available for generation of the digital signal. Furthermore, reception of the digital signal is deleteriously affected in the first-adjacent interference circumstance because the upper or lower sideband signals may be substantially occluded, yet both sidebands are always combined in the '255 receiver system.

A known disadvantage of linear phase-quadrature methods for generating a supplemental signal to the conventional analog AM signal, whether representing analog or digital information, is that the existence of the quadrature signal causes distortion in the received and determined analog AM signal estimate in analog AM-band receivers which implement envelope detection. Envelope detection is widely implemented for the demodulation of monophonic analog AM signals because of its simplicity and low cost. Unfortunately, envelope detectors for demodulating monophonic analog AM signals are responsive to both the in-phase signal component, which is desirable when the in-phase signal component is the monophonic analog AM signal, and the quadrature signal component, which is undesirable when the quadrature signal component is the supplemental signal. In order to minimize the amount of distortion introduced by the quadrature signal for envelope detection receivers, the quadrature signal is typically either i) significantly attenuated when compared to the in-phase analog AM signal, as described in the Harris AM-band analog stereo system proposal, or ii) an envelope-correcting factor is introduced which affects to substantially cancel the distortion caused by the quadrature signal in envelope detection receivers, as described in the Motorola AM-band analog stereo system proposal [reference: F. G. Stremler. Introduction to Communication Systems. ibid.]. An advantage of the Motorola AM-band analog stereo system proposal is that the supplemental signal, which is the analog stereo difference signal, may be transmitted at a power level comparable to the monophonic analog AM signal. Comparable power levels are desirable so that the coverage provided by the analog AM stereo signal is similar to that provided by a conventional monophonic analog AM signal. However, the Motorola analog stereo system proposal requires a more complicated receiver system because the effect of the envelope-correction factor has to be removed in order to recover the stereo difference signal.

In the '022 system to Dapper, et. al., the deleterious effect of the quadrature composite inner sideband digital signal on conventional analog AM receivers with envelope detection is mitigated by the significant attenuation of the composite inner sideband digital signal when compared to the analog AM signal. This approach is similar to the Harris analog AM stereo system proposal although the specific method for accomplishing attenuation is different; in the Harris system, a phase offset is introduced between the quadrature signals. Under ideal RF propagation conditions, the low-power digital signal may be separated from the received composite RF signal, which also includes the high-power analog AM signal, with relatively small distortion to the recovered digital signal. However, when the RF propagation conditions are dispersive (e.g. frequency-selective with non-flat group delay) or the transmitter and receiver implementations have appreciable nonlinearities or dispersion, mutual interference between the analog AM signal and the digital signal in the '022 systems may be caused by "cross-talk"; in other words, the loss of the phase-quadrature relationship between the signals, also called the loss of "orthogonality". Since the analog AM signal has substantially larger power than the digital signal, a relatively small amount of crosstalk measured, for example, by equivalent phase error, may result in substantial interference from the analog AM signal to the recovered digital signal.

There are also disadvantages to the '022 system in circumstances where there are other operating AM-band transmitters with the same or similar allocation center frequencies. In order to convey a large amount of user source bit information (e.g. 96 kbit/sec) in a relatively narrow bandwidth (e.g. 40 kHz), the modulation method implemented in the '022 system has to provide for a very high user bit information density, between about 3 bits/Hz/sec and 5 bits/Hz/sec, depending upon the specific bit throughput requirements and the amounts of forward error correction (FEC) redundancy included with the user source bit information. Such high information densities require a relatively large signal-to-noise ratio (SNR) for adequate receiver operation at a sufficiently low bit error rate (BER), typically a BER of less than about $1 \times 10^{-6}$ after error correction for digital audio applications. According to published laboratory data for an AM-band IBOC DAB system whose description is similar to that of the '022 system, impairment of the received digital audio signal occurs at a SNR ratio of 19 dB, which is quite large (a large required SNR is undesirable) [reference: "Digital Audio Radio; Laboratory Tests; Transmission Quality Failure Characterization and Analog Compatibility," published by Electronic Industries Association (EIA) Consumer Electronics Group (CEG), Digital Audio Radio (DAR) Subcommittee, Aug. 11, 1995, sections A, AI].

As described previously, the FCC Rules and Regulations act to restrict the power, bandwidth and geographic location of AM-band transmitters with similar allocation frequencies. These rules permit AM-band transmitters with the same channel allocation frequency (e.g. center frequency 1), known as co-channel transmitters, to be situated so that the ratio between desired and undesired signal energies, known as the "D/U ratio", at the edge of coverage for the desired transmitter's signal is only 20:1, which is 26 dB. According to the '022 patent, the power of each OFDM subcarrier in the digital signal is less than −25 dBc (excluding the two innermost subcarriers used for frequency-tracking only). Thus, at the edge of coverage, the interfering analog AM signal power becomes comparable to the digital signal power. Since a relatively large SNR (e.g. 19 dB) is needed for proper operation of the digital signal receiver, having comparable amounts of digital signal power and interfering analog signal power may cause digital receiver failure. As a result, the digital signal may not be reliably received except when the digital signal receiver is in close physical proximity to the desired signal's transmitter; in other words, the coverage of the digital signal is adversely affected when compared to the coverage of the conventional analog AM signal. Signal coverage over a wide area is important to minimize the number of transmitters needed to provide sufficient signal strength over a particular geographic region. A primary goal of IBOC DAB systems, whether operating in the AM-band or the FM-band, is to provide digital signal coverage comparable to the corresponding analog signal coverage.

There are other interference circumstances where the effects of adjacent AM-band transmitters on the operation of the '022 system are even more deleterious than in the case of co-channel interference. Prior art FIG. 3 is a graph which illustrates a circumstance where there is an operating AM-band transmitter under the first-adjacent circumstance. This occurs for (interfering) transmitters with allocation center frequencies at a positive or negative 10 kHz offset from center frequency 1 of the desired transmitter's signal. In FIG. 3, a first adjacent interferer is shown with positive offset center frequency 19, but the choice for illustration purposes is arbitrary. According to FCC Rules and Regulations, for an analog AM receiver located at the edge of coverage for the desired signal, the amount of interfering power in the received signal due to a possible first adjacent AM-band transmitter may be as much as one-fourth (i.e. a D/U ratio of 6 dB) as the desired signal's power. A more optimistic circumstance is shown in FIG. 3, which corresponds to a situation where the receiver is closer to the desired signal's transmitter. The spectrum of interfering analog AM signal 21 significantly occludes both upper inner 5 and upper outer 13 sideband regions in the spectrum of the desired signal, so that reliable determination of unique information in each of these sidebands may not be possible. Lower outer sideband 11 is substantially unaffected. When the interfering transmitter also emits an IBOC DAB signal according to the '022 patent, there may also be interference between lower outer digital sideband 23 of the interfering signal and lower inner digital sideband 9 of the desired signal. FIG. 3 shows only one first-adjacent interferer. In general, there may zero, one, or two or more first-adjacent interferers. However, the probability of two or more first-adjacent interferers causing large amounts of interference at a particular receiver location within the expected coverage of the desired analog AM (and supplemental digital) signal is small. According to the previously referenced EIA CEG DAR laboratory test report, an AM-band IBOC DAB system similar to that described in the '022 patent exhibited impairments in the recovered digital audio signal when the D/U ratio was as high as about 31 dB (~35:1) with digital receiver system failure (i.e. muting) at a D/U ratio of about 28 dB. Thus, even a small amount of first-adjacent interference may cause appreciable degradation of the receiver performance in the '022 system.

Prior art FIG. 4 shows an interference circumstance known as second-adjacent interference. Second-adjacent interfering AM-band transmitters are located at frequency offsets of positive 20 kHz and/or negative 20 kHz from desired transmitter's allocation center frequency 1. FIG. 4 shows one interferer at positive 20 kHz offset 27, but in general, there may zero, one, two, or more second-adjacent interferers situated at positive and negative 20 kHz offsets. FCC Rules and Regulations permit the interference power to be about equal to the desired signal power (D/U is 0 dB or 1:1) at the edge of coverage for the desired signal. For the second-adjacent circumstance in FIG. 4, the spectrum of interfering analog AM signal 37 occludes a substantial part of the spectrum of upper outer sideband 13. Correspondingly, the analog AM signal of a second adjacent interferer at a frequency offset of −20 kHz (not shown) would occlude part of lower outer digital sideband 11. If the interfering transmitter also emits an IBOC DAB signal, lower outer digital sideband 38 of the interfering transmitter's signal spectrum substantially occludes upper inner digital sideband 5 of the desired signal's spectrum. According to the EIA CEG DAR laboratory test report, an AM-band IBOC DAB system similar to that described in the '022 patent exhibited impairment of the recovered digital audio signal at a D/U ratio of about 31 dB. In other words, the performance of the digital signal receiver was significantly impaired with an amount of interference that is approximately 35 times weaker than the amount of interference permitted by the FCC Rules and Regulations at the edge of coverage. Thus, the potential coverage of the '022 system is made substantially smaller than the corresponding coverage of the analog AM signal by the presence of adjacent channel AM-band transmitters, which is undesirable. In both the first adjacent and second-adjacent circumstances, the outer digital sidelobes may also cause interference to the recovered conventional adjacent-channel analog AM signal because of the spectrum overlap.

Various methods other than phase-orthogonal linear quadrature amplitude modulation (QAM) for generating a supplemental signal were investigated for the purpose of compatible analog AM-band stereo broadcasting. A proposal by Kahn/Hazeltine described a system in which the left (L) and right (R) conventional analog audio signals are represented by independent upper and lower inner sidebands within the inner sidebands of the emissions mask [reference: F. G. Stremler. *Introduction to Communication Systems.* ibid.]; see also U.S. Pat. No. 4,589,127 to Loughlin, U.S. Pat. No. 4,124,779 to Berens, et. al., and U.S. Pat. No. 4,569,073 to Kahn. In the Kahn system, the lower inner sideband is the single-sideband modulated representation of the left audio signal and the upper inner sideband represents the single-sideband modulated representation of the right audio signal, or vice versa. Prior art FIG. 5 is a graph which shows the spectrum of such an independent sideband method for analog AM stereo broadcasting. Unlike conventional analog AM signal 7 shown in prior art FIGS. 1–4 in which the analog signal sidebands are even-symmetric around center frequency 1, inner upper 33 (right) and inner lower 31 (left) analog signal sidebands in FIG. 5 are not symmetric, in general. However, it is known that when a conventional analog AM signal receiver is tuned to center frequency 1, then the monophonic (L+R) audio signal recovered in the receiver by envelope detection will be approximately equal to the monophonic audio signal recovered from conventional analog AM signal 7. The implementation of analog AM stereo broadcasting according to the Kahn/Hazeltine system precludes the generation of a supplemental digital signal in the upper inner or lower inner sidebands because all available signaling dimensions are utilized, and there is substantially no unoccupied bandwidth.

Prior art FIG. 6 shows the spectrum of an analog signal according to the Motorola method of compatible quadrature amplitude modulation, which is known by the trademark C-QUAM, for analog audio stereo broadcasting in the AM-band; see also M. Temerinac, et. al., "MF-AM stereo broadcasting: the choice of modulation," *IEEE Transactions on Broadcasting*, Vol. 25, No. 1, pp. 79–87, March 1989. In a C-QUAM™ analog AM-band stereo system transmitter, the analog audio stereo difference L–R signal and analog audio stereo sum L+R signal (i.e. the monophonic audio signal) are first modulated with quadrature amplitude modulation (QAM). The resulting signal is processed by an amplitude-limiter to remove amplitude variations in the resulting signal, and the amplitude-limited signal is subsequently amplitude-modulated by the analog audio stereo sum signal L+R. The presence of the amplitude-limiter results in a nonlinear method of modulation. The resulting signal's bandwidth, as determined by the spectrum occupancy of exemplary C-QUAM™ upper sideband 32 and C-QUAM™ lower sideband 34 in FIG. 6, is greater than when a substantially linear method of modulation, such as conventional amplitude modulation (AM) or quadrature amplitude modulation (QAM), is implemented. An advantage of the C-QUAM™ method for analog audio stereo broadcasting in the AM-band is that the composite RF signal is compatible with envelope detection receivers even when the audio stereo difference and audio stereo sum signals are of comparable magnitude.

The described prior art '022 and '255 systems for generating a supplemental digital signal which is compatible with AM-band analog broadcasting have the disadvantage of a smaller potential coverage when compared to conventional analog AM signals due to external interference caused by co-channel and adjacent channel AM-band transmitters. The prior art '022 system is also susceptible to self-interference due to cross-talk under dispersive RF propagation conditions because of the disparity in analog AM and digital signal power and the substantial overlap in frequency between the analog and digital signals in the inner sidebands. Accordingly, it is apparent from the above that there exists a need in the art of AM-compatible digital broadcasting for: (i) generating a supplemental digital signal which has sufficient bit information throughput for applications such as digital audio broadcasting; (ii) generating a supplemental digital signal whose reception is robust against the effects of frequency-selective distortion and adjacent channel interference; (iii) generating a supplemental digital signal whose reception is robust against the effects of cross-talk under non-ideal RF propagation conditions; and (iv) generating a supplemental digital signal with improved compatibility for analog AM-band receivers with envelope detection.

SUMMARY OF THE INVENTION

This invention fulfills the above-described needs in the art by providing a method and system for the transmission and reception of a supplemental signal, preferably representing digital information, together with an analog signal, preferably representing conventional monophonic analog audio, so that the composite RF signal, including analog and digital signals, generated in the transmitter system is approximately confined within the FCC emissions mask for AM-band sound broadcasting and so that the analog signal may be received by conventional analog AM receivers which implement envelope detection.

According to certain embodiments of this invention, in the transmitter system, the conventional large-carrier amplitude-modulation RF signal used to convey monophonic analog audio information in the AM-band is replaced with an analog signal which represents substantially the same monophonic analog audio information as the conventional signal but which is generated as one of the following: i) an upper inner or lower inner analog sideband about the AM-band allocation center frequency with a large carrier signal component, referred to as a single-sideband large-carrier (SSB-LC) analog signal embodiment; or ii) a vestigial-sideband large-carrier (VSB-LC) analog signal embodiment with a large carrier signal component and an analog signal whose spectrum occupies substantially either the upper inner or lower inner sideband and a smaller part of the other inner sideband. The generation of a large carrier signal component together with appropriate generation of the single-sideband or vestigial-sideband analog signal allows for the use of conventional analog AM receivers (i.e. receivers meant to receive large-carrier amplitude modulation signals in the AM-band) using envelope detection for determination of the analog signal. In another embodiment in which the analog signal is neither SSB-LC nor VSB-LC, a baseband digital signal is combined with a lowpass-filtered analog monophonic audio signal and the resulting signal is transmitted using nonlinear compatible quadrature amplitude modulation (NC-QAM) in the upper inner and lower inner sidebands. Although the spectrum of the transmitted analog signal of the invention differs from conventional AM-band analog signals, the signal conveys substantially the same monophonic analog audio information, is about confined within the AM-band emissions mask, and is compatible with existing monophonic analog AM-band receivers which implement envelope detection.

The generation of the compatible analog signal according to the invention allows for the generation of a supplemental signal, preferably representing digital information. According to the certain embodiments of the invention, the spectrum of the supplemental digital signal is able to occupy a part of the frequency range within the center region of the AM-band emissions mask without causing or being subject to large amounts of interference from the analog signal. In the single-sideband embodiment of the invention, the spectrum of the analog signal of the invention is substantially confined within either the upper inner or lower inner sidebands, while the other inner sideband region is occupied by the digital signal. In the vestigial-sideband embodiment of the invention, the spectrum of the analog signal occupies a larger part of either the upper inner or lower inner sideband (and a smaller part of the other inner sideband), and the spectrum of the digital signal occupies the unoccupied part of the other, substantially unoccupied inner sideband. In the single-sideband and vestigial-sideband embodiments, the analog and digital signals have no predetermined phase-relationship (in other words, they are not necessarily phase-quadrature, however, the analog and digital carrier signals may be coherent). In many circumstances, the single-sideband embodiment of the invention is preferred over the vestigial-sideband embodiment because a larger frequency range is available for the supplemental digital signal. The primary advantage of the vestigial-sideband embodiment is that it may simplify implementation of the filtering in the transmitter system.

In the NC-QAM embodiments of the invention, the analog and digital signals are inter-related, but they are not phase-quadrature because of the nonlinear method of modulation. An advantage of the NC-QAM embodiments is that the digital signal in the inner sidebands may be transmitted with more power than the digital signal inner sideband in the single-sideband or vestigial-sideband embodiments, without causing large amounts of distortion in audio signals recovered by envelope detection AM receivers. In certain embodiments, the NC-QAM signal is generated using a modified C-QUAM™ analog AM-band stereo signal generator, where the conventional left (L) audio stereo signal is replaced by the arithmetic difference of the monophonic analog audio signal and the digital baseband signal, and where the right (R) audio signal input is replaced with the arithmetic sum of the monophonic analog audio signal and the digital baseband signal, or vice versa. None of the above-mentioned embodiments, all of which generate a digital signal whose spectrum includes at least one inner sideband region, are compatible with the previously referenced methods of analog AM stereophonic broadcasting (i.e. Motorola, Harris, Kahn/Hazeltine), so that only monophonic analog audio information may be transmitted. However, the digital audio signal which may be represented by the bit information in the digital signals may include stereo information.

An advantage of the single-sideband and vestigial-sideband embodiments of the invention is that since the spectrum of the analog and digital signals do not significantly overlap (i.e. the analog and digital signals are approximately frequency-orthogonal), the digital and analog signals may be recovered independently. This frequency-orthogonality characteristic also reduces the susceptibility of the receiver system to cross-talk interference due to implementation nonlinearities and dispersive RF propagation conditions.

According to the invention, additional digital information may be represented by the generation of signals which are substantially confined within the upper outer and lower outer sidebands in the AM-band emissions mask. For SSB-LC and VSB-LC embodiments, these signals are summed together with the digital signal in the inner sideband. The composite digital signal is summed together with the SSB-LC or VSB-LC analog signal to determine the composite RF signal, which is subsequently amplified, filtered, and emitted for free-space propagation.

When NC-QAM modulation is implemented for the combined inner sideband digital and analog signals, the inner sideband combined digital and analog signals are summed together with the outer sideband digital signals to determine the composite RF signal, which is subsequently amplified, filtered, and emitted for free-space propagation. Because of the approximate frequency-orthogonality between the inner and outer sideband regions, there is no requirement for a specific phase relationship between the inner and outer sideband digital signals, in general. However, it is preferable that digital signals in the inner and outer sidebands have about the same symbol (baud) interval and are generated coherently to simplify the receiver implementation.

In certain transmitter system embodiments, part of the encoded source bit (codeword) information is redundantly transmitted in digital signals in both the upper outer and lower outer sidebands to combat the deleterious effects of adjacent-channel interference and other forms of frequency-selective interference which may affect either the upper outer or lower outer sideband, but not both outer sidebands at once. In certain preferable embodiments, diversity delay is introduced between the transmission of the codeword information which is replicated in the upper outer and lower outer sidebands, so that the system is robust against forms of interference and noise which affect both upper and lower outer sidebands at once, but when such interference is of a short duration, less than the amount of diversity delay. A sideband digital signal or baseband digital signal includes a plurality of modulated subcarrier waveforms, which are summed together, and may include a reference signal. The set of subcarrier waveforms include three groups: a set of waveforms whose spectrum is individually and as a composite confined substantially within one sideband, either the upper inner or lower inner sidebands for SSB-LC and VSB-LC embodiments, or a baseband digital sideband for NC-QAM embodiments which after NC-QAM modulation occupies both inner sidebands; a set of waveforms whose spectrum is individually and as a composite confined substantially within the upper outer sideband; and a set of waveforms whose spectrum is individually and as a composite confined substantially within the lower outer sideband. Each subcarrier modulator may make use of one or a plurality of subcarrier waveforms (within the sideband), for example, modulating in I&Q pairs. Different source bit information may be represented by signals transmitted in the inner sideband and outer sideband regions (i.e. separate encoding/decoding steps for the inner and outer sidebands), or preferably, encoded source bit (codeword) information symbols are divided amongst subcarrier modulators in both the inner and outer sidebands. For the SSB-LC and VSC-LC embodiments, the transmitted digital signals have substantially less power than the transmitted analog signal (including the large-carrier signal component). For NC-QAM embodiments, the outer sideband digital signals have substantially less power than the combined analog and digital signals in the inner sidebands. However, the baseband digital signal and monophonic audio signal components in the nonlinear NC-QAM signal in the inner sidebands may be transmitted with comparable amounts of power.

Each digital sideband or baseband signal is a composite signal which is generated by known methods of digital modulation, error correction encoding, and source information encoding. For example, suitable methods of digital modulation include, but are not limited to, prior art multi-carrier OFDM modulation and multi-carrier shaped spread spectrum modulation. In general, modulation methods which use a plurality of modulated subcarriers (multi-carrier) are preferred, with effective symbol intervals greater than about 1 millisecond and less than about 100 milliseconds, because of their greater immunity to impulse interference and sky-wave multipath propagation than single-carrier modulation methods. The presence of impulse interference is common in the reception of AM-band signals due to various man-made (e.g. spark-noise) and atmospheric (e.g. lightning) noise sources. Sky-wave interference in the AM-band is caused by RF signal reflections from the ionosphere, primarily at night. Typical methods of error correction encoding include, but are not limited to, convolutional encoding, trellis encoding, pragmatic trellis encoding, and block encoding. In certain embodiments, the digital modulation method implemented operates at an effective average user source bit information density of between about 2 bits/Hz/sec and 5 bits/Hz/sec, preferably closer to 3 bits/Hz/sec, using for example, rate ¾ 16-ary pragmatic trellis-coded modulation (PTCM). For digital audio applications, the desired user source bit throughput is between about 48–64 kbit/sec, which with a user bit information density of about 3 bits/Hz/sec (e.g. rate ¾ 16-ary PTCM), requires between about 16–21 kHz of bandwidth (not including spectrum occupied by the redundant outer sideband and analog signal). In certain embodiments of the invention, the source bit rate throughput is about equally divided between digital signals in the inner sidebands of the emissions mask and digital signals in the outer sidebands (the encoded bit throughput of the outer sidebands is larger because of the replication of the information in both outer sidebands).

In the receiver system of the invention, the supplemental digital signal is detected and determined using demodulation and decoding methods which correspond to those implemented in the transmitter system. Bandpass filtering is used to separate the outer sideband digital signals from the composite RF signal, which also includes the SSB-LC or VSB-LC analog signal or combined NC-QAM inner sideband digital and analog signals, in the receiver system. After bandpass filtering, the outer sideband digital signals are demodulated and determined using known methods of digital demodulation, error correction decoding, and source information decoding. In certain embodiments, the large-carrier signal component of the analog signal is used to recover the digital signal carrier frequency in the receiver system, and a transmitted reference signal is used to recover the baud (symbol) clock and/or to facilitate equalization. For SSB-LC and VSB-LC embodiments, bandpass filtering may also be implemented to separate the inner sideband digital and analog signals. However, for NC-QAM embodiments, the combined analog and digital signal is first demodulated using nonlinear NC-QAM demodulation methods in order to determine an estimate of the transmitted baseband digital signal in the NC-QAM combined signal. After nonlinear separation for NC-QAM demodulation, the baseband digital signal is subsequently demodulated using methods similar to those for the demodulation of an inner sideband digital signal.

When part of the codeword information is replicated in both the upper outer and lower outer sidebands, with or without diversity delay, the receiver system of the invention is able to select between determined source bit estimates for each at least partially redundantly transmitted codeword, or combine estimated bit information from the demodulation of the upper outer and lower outer sidebands to determine a combined source bit estimate, dynamically on a codeword-by-codeword basis according to methods described in U.S. Pat. No. 5,949,786.

BRIEF DESCRIPTION OF THE DRAWINGS

FIG. 1 also illustrates the spectrum of a conventional large-carrier amplitude modulation (AM) signal representing monophonic (L+R) analog audio information.

DETAILED DESCRIPTION OF CERTAIN EMBODIMENTS OF THIS INVENTION

Figure 1:
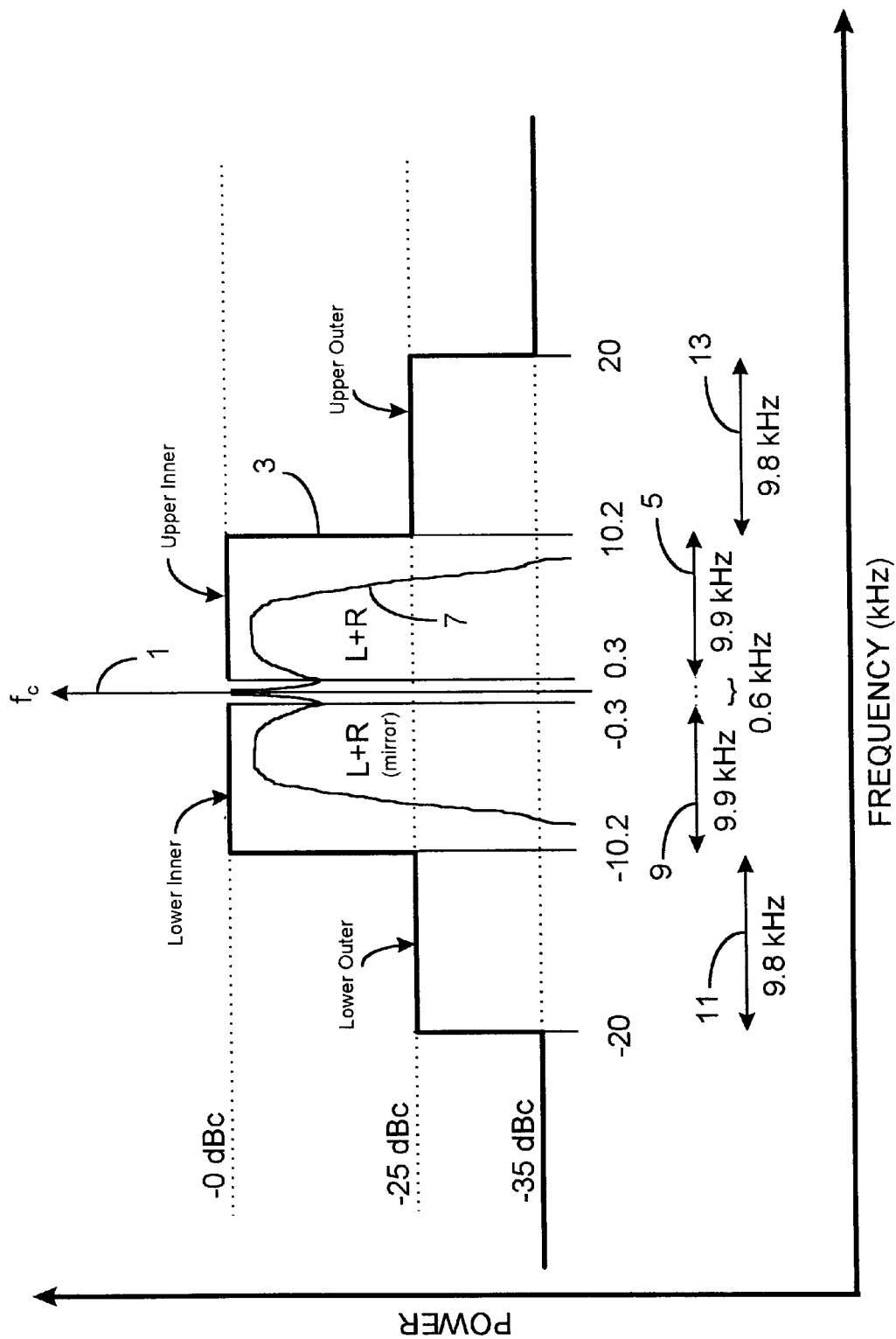
FIG. 1 is a prior art graph of the RF emissions mask for analog audio transmissions in the AM-band according to the FCC Rules and Regulations.
Figure 2:
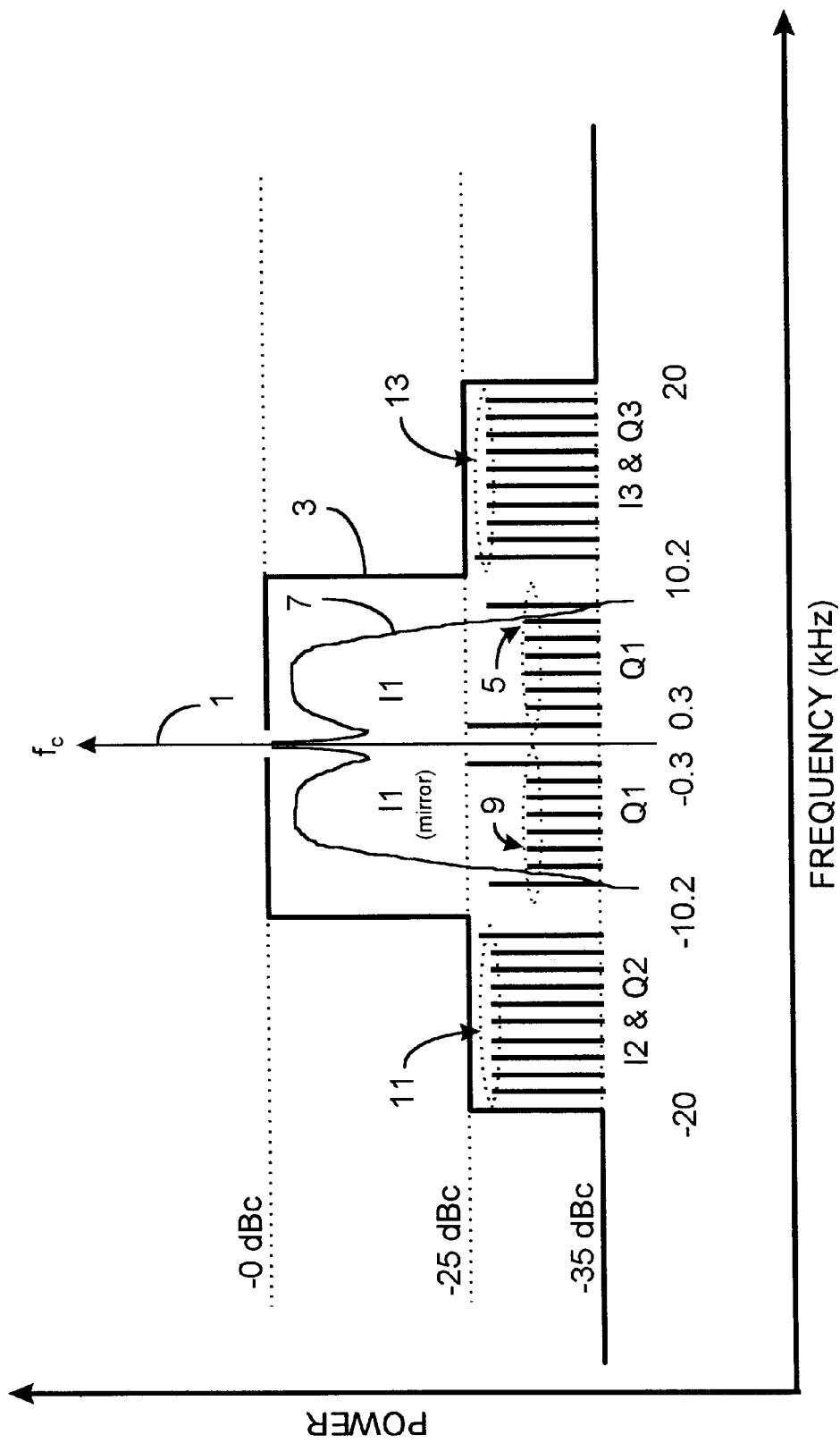
FIG. 2 is a prior art graph of the spectrum of a digital signal and conventional analog AM signal generated by an In-band On-channel (IBOC) transmitter system according to U.S. Pat. No. 5,588,022 to Dapper, et. al.
Figure 3:
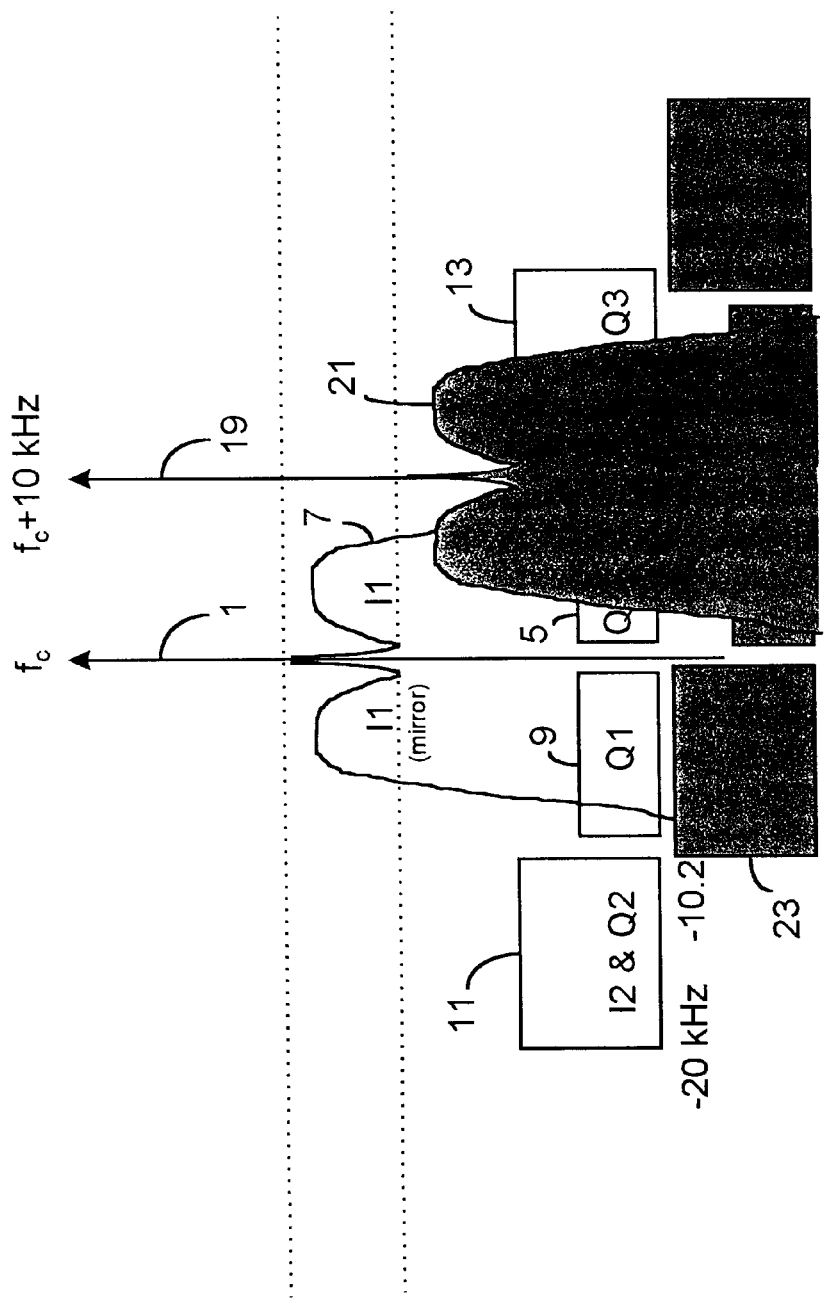
FIG. 3 is a prior art graph which shows a first-adjacent interference circumstance. The spectrum of the interfering analog AM signal significantly occludes the upper digital sidebands in the desired signal's spectrum and deleteriously affects the lower inner digital sideband.
Figure 4:
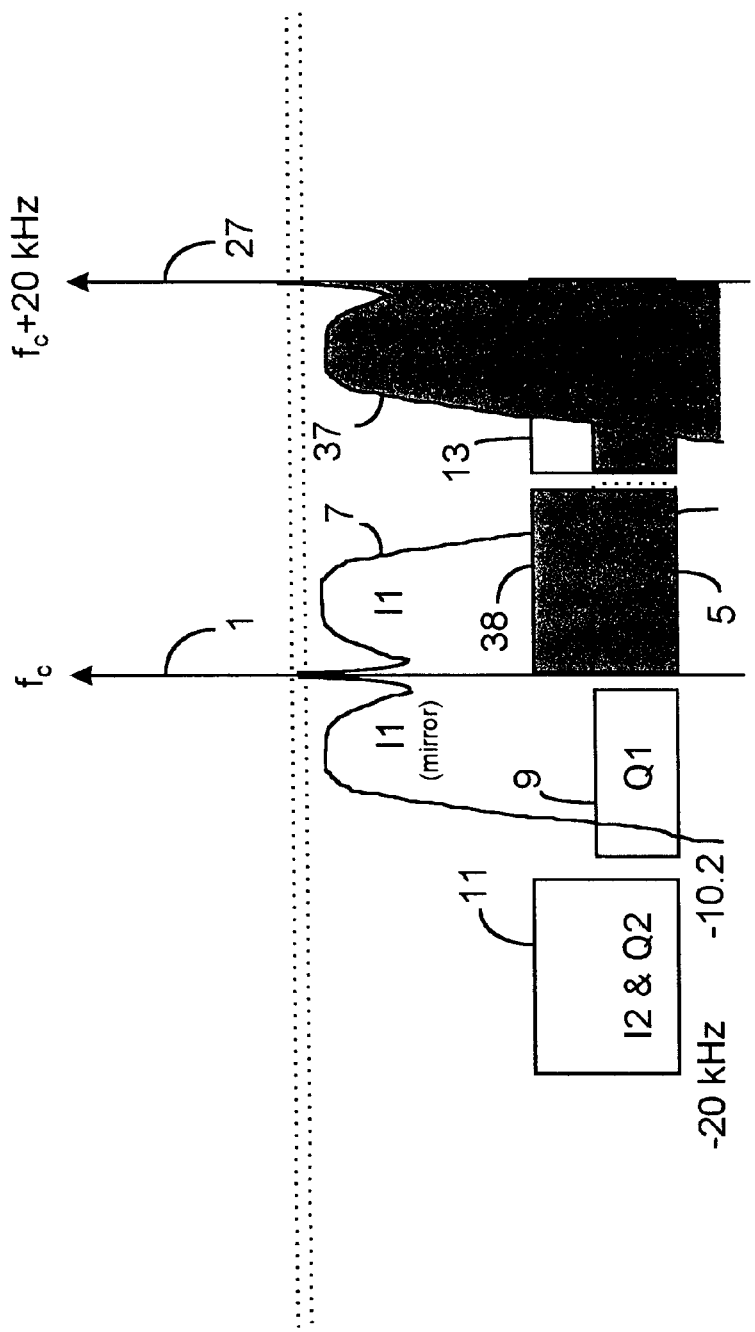
FIG. 4 is a prior art graph which shows a second-adjacent interference circumstance. The spectrum of the interfering analog AM signal and interfering digital signal significantly occludes the upper digital sidebands in the desired signal's spectrum.
Figure 5:
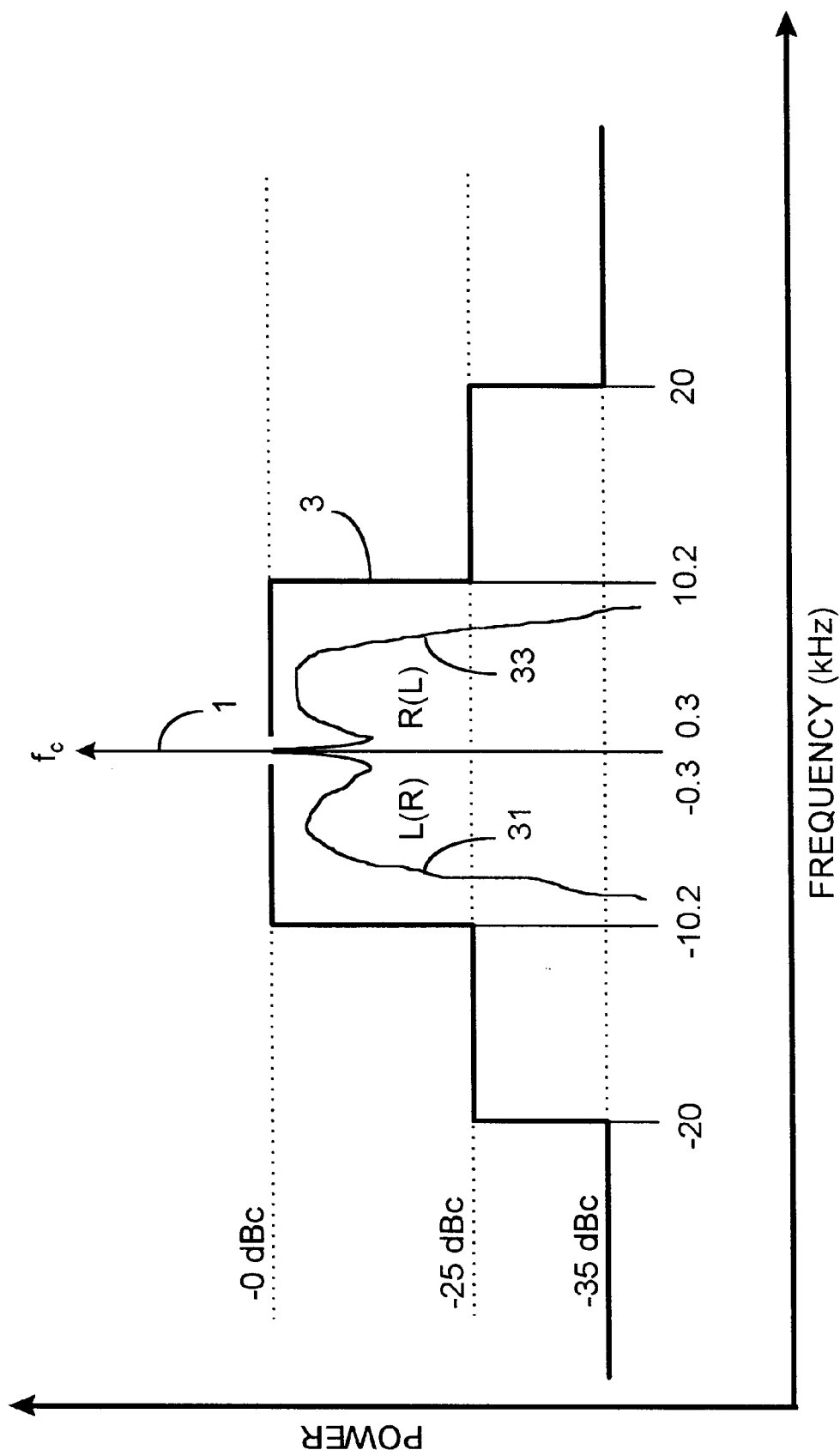
FIG. 5 is a prior art graph of the spectrum of an AM-band analog stereophonic audio signal according to the Kahn/Hazeltine system proposal. The right (R) and left (L) analog audio signals are represented as independent upper and lower sidebands.
Figure 6:
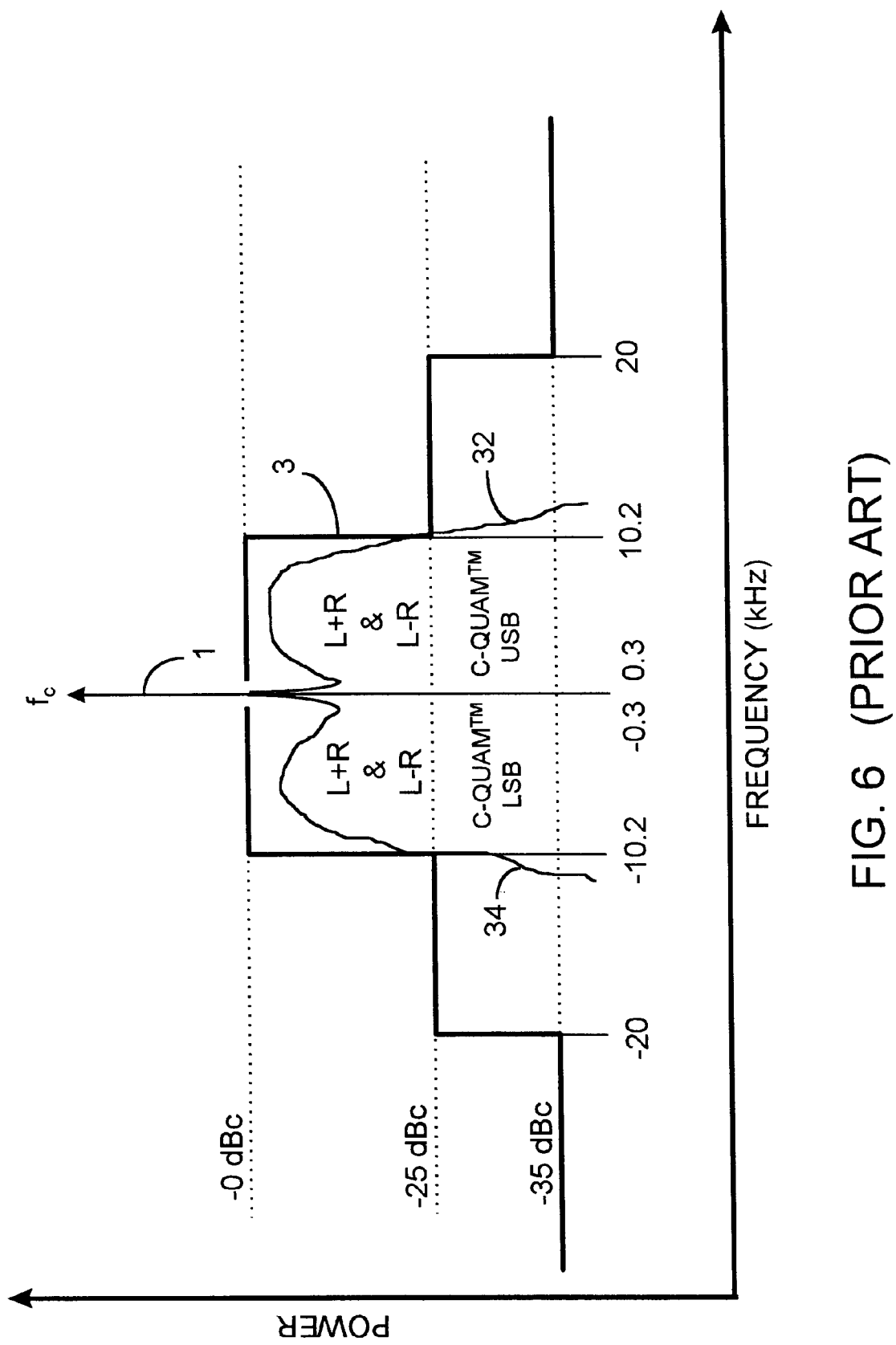
FIG. 6 is a prior art graph of the spectrum of an AM-band analog stereophonic audio signal according to the Motorola C-QUAM™ method of modulation. Nonlinear upper and lower sidebands represent the combination of an analog audio sum L+R signal and analog audio difference L–R signal.

Referring now more particularly to the accompanying drawings in which like reference numerals indicate like parts throughout the several views.

Figure 7:
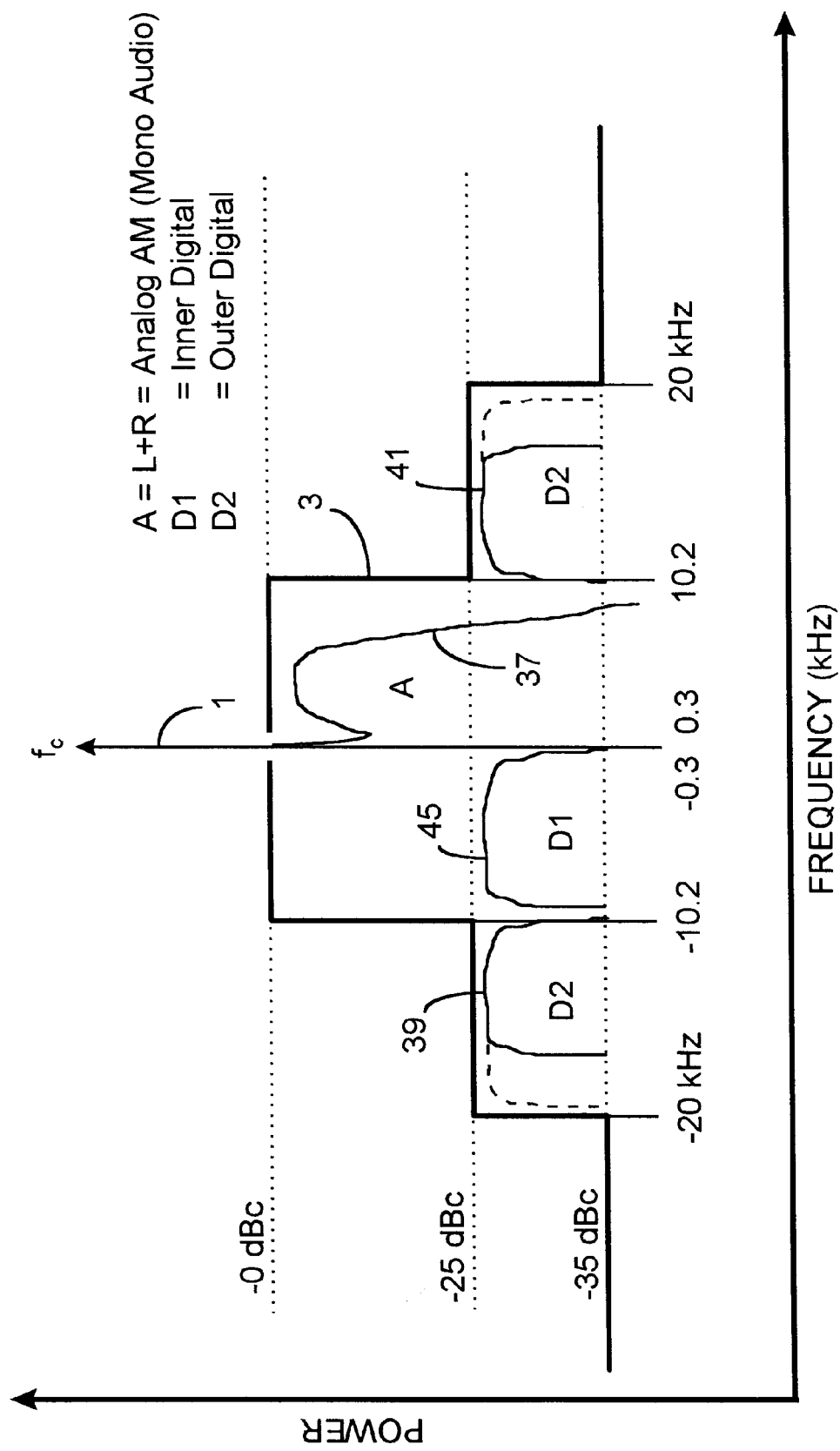
FIG. 7 is a graph of the spectrum of the analog and digital signals according to one embodiment of the invention. The AM-compatible analog signal includes a large carrier signal component and a modulated analog signal whose spectrum is confined substantially within either the upper inner or lower inner sideband. The spectrum of the digital signal substantially occupies the other inner sideband. Additional bit information is represented by digital signals whose spectrum is confined in the upper outer and lower outer sidebands. Part of the source bit information is replicated by modulated signals in both the upper outer and lower outer sidebands.

FIGS. 7–10 are graphs which show the spectrum of the transmitted analog and digital signals according to certain embodiments of the transmitter invention. In FIG. 7, an analog signal which represents substantially the same monophonic analog audio information as a conventional large-carrier amplitude modulation (AM) signal is generated so that its spectrum 37 is substantially confined within either upper inner sideband 5 or lower inner sideband 9 within FCC AM-band emissions mask 3, arbitrarily shown in FIG. 7 as within upper inner sideband 5. Analog signal 37 includes a large carrier signal component whose frequency is AM-band allocation center frequency 1. The representation of analog signal 37 in FIG. 7 is described as single-sideband large-carrier (SSB-LC). The (baseband) bandwidth of the monophonic analog audio signal represented by analog signal 37 is less than about 10.2 kHz and in many embodiments is constrained via lowpass filtering in the transmitter system to be between about 5 kHz and about 7 kHz. Reduction of the baseband analog audio bandwidth in the transmitter system typically does not cause significant distortion for large numbers of AM-band analog receivers, especially automobile receivers, because many such receivers include lowpass filtering which limits the recovered audio bandwidth to less than about 5 kHz.

Since SSB-LC signal 37, which is the analog signal, is substantially confined within either the upper inner or lower inner sideband, supplemental digital signal 45 may be generated so that its spectrum is substantially confined within the other inner sideband. The spectrum of analog SSB-LC signal 37 and digital signal 45 do not overlap, except possibly over small frequency regions at the edges of the analog and digital signal spectra. The bandwidth of the waveforms in digital signal 45 are constrained by design so that the bit error rate determined in the digital signal receiver due to such spectrum overlap, if any, is substantially less than the expected operating bit error rate in ordinary receiving conditions.

In addition to digital signal 45, further digital signals 39 and 41 may be generated so that their spectrum is substantially confined within the lower outer and upper outer sidebands, respectively. The spectrum of digital signals 39 and 41 do not significantly overlap with the spectrum of digital signal 45 nor analog signal 37. When the spectrum of digital signals 41 and 39 occupy substantially all of the upper outer and lower outer sidebands, the aggregate bandwidth occupied by the analog and digital signals together, which is the composite RF signal, is about 40 kHz (i.e. ±20 kHz from AM-band allocation center frequency 1). In certain embodiments, it is preferable that the spectrum of digital signals 41 and 39 in the upper outer and lower outer sidebands be confined so that the composite signal bandwidth is closer to 30 kHz than 40 kHz in order to reduce the potential for mutual interference between the outer sideband digital signals and second adjacent channel analog AM-band transmissions or third adjacent supplemental digital signals, especially under conditions of "sky-wave" propagation.

In FIG. 7, encoded source bit (codeword) information is represented by the digital modulation of waveforms whose spectrum is substantially confined in upper outer, lower outer, and either upper inner or lower inner sidebands. According to an embodiment of the invention, the part of the codeword information which is represented by the modulation of waveforms whose spectrum is substantially confined in the lower outer sideband is also used to modulate waveforms whose spectrum is substantially confined in the upper outer sideband, resulting in replication of part of the codeword information in both outer sidebands. Replication of part of the codeword information does not necessarily imply generating the same RF signal in the upper outer and lower outer sidebands. For example, different interleaving, different bit-to-subcarrier mapping, or different bit-to-symbol mappings may be implemented for the digital modulation in the upper outer and lower outer sidebands for the partially replicated codeword information. Such variations, all of which substantially replicate part of the transmitted codeword information in the upper outer and lower outer sidebands, are considered within the scope of the transmitter system of the invention.

The transmitted power of digital signals 39, 41, and 45 is significantly less than the power in analog signal 37 (which includes a large carrier signal component). In many circumstances, the amount of power in the digital signals is less than the amount of power in the analog signal by between about 10 decibels and 25 decibels. The amount of power in the digital signals may be adjusted, while retaining approximate compliance with the AM-band emissions mask, according to the tradeoff between desired coverage of the digital signal and the apparent increase in noise in the recovered analog signal caused by the existence of the digital signals. AM-band receivers are typically implemented with envelope detectors which, when combined with filters, are responsive to energy in a specific range of frequencies. In particular, envelope detectors are responsive to both in-phase and quadrature signal components. As the digital signal power is increased, the coverage provided by the digital signal increases commensurately, but the apparent amount of noise in the recovered analog signal may also increase. An advantage of the transmitter invention with the FIG. 7 spectrum is that new AM-band analog receiver designs may utilize conventional envelope detection by including a bandpass filter which substantially attenuates the effect of the digital signals (e.g. propagating substantially only the upper inner sideband in FIG. 7). The amount of power in the digital signal may be increased over time as more digital signal receivers and/or new analog receivers become commercially available. At some future time, when the transition from analog to digital services is substantially complete, the analog signal may be omitted (except in digital signal receiver embodiments which require the large carrier signal component for frequency tracking) and the digital signal transmitted at an increased power level, closer to the maximum allowable FCC-licensed power.

Figure 8:
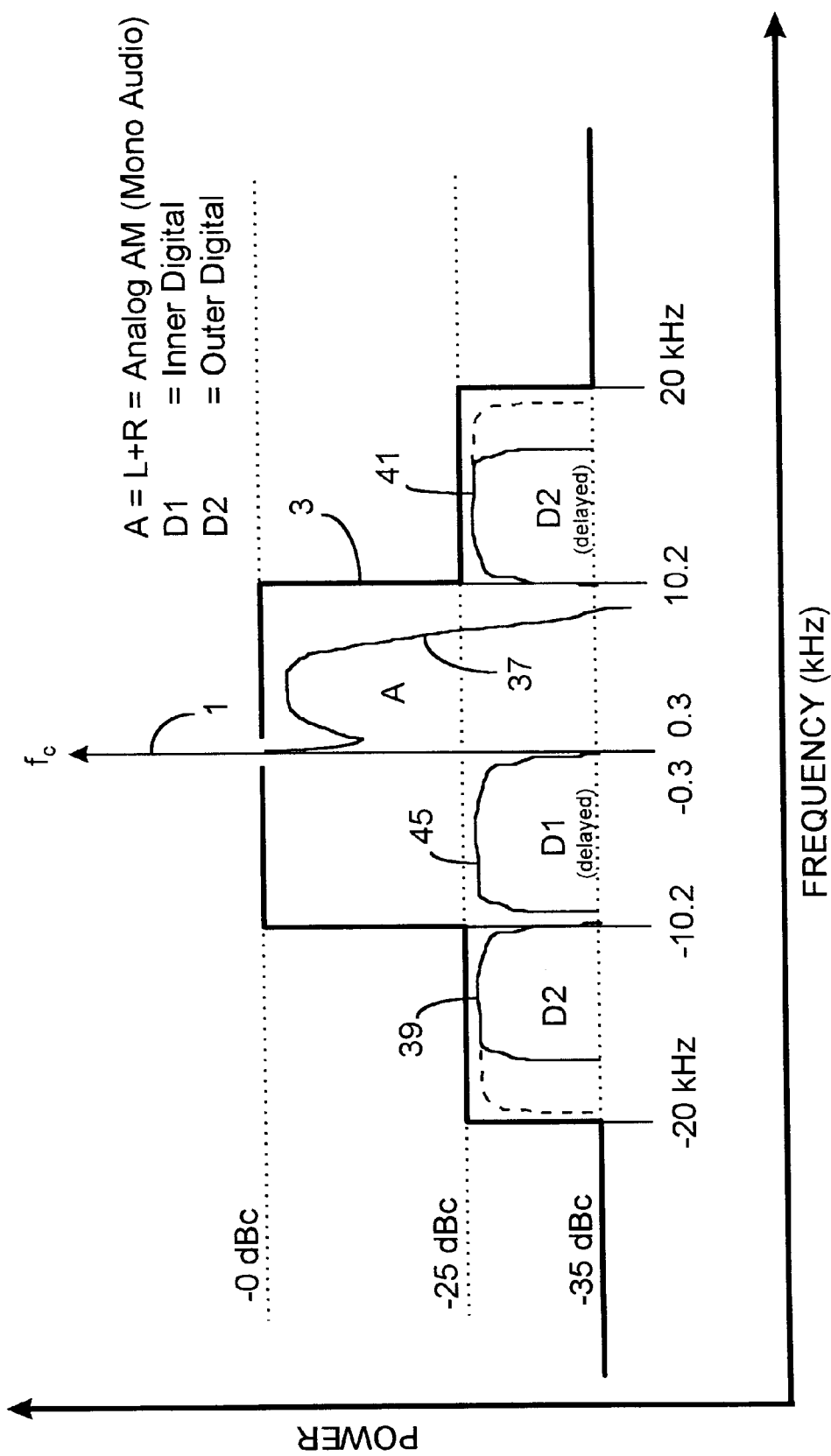
FIG. 8 is a graph of the spectrum of the analog and digital signals according to the FIG. 7 embodiment of the invention with the addition of diversity delay between the transmission of the encoded source bit information replicas in the upper outer and lower outer digital sidebands.

FIG. 8 is a graph which shows the spectrum of the analog and digital signals according to another embodiment of the transmitter invention. Analog signal 37 and inner sideband digital signal 45 are as in the FIG. 7 embodiment. In FIG. 8, part of the codeword information is replicated in the modulation of digital signals in the upper outer and lower outer sidebands. However, unlike FIG. 7, additional delay, referred to as "diversity delay", is introduced between the transmission of the replicated codeword information in the upper outer and lower outer sidebands. Diversity delay may be introduced in either the generation of the upper outer or lower outer sideband digital signals. When diversity delay is implemented, part of the codeword information is replicated in both the upper outer and lower outer sideband digital signals, but not at the same instant in time. The advantage of diversity delay is that it improves the robustness of the system when deleterious interference affects both upper outer and lower outer sideband digital signals at once, but when such interference is of a short duration. When diversity delay is implemented, even when both upper outer and lower outer sideband digital signals are deleteriously affected for a short duration of time, the codeword (and source bit) information may be accurately recovered in the receiver system from the received digital signal in either the upper outer or lower outer sidebands, or from the delayed replica of the information in the other outer sideband digital signal, whichever is less likely to be affected by such transient interference. Diversity delay is not effective in combating forms of interference and distortion which do not change over time, for example, when the receiver is substantially stationary. The use of diversity delay in the transmitter system causes the RF signals generated in the upper outer and lower outer sidebands to differ at any time, despite the replication of substantially the same codeword information in both outer sideband digital signals.

In order to accomplish diversity delay, the D2 codeword information, or corresponding modulated digital signals, for either the upper outer or lower outer sideband digital signals is delayed with respect to the replicated codeword information in the other outer sideband, or preferably, the D1 codeword information for the inner sideband digital signals and the D2 codeword information for either the upper outer or lower outer sideband signals is delayed. The latter embodiment (i.e. delay of inner and only one of the outer sideband digital signals) is preferable because it minimizes the amount of compensation delay which is implemented in the corresponding receiver system. The implementation of the receiver system is more cost-sensitive than the implementation of the transmitter system.

Figure 9:
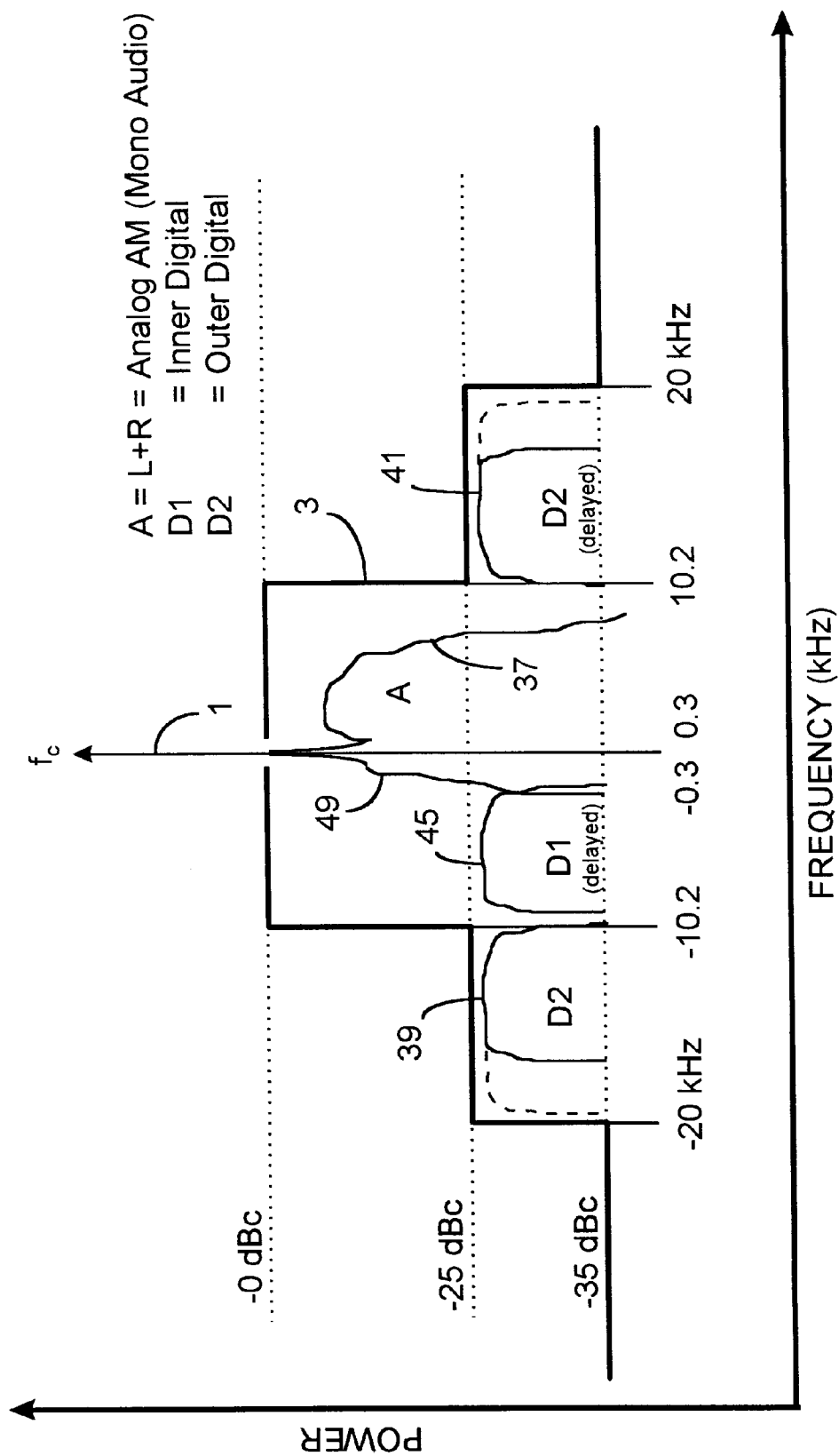
FIG. 9 is a graph of the spectrum of the analog and digital signals according to another embodiment (vestigial-sideband) of the invention. In the FIG. 8 graph, the AM-compatible SSB-LC analog signal includes a large carrier signal component and substantially either the upper inner or lower inner sideband. In the FIG. 9 graph, the AM-compatible analog signal includes a large carrier signal component and a vestigial-sideband analog signal which occupies a larger part of either the upper inner or lower inner sideband and a smaller part of the other inner sideband. Digital signals occupy the upper outer and lower outer sidebands and the majority of the inner sideband which is not substantially occupied by the analog signal.

FIG. 9 is a graph which shows the spectrum of the analog and digital signals according to another embodiment of the transmitter system which differs from FIGS. 7–8 in the generation the analog signal. In FIG. 9, the upper outer and lower outer sideband digital signals 41 and 39 are generated as described previously for FIGS. 7–8, with replication of part of the codeword information in the upper outer and lower outer sidebands, with or without diversity delay. However, the spectrum of analog signal 37 in the inner sideband which is substantially occupied by the analog signal in FIG. 9 differs from the analog signal in the FIGS. 7–8 embodiment. The FIG. 9 analog signal also includes small part 49 of the inner sideband which is occupied by inner sideband digital signal 45. As a result, the spectrum of inner sideband digital signal 45 is confined to a smaller frequency range in order to avoid significant spectrum overlap with smaller part 49 of the analog signal. The representation of the analog signal in FIG. 9 is described as vestigial-sideband large-carrier (VSB-LC) in contrast the FIGS. 7–8 single-sideband large-carrier (SSB-LC) analog signal embodiment. The VSB-LC analog signal includes a large carrier signal component and an analog signal whose spectrum is mostly or substantially confined within either the upper inner or lower inner sideband, but which has non-spurious spectrum in both upper inner and lower inner sidebands. In certain circumstances, it may be simpler to implement the required filtering in the transmitter and receiver systems for the VSB-LC representation of the analog signal than for the SSB-LC representation.

Figure 10:
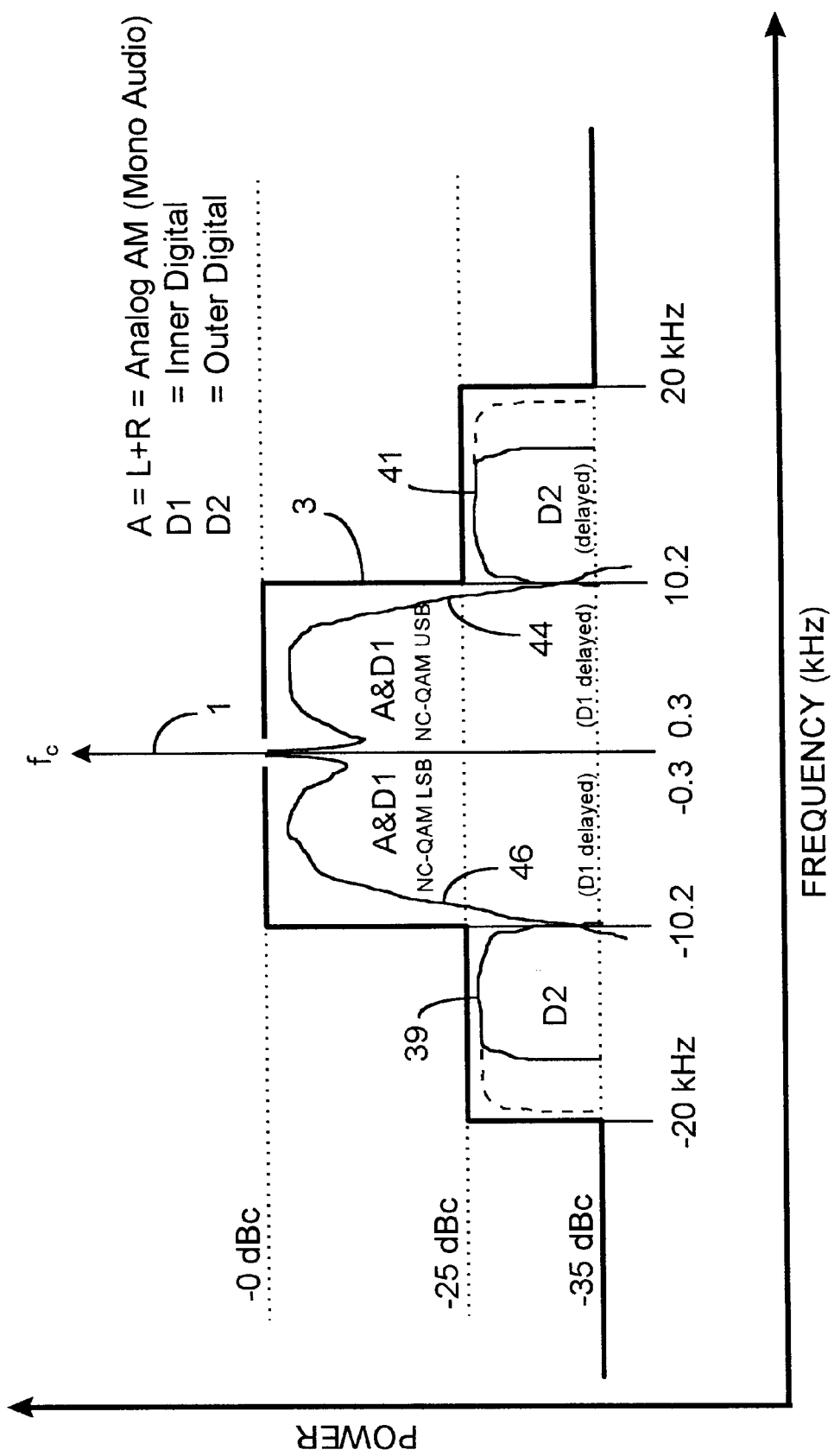
FIG. 10 is a graph of the spectrum of the analog and digital signals according to another embodiment of the invention. The outer sideband digital signals are as shown in FIGS. 8–9. The inner sideband signals represent combined analog and digital information and correspond to nonlinear compatible quadrature amplitude modulation (NC-QAM) of the baseband digital signal and lowpass-filtered monophonic audio signal.

FIG. 10 is a graph which shows the spectrum of the analog and digital signals according to another embodiment of the transmitter invention. Outer sideband digital signals 39 and 41 are as described in FIGS. 7–9, without or preferably with diversity delay between the transmission of the replicated part of the codeword information represented by the modulated digital signals in the outer sidebands. However, unlike FIGS. 7–9, the analog signal in FIG. 10 occupies both inner sideband regions of emissions mask 3. Furthermore, the inner sideband digital signal also occupies both inner sideband regions of emissions mask 3. Since the analog and inner sideband digital signals occupy substantially the same spectrum, they are necessarily inter-related. Thus, signal 44 in the upper inner sideband and signal 46 in the lower inner sideband each represent the combination of the analog and a digital signal. Sidebands 44 and 46 are in general not symmetric. In the corresponding transmitter system, a baseband digital signal is combined with a monophonic analog audio signal using nonlinear compatible quadrature amplitude modulation (NC-QAM) to improve compatibility with monophonic AM-band analog signal receivers with envelope detection. Because of the nonlinear relationship, the inner sideband digital signal is not phase-quadrature to the analog signal. An advantage of the FIG. 10 embodiment is that the digital baseband signal may be transmitted at a power level comparable to that of the monophonic audio signal because the combined signal is pre-distorted by NC-QAM modulation to be compatible with envelope detection receivers, unlike the inner sideband digital signal in the FIGS. 7–9 SSB-LC or VSB-LC embodiments, in which the inner sideband digital signal is transmitted with a smaller amount of power to improve analog signal receiver compatibility.

In the FIGS. 7–10 graphs of the composite RF signal spectrum for the transmitter system embodiments, the inner sideband digital signals may be omitted, or the redundantly modulated outer sideband signals may be omitted, depending upon the required bit throughput. In general, both inner and outer sideband digital signals are desirable when a relatively large throughput is required for the given bandwidth, for example, greater than about 32 kbit/sec.

Figure 11:
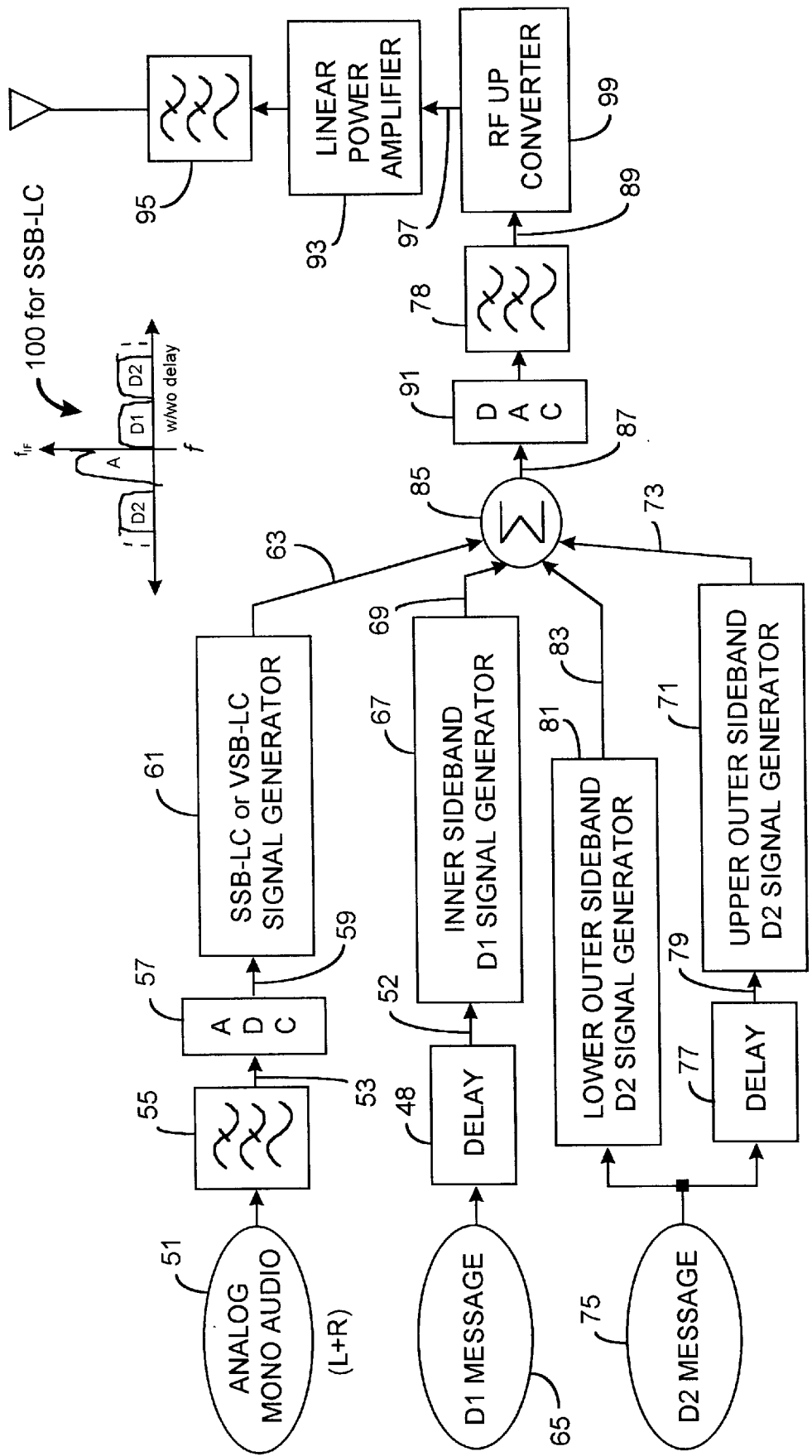
FIG. 11 is a block diagram of a certain embodiment of the transmitter system of the invention. An AM-compatible single-sideband large-carrier or vestigial-sideband large-carrier analog signal is generated and combined with digital signals whose spectrum is within one of the inner sidebands and digital signals whose spectrum is within the upper outer and lower outer sidebands. Diversity delay is implemented between the transmission of replicated codeword information in the upper outer and lower outer sideband digital signals.

FIG. 11 is a block diagram of a transmitter system according to the invention for the FIGS. 7–9 analog signal embodiments. Conventional monophonic analog audio signal 51 is lowpass-filtered 55 to substantially attenuate frequencies greater than about 7 kHz. Filtered audio signal 53 is digitized with analog-to-digital converter (ADC) 57 to generate digital representation 59 of the filtered analog audio signal. The number of bits in digital representation 59 of the analog signal is at least eight bits, and preferably at least 12 bits. The sampling frequency (i.e. reciprocal of the sampling interval) for ADC 57 is larger than twice the Nyquist frequency for analog signal 53 and in many circumstances is significantly higher. In a preferred embodiment, the sampling rate for converter 57 corresponds to a value which is a multiplicative factor of two (2) or a factor of four (4) of the intermediate frequency (IF) value which is used to represent the composite IF signal carrier frequency. The composite IF signal includes the analog signal and digital sideband signals. When the composite signal is generated with digital devices and complex digital arithmetic (i.e. real and imaginary values), the nominal sampling frequency is twice the IF frequency value. When the composite signal is generated with real-valued digital arithmetic, the nominal sampling frequency is a factor of four of the IF frequency value. After digitization 57, the filtered analog signal is propagated to signal generator 61, which emits a digital representation of the analog signal according to either the single-sideband large-carrier (SSB-LC) or vestigial-sideband large-carrier (VSB-LC) transmitter embodiments. Methods of generating SSB-LC or VSB-LC analog signals which are compatible with conventional AM-band analog receivers are described later in this disclosure.

The intermediate frequency, $F_{IF}$, is a frequency around which the composite signal is generated in the transmitter system, for example as shown in spectrum graph 100 in FIG. 11. Typically the intermediate frequency is significantly less than the desired allocation center-frequency $f_c$ in order to simplify the implementation of the transmitter and/or receiver systems (i.e. by using lower clock frequencies and/or sampling rates). After generation of the composite IF signal at an intermediate frequency, the resulting signal is frequency-translated to the desired RF frequency range prior to RF emission. In order to accommodate the analog and digital signals, which may span a two-sided bandwidth of up to about 40 kHz in certain embodiments, the IF frequency value is at least 20 kHz. The IF frequency may be arbitrarily large, but increasing the IF frequency generally increases the complexity of a digital circuit implementation. On the other hand, a higher IF frequency typically simplifies the implementation of filtering in RF up-converter 99, described subsequently. The choice of the implemented IF frequency in the transmitter system design involves a trade-off between the complexity of those subsystems which precede RF up-converter 99 and the design of RF up-converter 99 itself.

In FIG. 11, encoded source bit (codeword) information has been previously divided into groups of codeword symbols which are to be represented by digitally modulated waveforms in the outer and inner sidebands. Those codeword symbols which are to be represented by the digital modulation of waveforms whose spectrum is confined in the outer sidebands are labeled as D2 message 75. Those codeword symbols which are to be represented by the digital modulation of waveforms whose spectrum is confined in the inner sideband or sidebands are labeled as D1 message 65. D1 message 65 is propagated to inner sideband D1 signal generator 67. In certain diversity delay embodiments, D1 message 65 is delayed 48, and delayed D1 message 52 is propagated to signal generator 67. As described previously, it is preferable to delay the codeword symbols for the inner sideband digital signals and for either the upper outer or lower outer sideband digital signals (rather than delaying only either the lower outer or upper outer sideband information), in order to simplify the implementation of the compensating delay in the corresponding receiver system. Signal generator 67 includes one or a plurality of inner sideband subcarrier modulators, described subsequently. Signal generator 67 emits composite inner sideband digital signal 69, whose spectrum is substantially confined within either the upper inner or lower inner sideband (i.e. whichever one is not substantially occupied by the SSB-LC or VSB-LC analog signal). Similarly, D2 message 75 is propagated to upper outer sideband D2 signal generator 71. In certain diversity delay embodiments, D2 message 75 is delayed 77, and delayed D2 message 79 is propagated to signal generator 71. Delay 77 may be implemented for lower outer sideband signal generator 81 (not shown). Delays 48, 77, when implemented, represent the same amount of time (bits). Upper outer sideband signal generator 71 emits upper outer sideband digital signal 73, which may include one or a plurality of modulated upper outer sideband subcarrier signals. D2 message 75 is also propagated to lower outer sideband D2 signal generator 81. Signal generator 81 emits lower outer sideband digital signal 83, which may include one or a plurality of modulated subcarrier signals. Diversity delays 48, 77 may be implemented prior to, or after digital modulation of the subcarrier waveforms within the respective sideband signal generators 67, 71. In general, it is preferable to implement diversity delays 48, 77 prior to signal generators 67, 71 in order to minimize the amount of digital memory for implementing such delay. When diversity delays 48, 77 are implemented, it is preferable that the length of delays 48, 77 in bits be equal to an integer multiple of the codeword length in bits.

In FIG. 11, SSB-LC or VSB-LC digital representation 63 of monophonic audio signal 51 is summed 85 together with inner sideband digital signal 69, upper outer sideband digital signal 73, and lower outer sideband digital signal 83 to determine composite IF signal 87. Composite IF signal 87 is converted to an analog representation by digital-to-analog converter (DAC) 91 with subsequent anti-aliasing lowpass filter 78. The number of bits in DAC 91 is at least eight bits. After conversion 91 and filtering, 78 composite IF signal 89 is frequency-translated to the desired AM-band channel allocation center frequency in RF up-converter 99. Methods for the implementation of RF up-converter 99 are known. In a typical RF up-converter, an IF signal is mixed (multiplied) with a sinusoidal carrier signal whose frequency is the difference between the desired RF carrier frequency and the IF carrier frequency (i.e. $f_c-f_{IF}$). After frequency mixing, the resulting signal is filtered to substantially eliminate the difference frequency image (i.e. $f_c-f_{IF}-f_{IF}$), so that the desired frequency-translation is accomplished at the sum frequency (i.e. $f_c$). In certain substantially digital embodiments, RF up-converter 99 precedes DAC 91. After up-conversion 99, composite RF signal 97 is amplified in high-power broadcast linear amplifier 93, bandpass-filtered 95, and propagated to an antenna distribution system for emission into free-space. In certain embodiments, prior to amplification in linear power amplifier 93, composite RF signal 97 may be separated into a carrier phase-modulation component and an amplitude-modulation component, depending upon the interface requirements for linear power amplifier 93. In other embodiments, the digital representation of the IF/RF signal may be directly interfaced to the transmitter amplifier for digitally-modulated amplifiers; for example, see U.S. Pat. No. 4,580,111 to Swanson. Linear power amplifier 93 has relatively low distortion and wide bandwidth (i.e. at least about ±20 kHz about center frequency 1) in order to pass composite RF signal 97 without introducing significant artifacts. Suitable linear power amplifiers for use with this invention include the Harris Broadcast DX series of AM-band low-distortion amplifiers.

Figure 12:
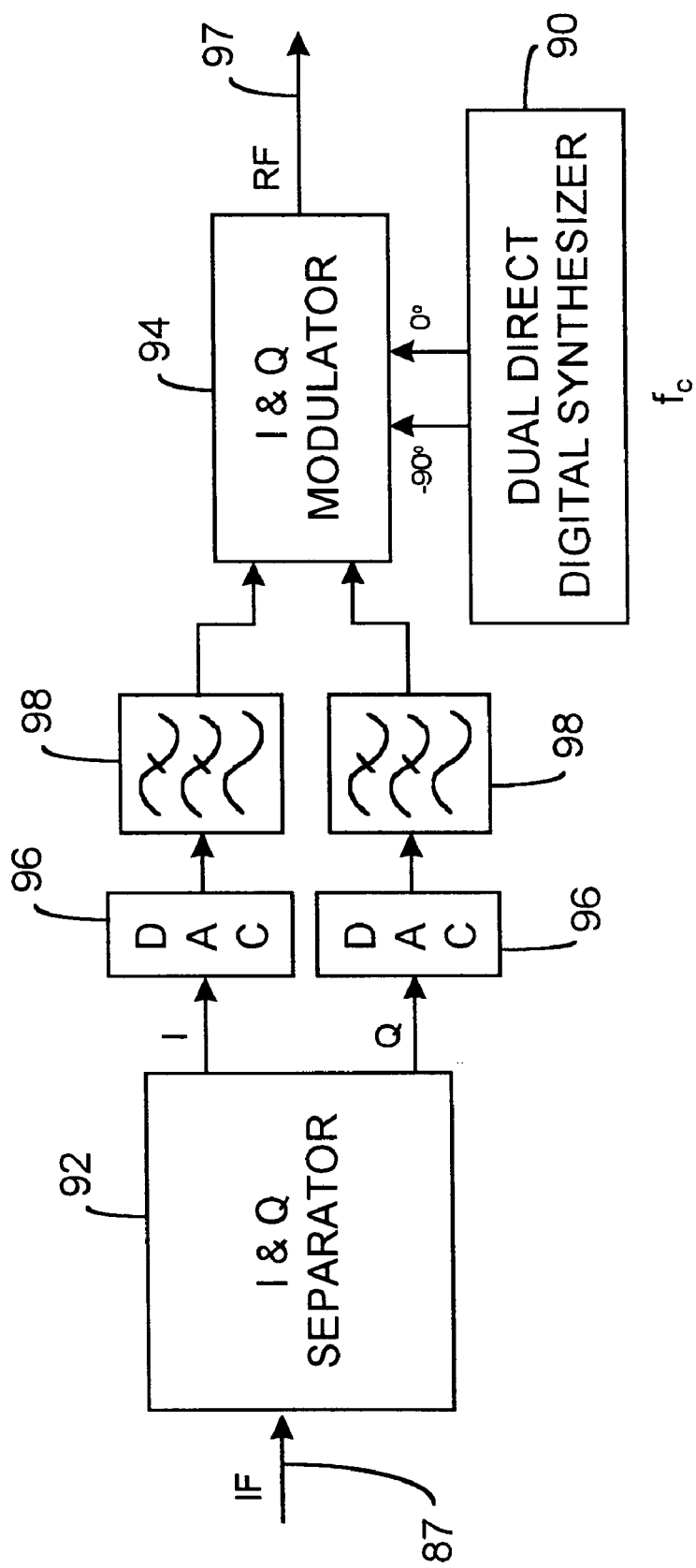
FIG. 12 is a block diagram of part of the FIG. 11 transmitter system of the invention according to certain embodiments in which an IF representation of the composite signal is separated into in-phase (I) and quadrature (Q) signals and re-modulated at the desired RF carrier frequency prior to amplification and emission.

In FIG. 11, composite IF signal 87 at $f_{IF}$ is frequency-translated to desired AM-band channel allocation center frequency $f_c$ in RF up-converter 99. When the intermediate frequency is close to the minimum value, for example, 20 kHz, it may be difficult to implement the bandpass filtering in RF up-converter 99. Another up-converter embodiment is shown in FIG. 12. Composite IF signal 87 may be separated into in-phase (I) and quadrature (Q) signal components with respect to a carrier signal with frequency $f_{IF}$ in I&Q separator 92. For example, when the sampling frequency is four times the IF frequency, I&Q separator 92 may be implemented with polarity inverters and multiplexors. Exemplary sequence of IF samples IF0, IF1, IF2, IF3, IF4, IF5, IF6, IF7, and so on, corresponds to I sequence +IF0, −IF2, +IF4, −IF6, and so on, and Q sequence +IF1, −IF3, +IF5, −IF7, and so on. After separation, the resulting I and Q signals are converted to analog signals in dual digital-to-analog converters (DACs) 96 with subsequent filtering in dual lowpass filters 98, one DAC/filter for each of the I and Q signals. The device characteristics of dual DACs 96 are substantially the same, and the device characteristics of dual lowpass filters 98 are substantially the same. The filtered I and Q analog signals are propagated to I&Q modulator 94, in which the signals are separately mixed (multiplied) with in-phase and quadrature RF sinusoidal carrier signals at frequency $f_c$, which are generated by dual direct digital synthesizer (DDS) 90, and then summed together (also within modulator 94) to determine composite RF signal 97. Dual DDS 90 includes dual numerically-controlled oscillators (NCOs), dual DACs, and dual lowpass filters; for example, two AD9850 DDS integrated circuits, which are available from Analog Devices, Inc., One Technology Way, P.O. Box 9106, Norwood, Mass., 02062, with external filters and a common clocking signal.

Figure 13:
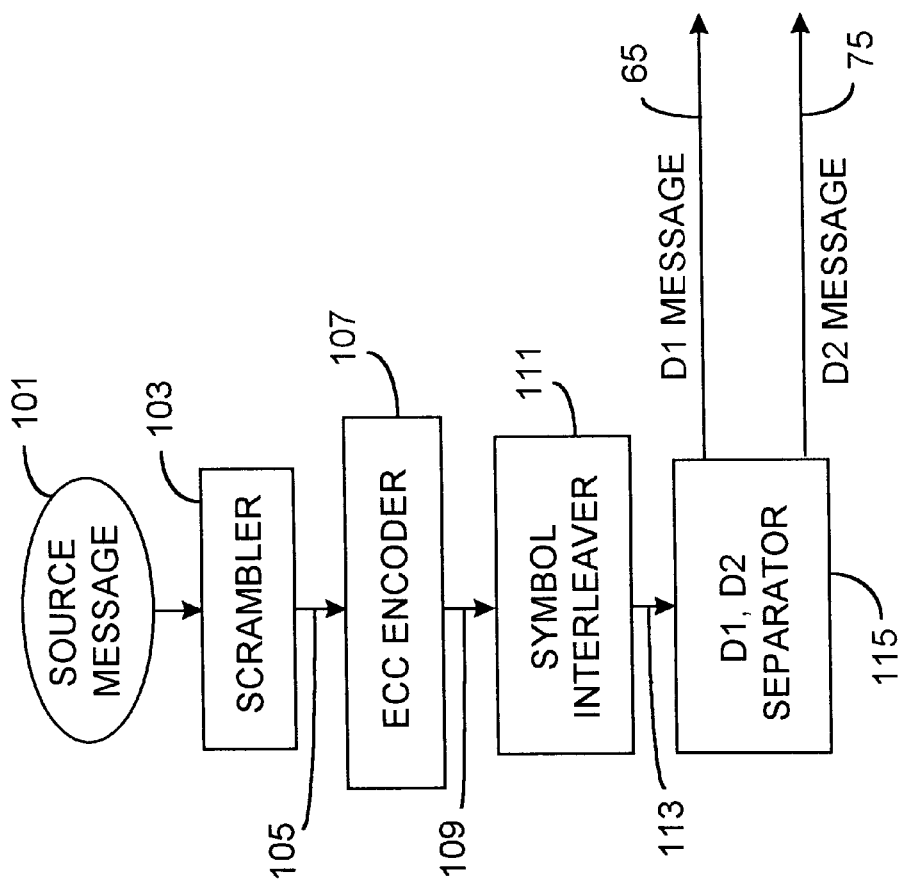
FIG. 13 is a block diagram of the source bit encoder according to an embodiment of the invention. Source bit information is scrambled, encoded with forward error correction (FEC) redundancy information, interleaved, and divided into symbols for modulation of waveforms in the inner sideband or baseband digital signal (D1) or outer sideband (D2).

FIG. 13 is a block diagram of the typical processes used to generate encoded source bit (codeword) messages D1 65 and D2 75 shown in FIG. 11. Source bit message 101 is a sequence of bits of possibly infinite-length which represents the user digital information. The objective of the system of the invention is to convey source message 101 from the transmitter system to one or a plurality of digital signal receivers so that source message 101 may be reconstructed in such receivers at a reasonable bit error rate (BER), typically a corrected BER of less than $1 \times 10^{-6}$ for digital audio applications under reasonable AM-band propagation and noise conditions. Source message 101 may represent general digital information or, in certain embodiments, a source-compressed digital audio signal, or a combination of a digital audio signal and ancillary data. Suitable digital audio compression algorithms for representing high fidelity audio information with audio bandwidths greater than 12 kHz at bit rates between 32 kbit/sec and 64 kbit/sec are known, for example, ISO MPEG layer III [reference: K. Brandenburg and M. Bosi, "Overview of MPEG-audio: current and future standards for low bit-rate audio coding," 99th AES Convention, New York, preprint, 4130 F1, October 6–9, pp. 1–26, 1995; N. S. Jayant and E. Y. Chen, "Audio compression: technology and applications," AT&T Technical Journal, pp. 23–34, March/April 1995] and RealAudio compression technology from Progressive Networks, Inc., 1111 3rd Ave, Suite 2900, Seattle, Wash. 98101.

Source message 101 is typically scrambled 103 in order to substantially eliminate long patterns of consecutive binary ones or binary zeros and to cause binary digits zero and one to have approximately equal probabilities of occurrence. Scrambling 103 establishes a bijection between source message 101 and scrambled source message 105 in the transmitter system which may be reversed in the corresponding receiver system. Scrambling is typically accomplished by processing source message 101 according to a binary polynomial of a certain kind, known as m-sequences or PN-sequences. After scrambling, the (scrambled) source bit information is encoded to add redundancy information in ECC encoder 107. ECC encoder 107 implements known methods of forward error correction (FEC), for example, Reed-Solomon block encoding, convolutional code encoding, turbo-codes, and/or pragmatic trellis code encoding. The function of ECC encoder 107 is to add FEC redundancy to the scrambled source bit information so that after corresponding ECC decoding in the receiver system, the recovered source message is less likely to be erroneous than if forward error correction had not been implemented. In certain embodiments, the average ECC code rate is between about rate ⅔ and rate ⅘, preferably close to rate ¾. After including FEC redundancy in ECC encoder 107, resulting message 109 is known as a codeword. According to certain embodiments of the transmitter invention, when the FEC method implemented for ECC encoder 107 is a convolutional or pragmatic trellis code, each generated codeword is truncated at a predetermined number of bits by terminating the encoder after a predetermined number of bits at a known state, for example, all zeroes. A predetermined bit length for each generated codeword is necessary for operation of the diversity receiver according to the invention, so that the estimated source bit information from two codewords of predetermined length may be selected between or the codeword information may be combined and decoded. The codeword length is chosen to be sufficiently large that the bit overhead for properly terminating the encoder is a small fraction of the overall codeword length, for example, less than about 5 percent. In many embodiments, it is preferable that the codeword length be at least 100 bits. Block code FEC methods such as Reed-Solomon encoding inherently have a predetermined bit length (i.e. the block length) so that truncation of the codeword is not necessary; however, a block code may be "shortened". In certain embodiments of the invention, ECC encoder 107 is implemented using rate ¾ pragmatic trellis-coded modulation (PTCM) with 16-ary phase-shift keying (16-ary PSK) digital modulation in corresponding sideband signal generators 67, 71, and 81 [reference: A. J. Viterbi, J. K. Wolf, E. Zehavi, and R. Padovani, "A pragmatic approach to trellis-coded modulation," *IEEE Communications Magazine,* Vol. 27, No. 7, pp. 11–19, July 1989]; see also the Q1875 pragmatic trellis decoder technical data sheet from Qualcomm Incorporated, VLSI Products, 6455 Lusk Boulevard, San Diego, Calif. In this embodiment, the effective source bit information density is about 3 bits/Hz/sec, which requires between about 16–21 kHz of (unique) bandwidth for a source bit rate between about 48–64 kbit/sec, not including the redundantly encoded outer sideband. In certain embodiments, each subcarrier modulator makes use of two orthogonal waveforms. In each pairwise modulator, one of the subcarrier waveforms is considered as an in-phase (I) signal and the other subcarrier waveform is considered as a quadrature (Q) signal. When narrowband subcarriers are implemented (e.g. OFDM), subcarrier waveforms in a pair have the same frequency but a quadrature (i.e. 90°) phase relationship, and the I and Q labels have direct meaning. However, for wideband, mutually orthogonal subcarrier waveforms, the subcarriers may be arbitrarily grouped as orthogonal pairs (within each sideband), where the I and Q designations are arbitrary within each pair.

In many embodiments, ECC encoder 107 may include multiple encoding steps, for example, a first outer (i.e. closer to source message 101) block code, such as a high code rate Reed-Solomon or BCH block, and a second lower code rate inner (i.e. closest to the RF channel) trellis or convolutional code with or without interleaving between encoding steps, known as concatenated coding.

After encoding 107, encoded source bit information 109 is propagated to symbol interleaver ill. Symbol interleaver 111 shuffles consecutive modulation symbols (each of which consists of one or a plurality of bits, for example, 4-bit symbols for rate ¾ 16-ary PTCM), so that such symbols are dispersed across a larger interval of time. Interleaving 111 in the transmitter system with corresponding de-interleaving in the receiver system improves the system performance due to transient interference and noise phenomena. Interleaving is typically implemented with a random-access digital memory and a shuffling algorithm [reference: J. L. Ramsey, "Realization of optimum interleavers," *IEEE Transactions on Information Theory,* Vol. 16, No. 3, pp. 338–345, May 1970]. Interleaving is not compatible with all methods of ECC encoding 107, but is compatible with, at least, Reed-Solomon block encoding when the interleaver symbol size is a positive integer multiple of the Galois field size in bits, convolutional encoding, and pragmatic trellis-coded modulation encoding. For AM-band broadcast applications, the maximum length (in time) of symbol interleaver 111, known as the interleaver frame length, is constrained by i) the amount of digital memory which may be economically implemented for corresponding deinterleaving in the receiver system, and ii) the maximum desired acquisition time of the receiver. In many embodiments, the frame length for symbol interleaver 111 corresponds to an integer multiple of the codeword length in bits. The frame length typically corresponds to between about 10 milliseconds and 500 milliseconds in time, preferably closer to 100–200 milliseconds. When diversity delays 48, 77 are implemented in the transmitter system, it is preferable that the diversity delay length (in bits or time) be at least as large as the symbol interleaver length in order to maximize the amount of time between the transmitted replicas of part of the codeword information. For example, when the frame length for symbol interleaver 111 corresponds to a plurality of 10 codewords, the amount of delay in diversity delays 48, 77, when implemented, preferably corresponds to at least 10 codewords. In many embodiments, convolutional (continuous) interleaving methods, also known as fixed step delay methods of interleaving, are preferred over block interleaving because it simplifies synchronization between the transmitter system interleaver and receiver system deinterleaver.

After interleaving 111, resulting shuffled encoded source bit message 113, in other words, the interleaved sequence of codewords, is a sequence of modulation symbols, each of which includes one or a plurality of bits. The modulation symbols are separated in D1, D2 separator 115 into two further sequences 65 and 75 of modulation symbols. Sequence 65 of modulation symbols is defined as the "D1" encoded message and is propagated for digital modulation of subcarrier waveforms whose spectrum is confined within the inner sideband. Sequence 75 of modulation symbols is defined as the "D2" encoded message and is propagated for digital modulation of subcarrier waveforms in both the upper outer and lower outer sidebands, with or without diversity delay between the upper outer and lower outer sideband information. In many circumstances, it is preferable to implement D1, D2 separator 115 after FEC encoding in ECC encoding 107 rather than separating source message 101 into two sequences prior to ECC encoding (not shown), because the source bit information is spread over a greater bandwidth (i.e. inner and outer sidebands) in the former embodiment. A straightforward implementation of D1, D2 separator 115 is to propagate consecutive modulation symbols from symbol interleaver 111 alternately to message sequences 65, 75; in other words, first symbol to D1, second symbol to D2, third symbol to D1, and so on.

Figure 14:
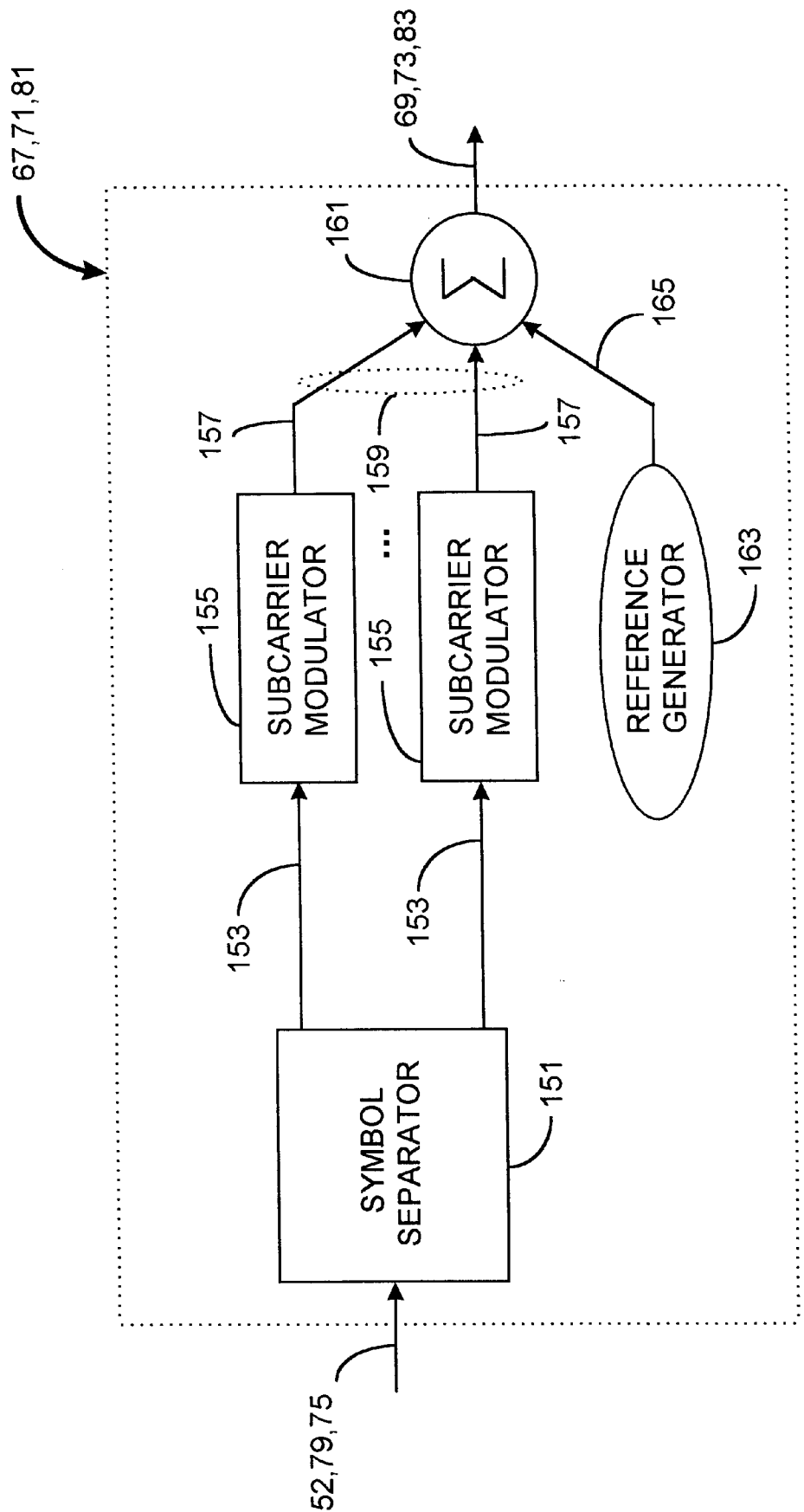
FIG. 14 is a block diagram of a baseband, inner, or outer sideband composite digital signal modulator showing a plurality of subcarrier modulators whose output signals are summed together to determine the sideband composite digital signal, which may also include an additive reference signal. Each subcarrier modulator emits a signal determined from modulating one or a plurality of subcarrier waveforms according to codeword modulation symbols.

FIG. 14 is a block diagram of each of inner sideband D1 signal generator 67, upper outer sideband D2 signal generator 71, and lower outer sideband D2 signal generator 81. Delayed D1 codeword message 52 is propagated to inner sideband signal generator 67. Delayed D2 codeword message 79 is propagated to upper outer sideband signal generator 71, and D2 message 75 is propagated to lower outer sideband signal generator 81, or vice versa when diversity delay is implemented for the other outer sideband. Symbol separator 151 in FIG. 14 for each of sideband signal generators 67, 71, and 81, divides incoming codeword messages 52, 79, and 75, respectively, into groups of modulation symbols which are subsequently used in the digital modulation of subcarrier waveforms in subcarrier modulators 155. Symbol separator 151 may be implemented as a serial-to-parallel converter where the serial word size is the number of bits in each modulation symbol; for example, 4 bits for rate ¾ 16-ary PTCM encoding. The function of symbol interleaver 111 and symbol separator 151 is such that each group of one or a plurality of bits which constitute a modulation symbol is preserved by the interleaving and serial-to-parallel conversion processes. Subcarrier modulators 155 make use of the modulation symbols in determining emitted (modulated) signals 157. In many embodiments, each subcarrier modulator 155 makes use of two unique, orthogonal waveforms; each waveform pair is then modulated by generating emitted signal 157 according to a predetermined mapping relationship between each possible combination of bits in each modulation symbol and a corresponding (modulated) waveform which is a combination of the waveform signals. After modulation in subcarrier modulators 155 for each of sideband digital signal generators 67, 71, and 81, resulting signals 157 are summed 161 together to determine composite inner sideband, upper outer sideband, and lower outer sideband digital signals 69, 73, 83, respectively. In certain embodiments, reference generator 163 emits reference waveform 165 which is also summed 161 with modulated subcarrier signals 159. For inner sideband digital signal generator 67, the spectrum of each modulated subcarrier waveform 157 emitted from modulators 155 and reference signal 165, when implemented, is substantially confined within the upper inner or lower inner sideband (whichever inner sideband is not substantially occupied by the SSB-LC or VSB-LC analog signal). Similarly, for upper outer sideband digital signal generator 71, the spectrum of each emitted modulated waveform 157 and reference signal 165, if present, is substantially confined within the upper outer sideband. For lower outer sideband digital signal generator 81, the spectrum of each emitted modulated waveform 157 and reference signal 165, if present, is substantially confined within the lower outer sideband.

The subcarrier waveforms implemented in subcarrier modulators 155 may be narrowband, for example, as in the known method of OFDM modulation [reference: W. Y. Zou and Y. Wu, "COFDM: an overview," *IEEE Transactions on Broadcasting*, Vol. 41, No. 1, pp. 1–8, March 1995], or wideband within the inner, upper outer, or lower outer sideband region. In narrowband methods such as OFDM, each subcarrier waveform implemented in modulator 155 is substantially confined to a discrete sinusoid-like emission with relatively narrow bandwidth (e.g. 1 kHz), modulated with m-ary phase-shift keying (m-ary PSK) or m-ary quadrature amplitude modulation (m-ary QAM), and the spectrum of additive plurality 159 of the modulated subcarrier signals substantially spans the sideband region, or in certain embodiments, the part of the sideband which is made available for the digital signal in the system design process. For example, when the analog signal is generated as a VSB-LC signal, only part of the inner sideband is available for the digital signal. According to the known OFDM method of modulation, plurality of OFDM subcarrier modulators 155 and summing 161 may be accomplished with digital circuits which implement the Inverse Fast Fourier Transform Algorithm (IFFT) for signal generators 67, 71, and 81 one process. In embodiments of the invention which utilize wideband subcarrier waveforms, the spectrum of each (modulated or unmodulated) subcarrier waveform spans substantially all of the bandwidth within the particular sideband region (or designated part thereof). Both wideband and narrowband methods of determining subcarrier waveforms require that the modulated subcarrier waveforms be mutually almost perfectly orthogonal so that, in the receiver system, the resulting signals may be separated from one another in the additive plurality.

In certain embodiments when OFDM modulation is implemented, it is preferable that symbols which are used to modulate the lower outer sideband narrowband subcarrier waveforms with outermost frequencies (i.e. those furtherest in frequency from center frequency $f_c$) are also used to modulate the innermost upper outer sideband narrowband subcarrier waveforms (i.e. those closest in frequency to $f_c$), with or without diversity delay. Similarly, symbols used to modulate the innermost lower outer sideband narrowband subcarrier waveforms are also used to modulate the outermost upper outer sideband narrowband subcarrier waveforms. When narrowband subcarrier waveforms are implemented, as described previously, exchanging the frequency-ordering in the mapping for the upper outer and lower outer sidebands for the replicated codeword information improves the system performance by maximizing the average frequency separation between redundantly modulated subcarrier waveforms.

In many embodiments, whether or not the spectrum of each subcarrier waveform is narrowband (e.g. OFDM) or wideband, it is preferable that a sufficient plurality of subcarrier modulators 155 is implemented in each of sideband digital signal generators 67, 71, and 81, so that the baud or symbol interval of each subcarrier waveform is made reasonably long compared to the expected duration of impulse interference and intersymbol interference. For example, when the source bit information is encoded with rate ¾ 16-ary pragmatic trellis-coded modulation over about 20 kHz of bandwidth (i.e. 3 source bits/Hz/sec), and when the desired user bit throughput is about 60 kbit/sec, the symbol interval in a system with only one I&Q pair of digitally-modulated subcarrier waveforms is about 50 microseconds, which is short compared to the expected duration of transient interference in the AM-band. It is preferable that the symbol interval be between about 1 millisecond and 100 milliseconds in many embodiments, which necessitates a plurality of subcarrier waveforms which as an aggregate convey the source bit rate but each of which has a substantially longer symbol interval than in a corresponding single-pair subcarrier system. For a 5 millisecond symbol interval, about 50 subcarrier pairs (e.g. I&Q modulation of each narrowband OFDM sinusoid or arbitrarily paired wideband subcarrier waveforms within each sideband) are implemented in certain embodiments for the inner sideband digital signal, outer upper sideband digital signal, and redundant lower outer sideband digital signal; in other words, about 150 subcarrier pairs in total with about 100 subcarrier pairs conveying unique codeword information.

The symbol interval for OFDM systems defines the frequency separation between adjacent OFDM narrowband subcarriers, which is the reciprocal of the symbol interval (e.g. 100 Hz frequency separation between adjacent sinusoidal waveforms for a symbol interval of 10 milliseconds). OFDM systems also commonly incorporate an extension of the symbol interval by a further amount of time known as the guard interval. The guard interval is typically less than about 10 percent of the symbol interval. No useful information is conveyed in the guard interval, which is typically generated by appending a null (zero) signal or a partial cyclic extension of the previous symbol, but its existence provides a period of time in which deleterious intersymbol interference may occur without disrupting the operation of the receiver; received information in the guard interval is ignored. The disadvantage of such a guard interval is that its existence reduces the effective bit rate throughput by a corresponding amount. In receiver systems which implement time-domain equalization, a guard interval may not needed for OFDM system embodiments. The symbol interval for digital signals in the inner and outer sidebands is substantially the same and synchronized (coherent) to simplify receiver implementation.

Because of the potential for first and/or second adjacent interference, in many circumstances it is desirable to minimize the amount of energy in the inner sideband digital signal at a ±10 kHz frequency offset from channel allocation center frequency $f_c$ and the amount of energy in the outer sideband digital signals at a frequency offset of ±20 kHz from channel $f_c$. The outer sideband circumstance is less problematic because of the replicated codeword information in the upper outer and lower outer sidebands. Most of the energy in a conventional AM-band analog signal, or a SSB-LC or VSB-LC analog signal according to the invention, is in the carrier signal component, which is a sinusoid at the particular AM-band allocation center frequency. Since the AM-band center frequencies are allocated at integer multiples of 10 kHz, one method to minimize the amount of digital signal energy at $f_c$±10 kHz and $f_c$±20 kHz is to offset the effective carrier frequency of the digital signals, labeled $f_{cd}$, by a small amount compared to the composite signal carrier frequency (which is $f_c$ after final frequency-translation in the transmitter system), for example, $f_{cd}=f_c$±500 Hz. When narrowband OFDM subcarriers are implemented, another method is to determine the symbol frequency (e.g. $1/\Delta T$, where $\Delta T$ is the symbol interval) so that the sum of the digital signal carrier frequency and integer multiples of the symbol frequency, which are the OFDM subcarrier frequencies, do not coincide with the adjacent AM-band center frequencies; in other words, choose $f_{cd}$ and $\Delta T$ such that $f_{cd}$±n·$(1/\Delta T)$≠$f_c$±10 kHz and ≠$f_c$±20 kHz, where n is an integer. An advantage of the system of the invention with SSB-LC or VSB-LC embodiments of the analog signal is that the analog and digital signals are, in certain embodiments, unrelated, so that it is not necessary for the analog and digital signals to have the same RF carrier frequency.

The purpose of reference waveform 165 in FIG. 14 is to facilitate the implementation of baud clock recovery, carrier frequency recovery, and equalization in the receiver system by including a signal in the transmitted composite signal which is known without ambiguity, unlike the modulated data-bearing signals. Reference signal 165, when included in the composite sideband digital signal, may be one or a plurality of narrowband sinusoidal waveforms, typically known as pilot signals or "transparent tone in band" (TTIB), or the spectrum may wideband within the particular sideband. Reference signal 165 may be, but is not necessarily orthogonal to composite sideband digital signal 159, which is the additive plurality of signals 157 from subcarrier modulators 155. Methods for generating a reference signal in a transmitter system and recovering the reference signal in a receiver system are described in U.S. Pat. Nos. 5,748,677 and 5,949,796.

Figure 15:
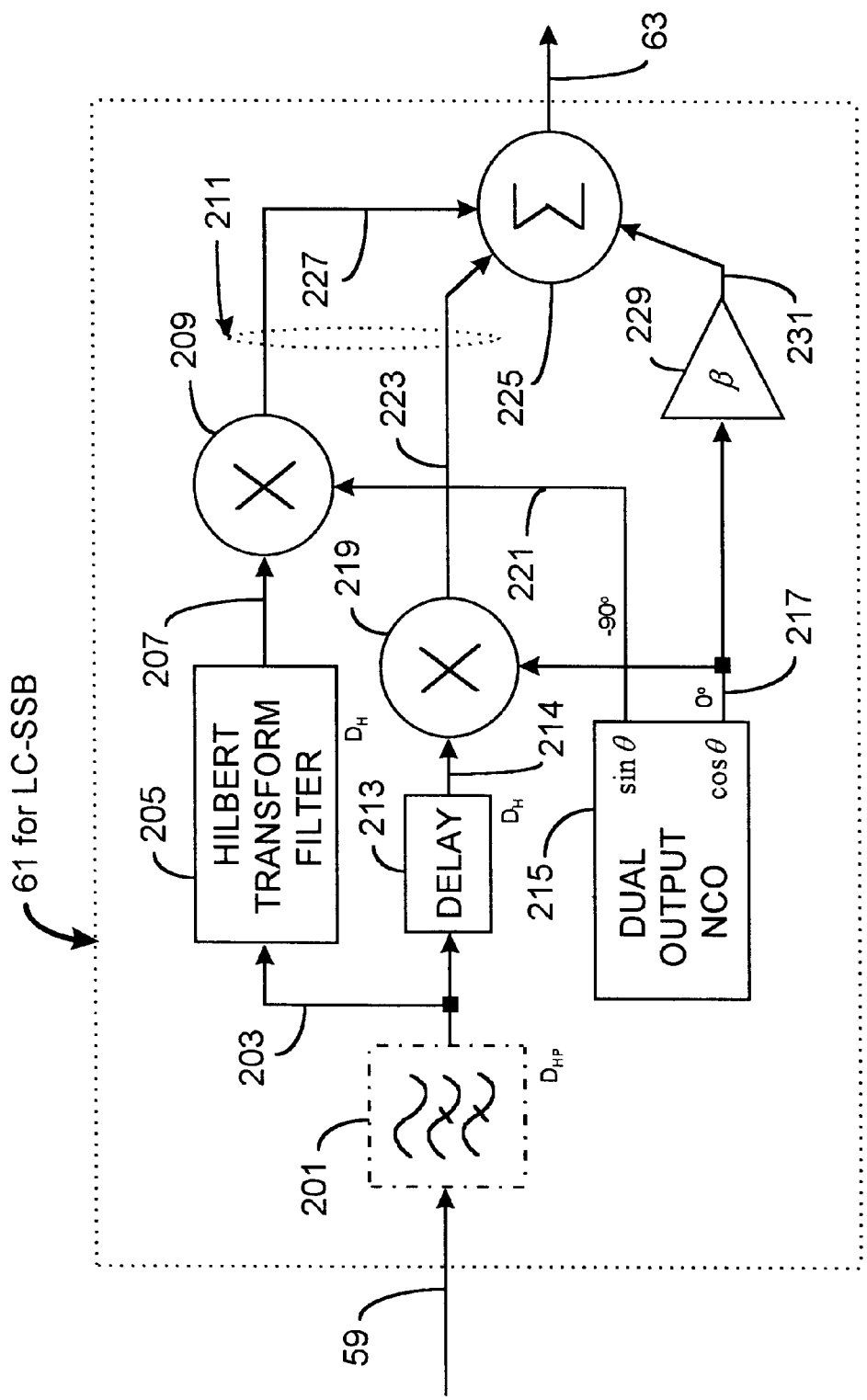
FIG. 15 is a block diagram of the processes, preferably implemented with digital circuits and arithmetic, used to generate an AM-compatible single-sideband analog signal including a large carrier component from a conventional baseband analog audio signal.

According to the transmitter system of the invention, an analog signal representing substantially the same monophonic analog audio information as a conventional analog AM signal with an audio bandwidth of less than about 7 kHz is generated. The analog signal may be received by conventional envelope detection analog AM receivers with small distortion. In certain embodiments, the analog signal is generated as a single-sideband large-carrier (SSB-LC) signal, whose exemplary spectrum is shown in FIG. 7–8, or as a vestigial-sideband large-carrier (VSB-LC), whose exemplary spectrum is shown in FIG. 9. Intermediate frequency representation 63 of the SSB-LC or VSB-LC analog signal is generated by SSB-LC or VSB-LC signal generator 61 in the FIG. 11 transmitter system. FIG. 15 is a block diagram of signal generator 61 for a SSB-LC embodiment of the transmitter invention. Although the SSB-LC signal represents analog audio information, in many embodiments it is preferable to implement the signal processing steps using digital arithmetic after analog-to-digital conversion.

In FIG. 15, digitized, lowpass filtered monophonic analog audio signal 59 is highpass-filtered 201 to substantially attenuate audio frequency components below about 100 Hz. Highpass-filtering 201 reduces the implementation complexity of Hilbert transform filter 205, described subsequently. Highpass filter 201 may be incorporated together with lowpass filter 55 prior to ADC 57 in certain embodiments, in which case filter 55 is a bandpass filter. Dual output numerically controlled oscillator (NCO) 215 generates two sinusoidal signals 221 and 217 with the same frequency, which is the intermediate frequency $f_{IF}$, substantially the same amplitude, and a substantially quadrature (i.e. 90°) phase-relationship. A NCO is a digital device which is typically implemented with a phase accumulator register and read-only-memory (ROM) lookup tables; for example, see the Q2334 dual direct digital synthesizer technical data sheet from Qualcomm Incorporated, VLSI Products, 6455 Lusk Boulevard, San Diego, Calif. NCOs may be combined with digital-to-analog converters and lowpass filters to implement direct digital synthesis (DDS) systems. For a NCO, the rate of change in the value of a phase accumulator is the phase increment. The phase increment directly determines the frequency of the generated carrier signal. NCO carrier signal 217 is propagated to amplifier/attenuator 229, which is a digital scalar multiplier (shown as scale-factor β in FIG. 15). Amplifier/attenuator 229 is used to adjust the amplitude of a replica of signal 217 without affecting signal 217. The function of amplifier/attenuator 229 is to establish the amount of carrier signal 217 which is summed 225 together with single-sideband suppressed-carrier (SSB-SC) signal 211, described subsequently; in other words, to determine the ratio between carrier signal 231 power and sideband signal 211 power, so that resulting single-sideband large-carrier (SSB-LC) signal 63 has a sufficiently large carrier signal component. For proper operation of conventional envelope detection AM-band analog receivers, the average amount of carrier signal power in analog signal 63 as a percentage of the total signal power, which includes both the carrier signal and the analog sideband signal, is greater than about eighty percent.

In FIG. 15, filtered monophonic audio signal 203 is propagated to delay 213 and to Hilbert transform filter 205. The amount of latency implemented in delay 213 corresponds to the group delay of Hilbert transform filter 205 so that the latency in resulting signals 207 and 214 is about the same. Delay 213 is unrelated to diversity delays 48, 77. Phase-shifted signal 207 after Hilbert transform filter 205 is multiplied 209 with quadrature IF carrier signal 221, generating signal 227. After delay 213, latency-compensated signal 214 is multiplied 219 with in-phase IF carrier signal 217, resulting in signal 223. Composite signal 211, which is the sum of signals 227 and 223, corresponds to the desired single-sideband signal, but with substantially no carrier signal component, which is known as a single-sideband suppressed-carrier (SSB-SC) representation. A SSB-SC representation of the analog audio information is not compatible with conventional analog AM receivers with envelope detectors. Signals 223 and 227 are summed 225 together with large-carrier signal component 231 to determine single-sideband large-carrier (SSB-LC) signal 63, which is the desired digital representation of the analog signal. In certain embodiments, an advantage of selecting the sampling frequency to be an integer multiple of the intermediate frequency (e.g. a factor of 4) is that the implementation of NCO 215 and multipliers 209 and 219 is significantly less complicated than for an arbitrary intermediate frequency because the sine/cosine functions for NCO 215 take on only a small number of unique values, in which case NCO 215 and multipliers 209, 219 may be replaced with look-up tables implemented with digital multiplexors (not shown).

The function of Hilbert transform filter 205 is to cause a phase-shift of about 90° for substantially all frequencies in digitized and filtered analog audio signal 203. Methods for implementing Hilbert transform filters using finite impulse response (FIR) digital filters are known [reference: S. D. Stearns and R. A. David. *Signal Processing Algorithms in Fortran and C.* Englewood Cliffs, N.J.: PTR Prentice Hall, Inc., 1993, pp. 297–302]; see also U.S. Pat. No. 4,835,791 to Daoud. A Hilbert transform filter implemented with a N "tap" or "weight" FIR digital filter, where N is odd, has a group delay of (N–1)/2 taps, which is also the latency compensation in delay 213. The number of taps in the implementation of Hilbert transform filter 205 depends upon the lowest audio frequency which is to be passed through filter 205. The extent of Hilbert transform filter 205 in time, which is the product of the number of taps and the reciprocal of the sampling frequency, is larger than the corresponding period of the lowest frequency which Hilbert transform filter 205 is to pass. For example, to preserve low frequency analog audio information at about 100 Hz without introducing significant amounts of amplitude and/or phase distortion as a result of Hilbert transform filter 205, other than the desired phase shifting, about 800 taps are implemented for Hilbert transform filter 205 at a sampling frequency of 80 kHz (i.e. a real-valued IF frequency of 20 kHz). Such filtering involves about 32 million multiply-accumulate (MAC) operations per second since half of the Hilbert transform filter taps have zero weight. Exemplary tap weights are included in the microfiche appendix. The number of taps in Hilbert transform filter 205 may be reduced by first determining the Hilbert transform of analog audio signal 51 using a sampling frequency closer to the twice the Nyquist frequency for the analog information than the IF frequency (e.g. a sampling frequency of 20 kHz vs. 80 kHz for 10 kHz audio), followed by interpolation of the resulting signal to the higher sampling frequency of the IF representation (e.g. 80 kHz). Such a multi-rate implementation (not shown) involves a design tradeoff between the complexity of the Hilbert transform filter and the complexity of the required interpolator; see also U.S. Pat. No. 4,974,236 to Gurcan, et. al. SSB-LC generator 61 may be configured to preserve substantially either the lower or upper sideband of the resulting signal by altering summer 225. The configuration shown in FIG. 15 preserves the lower sideband analog signal as shown in IF spectrum representation 100 in FIG. 11.

Figure 16:
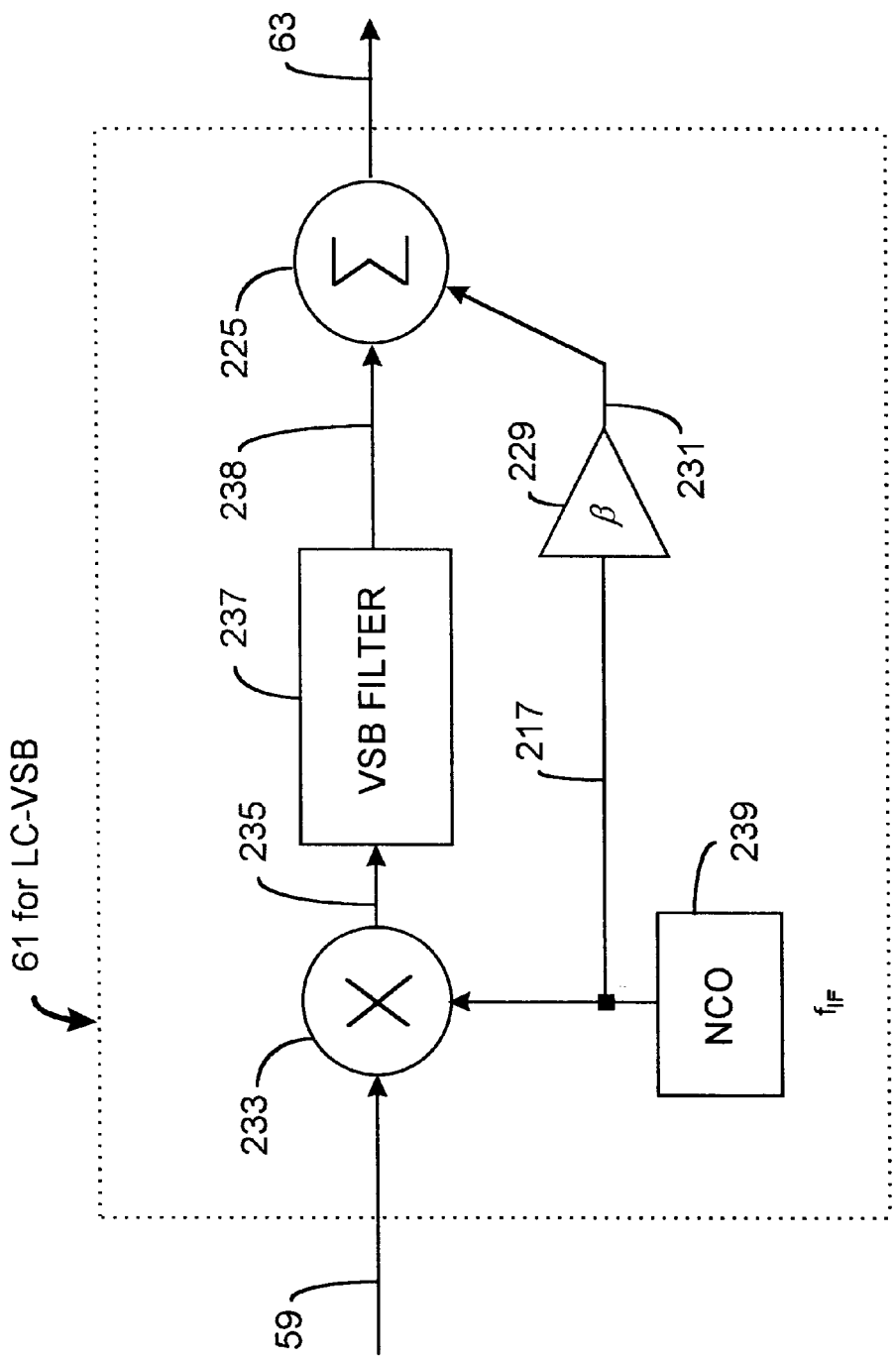
FIG. 16 is a block diagram of the filtering, preferably implemented with digital circuits and arithmetic, used to generate an AM-compatible vestigial-sideband analog signal including a large carrier signal component from a conventional baseband analog audio signal.

FIG. 16 is a block diagram which shows analog signal generator 61 for a vestigial-sideband large-carrier (VSB-LC) representation of the monophonic analog audio information. Digitized lowpass-filtered audio signal 59 is multiplied 233 by sinusoidal carrier signal 217, which is generated by NCO 239. The frequency of carrier signal 217 is the intermediate frequency (IF) value, for example 20 kHz. Carrier signal 217 is amplified/attenuated in digital scalar multiplier 229, resulting in signal 231, which is used to establish the amount of carrier signal power in resulting VSB-LC signal 63 after summation 225. The use of scalar multiplier 229 to adjust carrier signal power relative to analog sideband power was described previously for the SSB-LC embodiment and is common to both the SSB-LC and VSB-LC embodiments. VSB filter 237 is preferably a digital finite impulse response (FIR) filter which implements the vestigial shaping function. VSB filter 237 acts on IF representation 235 of the analog signal. IF representation 235 is known as double-sideband suppressed-carrier (DSB-SC) and includes two substantially symmetric (mirror image) sidebands about a suppressed carrier frequency signal, which is the intermediate frequency. If a large carrier signal component were present in representation 235, it would be equivalent to the conventional analog AM signal, frequency-translated to the IF frequency. VSB filter 237 significantly attenuates either the upper or lower sideband in IF representation 235 while preserving the phase and amplitude relationships between the sidebands in resulting VSB-SC signal 238 so that conventional synchronous demodulation may be implemented in the receiver system (or conventional envelope detection methods after summation 225 with large carrier signal component 231).

Figure 17:
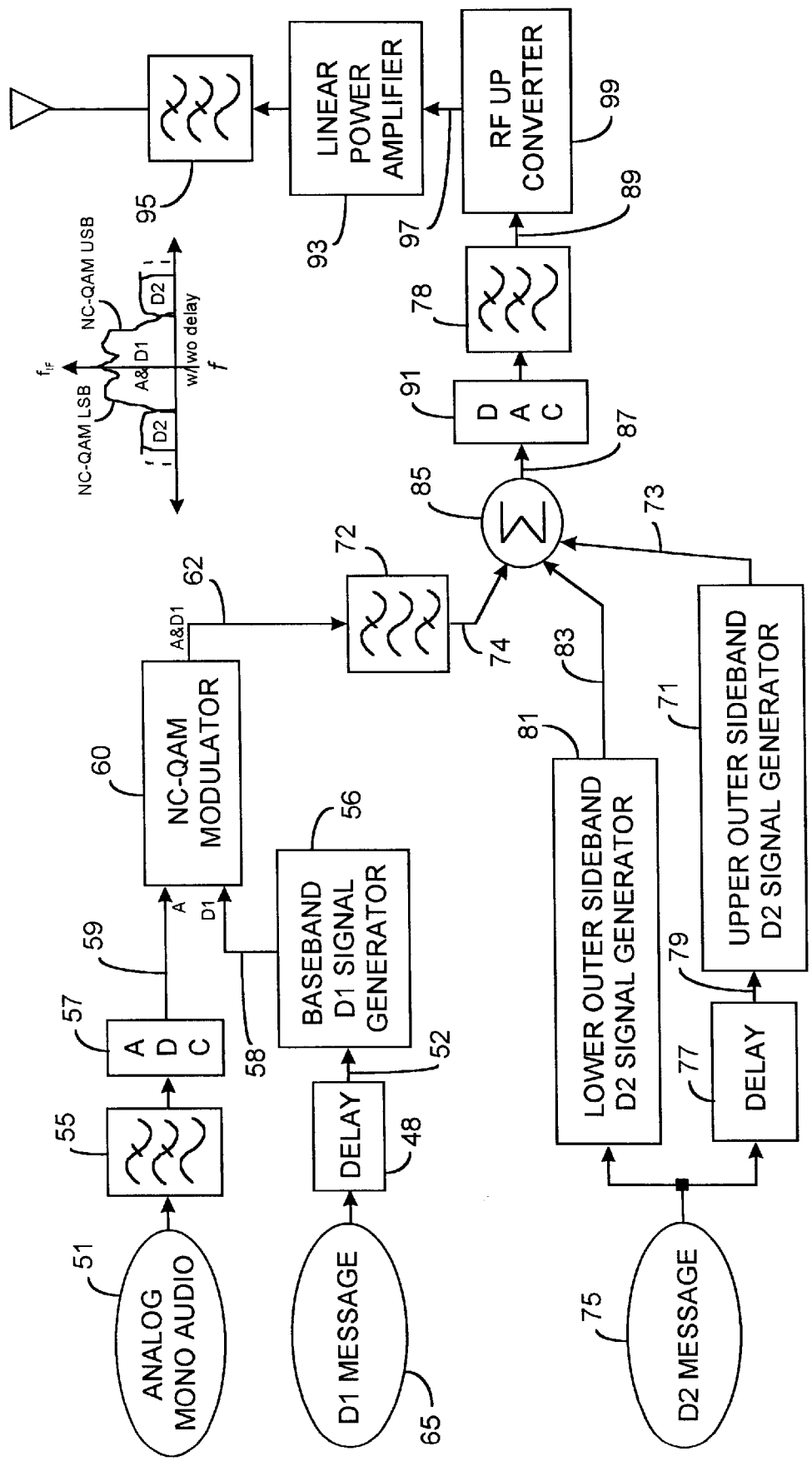
FIG. 17 is a block diagram of another embodiment of the transmitter system of the invention. A baseband digital signal is combined with a monophonic audio signal, and nonlinear compatible quadrature amplitude modulation is used to generate inner sideband combined signals. Further digital signals are generated in the outer sidebands with replicated codeword information. Diversity delay is implemented between the transmission of replicated codeword information in the upper outer and lower outer sideband digital signals.

FIG. 17 is a block diagram of the transmitter system when the analog signal is generated according to the FIG. 10 spectrum, where the analog signal is neither SSB-LC nor VSB-LC. In FIG. 17, the steps and processes for generating the outer sideband digital signals and for up-converting the composite IF signal to the desired RF signal are as in the FIG. 11 transmitter system. However, the FIG. 11 and FIG. 17 transmitter system embodiments differ in the generation of the inner sideband digital signal and analog signal. In FIG. 17, lowpass filtered analog audio signal 59 is combined with baseband digital signal 58 in nonlinear compatible quadrature amplitude modulation (NC-QAM) modulator 60. Baseband digital signal 58 is generated by baseband D1 signal generator 56. Baseband D1 signal generator 56 digitally modulates subcarrier waveforms using D1 codeword message 65 or, in certain embodiments when diversity delays 48, 77 are implemented, delayed D1 codeword message 52. The implementation of baseband signal generator 56 is similar to that of inner sideband signal generator 67, except that the spectrum of each of the subcarrier waveforms for baseband signal generator 56 is confined substantially between 0 kHz and about 8 kHz (i.e. a baseband representation of an inner sideband).

NC-QAM modulator 60 may be implemented by modifying a conventional C-QUAM™ analog AM-band stereo signal generator, when such generator is implemented at the intermediate frequency. A conventional C-QUAM™ analog AM-band stereo signal generator determines an analog stereo signal according to the C-QUAM™ representation from left (L) and right (R) analog audio signal inputs. The C-QUAM™ signal generator is preferably implemented with digital circuits for improved precision and repeatability. For NC-QAM modulator 60, instead of propagating a left audio signal to the L input of a C-QUAM™ signal generator, the arithmetic sum of lowpass-filtered monophonic audio signal 59 and digital baseband signal 58 (i.e. A+D1) is propagated to the L input. Instead of propagating a right audio signal to the R input of a C-QUAM™ signal generator, the arithmetic difference between lowpass-filtered monophonic audio signal 59 and digital baseband signal 58 (i.e. A–D1) is propagated to the R input. The L and R inputs may be reversed. The signal resulting from conventional C-QUAM™ modulation may be used as NC-QAM modulated signal 62, which is the combined analog and digital baseband inner sideband signal.

NC-QAM modulated signal 62 is bandpass filtered 72, and resulting filtered signal 74 is summed 85 together with outer sideband digital signals 73, 83 to determine composite IF signal 87. Bandpass filter 72 substantially attenuates frequency components in NC-QAM modulated signal 62 at frequency offsets greater than about ±10 kHz from the intermediate frequency $f_{IF}$ to mitigate interference from NC-QAM modulated signal 62 to the outer sideband digital signals. Bandpass filter 72 is preferably a linear-phase finite-impulse-response (FIR) filter, so that the relationship between the analog and baseband digital signal components in NC-QAM signal 62 is not significantly distorted by filter 72.

NC-QAM is a nonlinear method of modulation. As a result, the spectrum occupied by NC-QAM modulated signal 62 is greater than the two-sided bandwidth which would result using a linear method of modulation, for example, conventional quadrature amplitude modulation with analog audio signal 59 and digital baseband signal 58. As a result of the spectrum widening in NC-QAM modulated signal 62, the spectrum of baseband digital signal 58 is constrained to be less than about 8 kHz by the design of the subcarrier waveforms in baseband digital signal generator 56, or the design of the subcarrier waveforms in the outer sidebands is such that the amount of spectrum overlap is lessened, for example, by increasing the minimum frequency offset for the innermost outer sideband subcarrier waveforms (i.e. closer to $f_c$). In general, wideband outer sideband subcarrier waveforms are less deleteriously affected by spectrum overlap with NC-QAM modulated signal 62 than narrowband outer sideband subcarrier waveforms. When the subcarrier waveforms are narrowband, for example, OFDM subcarrier waveforms, exchanging the frequency-ordering in the mapping for the redundantly modulated outer sidebands as described previously also lessens the deleterious effect of spectrum overlap between the nonlinear inner sideband and outer sideband signals.

Figure 18:
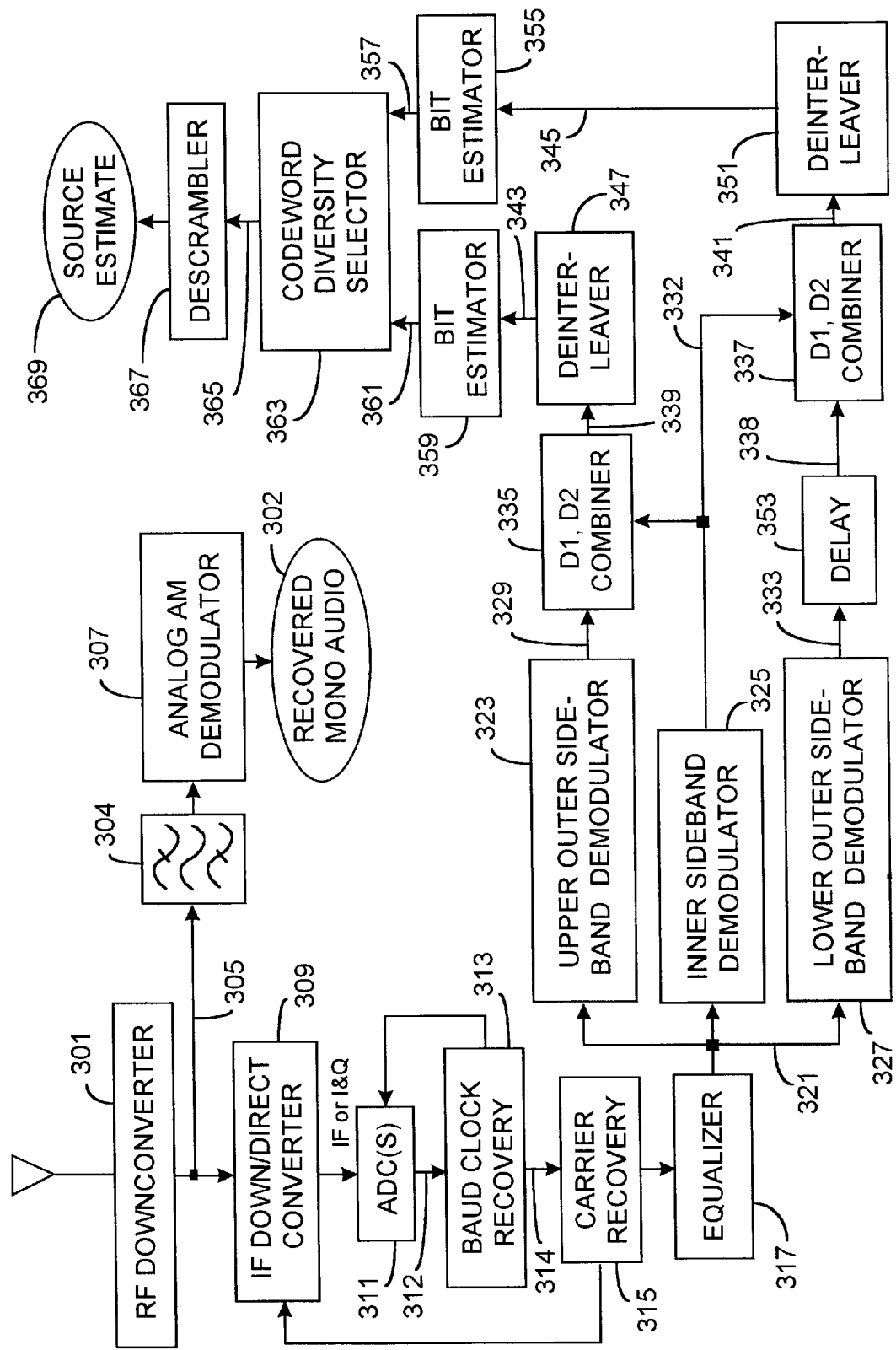
FIG. 18 is a block diagram of the receiver system according to an embodiment of the invention. Information from the demodulation of the inner digital sideband signal is separately combined with information from the demodulation of the upper outer and lower outer sideband digital signals after diversity delay compensation. A codeword diversity selector selects between two estimated codewords (or equivalently, two source bit estimates) for each at least partially redundantly transmitted codeword dynamically on a codeword-by-codeword basis, or in certain circumstances, combines codeword modulation symbol estimates and decodes.
Figure 19:
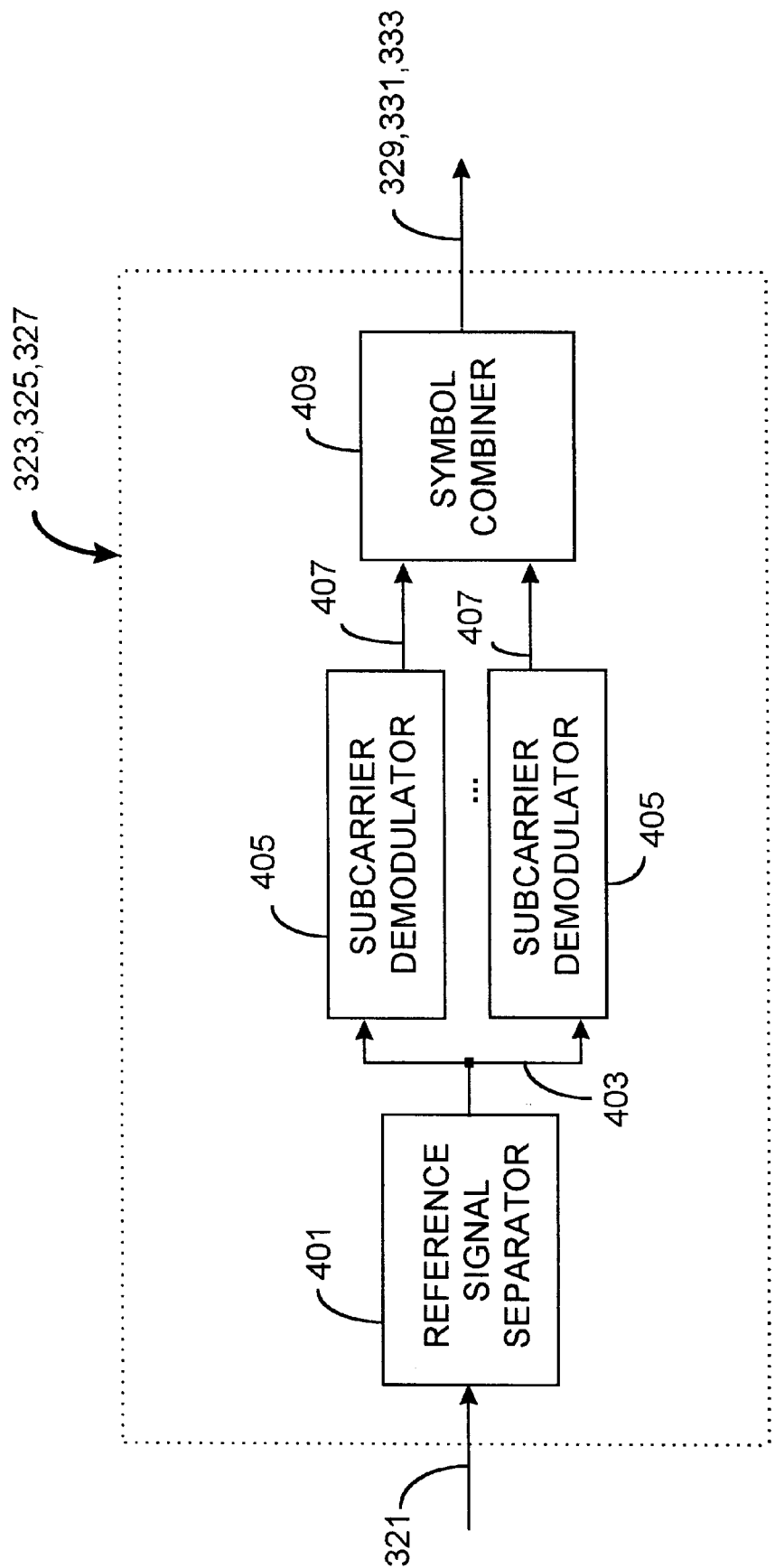
FIG. 19 is a block diagram of the subcarrier demodulators corresponding to subcarrier modulators in the FIG. 18 transmitter system. The received composite signal is correlated with the subcarrier waveforms in each sideband demodulator.

FIG. 18–19 is a block diagram of the receiver system of the invention for the FIG. 11 transmitter system embodiment. In FIG. 18, a composite RF signal, which includes the analog and digital signals, is detected with a conventional AM-band antenna system. In many embodiments, the received RF signal is amplified and frequency-translated from the desired RF frequency range, which varies according to the particular AM-band channel allocation to a fixed intermediate frequency range (e.g. $f_{IF}$±20 kHz), for further processing. Low noise amplification/frequency translation is accomplished in RF downconverter 301. RF downconverter 301 typically includes a low-noise amplifier (LNA), a balanced mixer (multiplier), a local oscillator (LO) at frequency $f_c$±$f_{IF}$ for tuning, and a bandpass filter to reject the mixer image and constrain the noise integration bandwidth. A commonly implemented intermediate frequency, $f_{IF}$, for conventional AM-band receivers is 455 kHz. The two-sided bandwidth of frequency-translated signal 305, which is the received composite IF signal, is about 40 kHz (i.e. ±20 kHz) in order to pass both the digital and analog signals in the composite signal. Monophonic analog audio information 302 may be recovered from composite IF signal 305 in conventional analog AM demodulator 307. A conventional AM demodulator includes an envelope detector and lowpass filter and typically recovers an audio signal with a bandwidth between about 5 kHz and 7 kHz. According to the SSB-LC or VSB-LC embodiments of the invention, recovery of the analog signal sideband (and consequently monophonic audio signal 302) is not required to recover the supplemental digital signals. However, in certain embodiments described subsequently, the large-carrier signal component of the SSB-LC or VSB-LC analog signal may be tracked in the digital signal receiver system in order to accomplish carrier frequency synchronization between the digital signal transmitter and receiver systems. When an SSB-LC or VSB-LC analog signal is transmitted, the performance of analog AM demodulator 307 may be improved by including optional bandpass filter 304 in the analog receiver prior to AM demodulator 307. Optional bandpass filter 304 has a bandwidth of about 10 kHz, and substantially passes the analog signal in the inner analog sideband and substantially attenuates the effect of the digital sideband signals.

In certain embodiments of the receiver system, the intermediate frequency is zero, which is known as "direct conversion". In a direct conversion receiver, the received RF signal is separately multiplied by both in-phase and quadrature sinusoidal carrier signals at AM-band allocation center frequency $f_c$. The sinusoidal carriers may be generated with a dual output direct digital synthesizer (DDS), described previously for the transmitter system, and the multiplication accomplished with analog methods (e.g. balanced mixers or switches) or digital methods (multipliers). After multiplication, resulting in-phase and quadrature mixed (multiplied) signals are digitized with in-phase (I) and quadrature (Q) analog-to-digital converters (ADCs) with matched characteristics and low offset errors. Direct conversion is applicable to AM-band reception because of the relatively small carrier frequencies (i.e. less than about 2 MHz). The advantage of direct conversion is that it eliminates intermediate frequency translation steps and may result in a less complicated implementation. A direct conversion embodiment of the invention utilizes ADCs with wide dynamic range, greater than about 10 bits, and preferably closer to 12–14 bits, because of the large range in received signal amplitude and the close frequency proximity between large-power (analog AM) and small-power (digital) signals.

After RF down-conversion 301 to first composite IF signal representation 305, composite IF signal 305 may be directly digitized with a single ADC, or directly downconverted and digitized with multiple ADCs, or the composite IF signal may be further filtered and its average amplitude controlled with a radio signal strength indicator (RSSI) and automatic gain control (AGC) prior to IF down/direct converter 309. In the latter embodiments, after filtering and AGC, the signal may be digitized using dual ADCs 311 (i.e. I and Q) after direct (from IF) downconversion, or the signal may be frequency translated to a second IF frequency (e.g. 20 kHz) and then digitized with single ADC 311. The objective of these steps is to generate a bandpass filtered and approximately gain-controlled representation of the received signal at a final intermediate frequency with very low value (e.g. 20 kHz), or which is zero (i.e. direct conversion). The representation of received composite signal 312 after final IF frequency translation is real-valued when the IF frequency is non-zero and complex-valued (i.e. real and imaginary parts) when the IF frequency is zero. Since reception of the SSB-LC or VSB-LC analog signal is not necessary in order to receive the digital signal, IF direct/downconverter 309 may include further bandpass/bandreject filtering to substantially attenuate the inner sideband which is substantially occupied by the analog signal. Significant attenuation of the analog signal may reduce the number of bits needed in subsequent analog-to-digital converter 311, from 12 bits to 10 bits, for example.

Digitized received signal 312 is propagated to baud (symbol) clock recovery 313. Baud clock recovery 313 compensates for timing errors in the baud (symbol) interval for the digital signals. Baud clock recovery 313 is needed because upon initial operation the transmitter and receiver systems are not synchronized. In certain embodiments, baud clock recovery 313 adjusts the sampling frequency for ADC(s) 311 so that the transmitter and receiver symbol frequencies are coherent (phase-locked). Digitized received signal 312 is often also used in carrier recovery 315 in order to accomplish carrier frequency synchronization between the transmitter and receiver systems. The function of baud clock recovery 313 and carrier frequency recovery 315 is common to any coherent digital communication systems. The update rate for carrier recovery 315 is faster than that for baud clock recovery 313 because changes in baud interval occur very slowly. In general, implementing carrier frequency tracking for AM-band signals is less complicated than for FM-band signals because of the low RF carrier frequencies in the AM-band. For example, frequency shift due to the Doppler effect in the AM-band is very small, much less than 1 Hz. Some methods for accomplishing baud and carrier frequency synchronization are described in U.S. Pat. Nos. 5,748,677 and 5,949,796.

In certain embodiments of the receiver invention, the transmitted reference signal component in the inner sideband digital signal may be tracked and used for baud and/or carrier frequency recovery. The reference signal component in the outer sideband digital signals, if present, is used for signal equalization in certain embodiments. In certain preferable receiver system embodiments, the large-carrier signal component of the received SSB-LC or VSB-LC analog signal is used in carrier recovery 315, for example, with a narrowband phase-locked loop (PLL) preceded by an amplitude-limiter. The loop bandwidth is less than about 1 kHz. Use of the large-carrier signal component is advantageous because of the large amount of power in the carrier signal, which makes its determination in the receiver robust against noise. When the digital signal transmitter system implements a predetermined frequency offset from the analog large-carrier frequency for the digital signal carrier frequency, in other words, when $f_{cd} \neq f_c$, the predetermined frequency offset is also applied to the determined frequency estimate of the large-carrier signal component in the received analog signal in order to recover the digital signal carrier frequency. The local oscillator(s) used in the generation of the analog signal and digital signals in the transmitter system must be coherent (i.e. resulting signals 63 and signals 69, 83, 73 in FIG. 11 are coherent) in order to use the analog signal carrier in order to recover the digital signal carrier in the receiver system.

The SSB-LC or VSB-LC analog signal is not useful in baud clock recovery 313 for the digital signals. In certain embodiments of the system invention, baud clock synchronization 313 in the receiver system is facilitated by including a "pilot" tone as reference signal 165 in composite inner sideband digital signal 69 in the FIG. 11 transmitter system. The pilot tone frequency is determined so that the (common) symbol frequency of the inner and outer sideband digital signals is a rational (i.e. p/q, where p and q are integers) or, preferably an integer multiple of the pilot tone frequency; for example, a symbol frequency of 100 Hz (i.e. 10 ms) and a pilot tone of 25 Hz (i.e. 100 Hz/4=25 Hz). In the corresponding receiver system, a narrowband phase-locked loop (PLL) is used to recover the pilot tone, and the symbol frequency is generated by coherent frequency multiplication of the recovered tone. The effect of the pilot tone on the digital signal recovered in the receiver system may be mitigated by filtering (highpass or bandpass) or by averaging and subtracting, for example.

Radio propagation in the AM-band of frequencies differs from radio propagation at much higher frequencies, for example, the VHF and UHF bands, because of the very long wavelength (e.g. 300 meters at 1000 kHz) and certain atmospheric and ground conductivity effects. In particular, conventional close-in multipath propagation and Doppler frequency shift do not significantly affect AM-band signals to the same degree as higher frequency RF signals, for example, FM-band signals. However, received AM-band signals are subject to dispersion due to the effect of nearby large metallic structures and re-radiation of signals from power lines [reference: C. W. Trueman and S. J. Kubina, "Initial assessment of re-radiation from power lines," *IEEE Transactions on Broadcasting*, Vol. 31, No. 3, pp. 51–65, September 1985 and N. M. Maslin in *HF Communications: A Systems Approach*. New York: Plenum Press, 1987, pp. 94–98]. AM-band signals are also subject to a kind of multipath interference known as "sky wave" propagation due to signal reflections from the ionosphere, particularly at night. Sky wave propagation can be very deleterious because of the large delay spreads, which may be several milliseconds. Sky wave propagation is a further reason (in addition to impulse interference) a long symbol (baud) interval for the subcarrier waveforms in the digital signals is desirable.

The various causes of signal dispersion result in varying received signal amplitude and group delay across the bandwidth of the composite analog and digital signals, which further vary as a function of time when the receiver is in motion. This is known as a time-varying frequency-selective RF channel. The magnitude of the deleterious effects of the RF channel on the source bit estimate determined in the receiver system depends upon the modulation and FEC methods implemented in the corresponding transmitter system. When OFDM subcarrier waveforms are implemented in each sideband, and when the subcarriers are modulated as I&Q pairs with m-ary phase-shift keying (PSK), for example, rate ¾ 16-ary pragmatic trellis-coded modulation (PTCM), then variations in amplitude as a function of frequency are significant only when the amplitude becomes very small, close to the system noise floor. However, m-ary PSK is sensitive to differences in the group delay as a function of frequency. Multiple pilot tones, or preferably, differential signaling may be implemented to reduce this sensitivity. Methods for implementing differential m-ary PTCM are known; see U.S. Pat. No. 5,428,631 to Zehavi and No. 5,233,630 to Wolf, the disclosures of which are incorporated hereby by reference. m-ary quadrature amplitude modulation (QAM) is more efficient than corresponding m-ary PSK in additive white Gaussian noise (AWGN), but m-ary QAM is sensitive to both phase and amplitude variations across the digital signal spectrum. Wideband (within the sideband) subcarrier waveforms are, in general, more robust than narrowband (e.g. OFDM) subcarriers against sky wave propagation when the delay spread exceeds the guard interval.

Another method to reduce the effects of dispersion is to equalize 317 the received signal. Equalization may be implemented in the time-domain (e.g. prior to FFT demodulation for OFDM) and/or in the frequency-domain (e.g. after FFT demodulation for OFDM). Many methods of implementing equalizer 317 are known; for example, minimum mean square estimation (MMSE), least mean square (LMS), and recursive least square (RLS) update algorithms for finite impulse response (FIR) equalization filters. When equalization is implemented in the receiver system, it is preferable that reference signal 165 is included in the composite digital signal in the transmitter system to facilitate the update algorithm for equalizer 317. A transmitted reference signal facilitates equalization because it provides a predetermined waveform whose characteristics in the absence of distortion are known to the receiver system. The received reference waveform may be separated from the received composite signal in the receiver system and compared to the predetermined reference waveform in order to determine how to change (adapt) the equalizer coefficients (also known as weights or taps or samples) in order to minimize the dispersion. In most circumstances, equalization is not able to correct for dispersive effects completely, particularly when the receiver is in motion. Furthermore, the process of equalization itself may generate additional noise in the determined signal estimate. In the transmitter system, separate reference waveforms may be transmitted in each of the sideband regions occupied by digital signals, for example, one of the upper inner or lower inner sidebands, and the upper outer and lower outer sidebands. For frequency-domain equalization with OFDM, typically one complex (I&Q, phase/amplitude) equalization weight is implemented for each narrowband I&Q subcarrier pair. For time-domain equalization, one equalizer with a plurality of weights is preferably implemented, and the reference signals are considered together as one reference signal across the inner and outer sidebands. For example, when the sampling frequency is 80 kHz, the time extent of a 50 tap FIR equalizer is about 0.625 milliseconds, which requires about 4 million multiply/accumulate operations/sec (MACs).

After equalization 317, which may not be implemented in all receiver system embodiments, received and synchronized signal estimate 321 is propagated for demodulation in upper outer sideband demodulator 323, inner sideband demodulator 325, and lower outer sideband demodulator 327. Demodulators 323, 325, and 327 in the FIG. 18 receiver system correspond to signal generators 71, 67, and 81, respectively, in the FIG. 11 transmitter system. Demodulators 323, 325, and 327 determine signals 329, 332, and 333, respectively, which are modulation symbol estimates for the subcarrier waveforms in the respective sideband. For example, when rate ¾ 16-ary PTCM and OFDM subcarriers are implemented in the transmitter system, demodulators 323, 325, and 327 implement OFDM demodulation and phase estimation for each narrowband OFDM subcarrier (pair). The number of bits in the representation of each estimated modulation symbol is less than about ten, preferably closer to eight bits (e.g. four bits for the I estimate and four bits for the Q estimate, for each subcarrier pair) to minimize the amount of digital memory for subsequent deinterleaving and diversity delay, when implemented.

The function of demodulators 323, 325, and 327 is to correlate received signal 321 with each of the subcarrier waveforms in the respective digital signal sideband to first determine scalar quantities, and eventually modulation symbol estimates, for each subcarrier demodulator. A block diagram of each of demodulators 323, 325, and 327 is shown in FIG. 19. In certain embodiments, the effect of transmitted reference signal 165 on received composite signal 321 is substantially attenuated by reference signal separator 401. Methods of separating and recovering reference signals in a receiver system are described in U.S. Pat. No. 5,748,677. After reference signal removal or attenuation, when necessary, composite signal 403 is propagated to plurality of subcarrier demodulators 405. Subcarrier demodulators 405 determine the cross-correlation at the nominal sampling point, which is a scalar value, between composite signal 403 and each of the subcarrier waveforms for the particular sideband. Cross-correlation at the sampling point presumes that baud synchronization in baud clock recovery 313 has been accomplished. In each subcarrier demodulator, the determined scalar values resulting from the crosscorrelation of the received signal with the subcarrier waveforms are mapped to modulation symbol estimates. When m-ary PSK is implemented for subcarrier pairs in the transmitter system, correlation sums determined for each subcarrier pair in the receiver system, arbitrarily labeled I and Q, are mapped to an estimate of the transmitted phase angle for the subcarrier pair for that symbol interval, for example, as given by arctan (Q/I). When OFDM modulation and corresponding OFDM demodulation is implemented, plurality of subcarrier demodulators 405 are accomplished as one process for demodulators 323, 325, 327, by using a Fast Fourier Transform (FFT) algorithm. Modulation symbol estimates 407 are re-arranged as a serial sequence of symbol estimates in symbol combiner 409. Thus, symbol combiner 409 in the receiver system reverses the serial-to-parallel conversion accomplished by corresponding symbol separator 151 in the transmitter system.

There is a correspondence between the symbols in transmitted delayed D1 source message 52 and estimated inner sideband modulation symbols 332. Similarly, there is a correspondence between symbols in the transmitted delayed D2 source message 79 and estimated upper outer sideband modulation symbols 329, and between D2 message 75 and estimated lower outer sideband modulation symbols 333. However, the representation of the transmitter and receiver estimated modulation symbols may not include the same number of bits because of the presence of "soft-decision" information at the receiver. When diversity delays 48, 77 are implemented as shown in the FIG. 11 transmitter system, corresponding delay 353 is implemented in the FIG. 18 receiver system for lower outer sideband demodulator 327. The function of delay 353 is to cause latency in the received modulation symbol estimate 333 (for which codeword information was not delayed in the transmitter system) so that resulting delayed message estimate 338 corresponds to the same codeword information at the same time as estimate 329 for proper operation of codeword diversity selector 363, described subsequently. When transmitter delay 77 is instead implemented for lower sideband signal generator 81 (not shown), the corresponding receiver delay is implemented after upper outer sideband demodulator 323. The amount of digital memory used to implement delay 353 in the receiver system is not necessarily the same as for delays 48, 77 in the transmitter system because of the (possible) difference in the representation of the modulation symbols in the transmitter system and the modulation symbol estimates in the receiver system. However, delays 353, 48 and 77 correspond to the same amount of time or symbols.

In FIG. 18, upper outer sideband estimated modulation symbols 329 and inner sideband estimated modulation symbols 332 are propagated to first D1, D2 combiner 335. Separately, inner sideband estimated modulation symbols 332 and delayed lower outer sideband estimated modulation symbols 338 are propagated to second D1, D2 combiner 337. D1, D2 combiners 335, 337 in the FIG. 18 receiver system reverse the effect of D1, D2 separator 115 in FIG. 12. D1, D2 combiners 335, 337 combine inner and outer sideband modulation symbol estimates to determine estimates 339, 341, respectively, of each transmitted interleaved codeword 113, which is a sequence of modulation symbols. For example, when separator 115 in the transmitter system propagates consecutive codeword symbols 113 to D1 message 65 and D2 message 75 alternately, D1, D2 combiners 335, 337 generate combined messages 339, 341, respectively, by forming sequences of estimated modulation symbols from the inner and outer sideband modulation symbol estimates alternately. Combined modulation symbol estimates 339, 341 correspond to the same transmitted codeword information 113 at the same time even when diversity delays 48, 77 are implemented in the transmitter system because of diversity delay compensation 353 in the receiver system. After combining, redundant estimates 339, 341 are separately deinterleaved in symbol deinterleavers 347, 351, respectively. Deinterleavers 347, 351 in the FIG. 18 receiver system are substantially the same and each reverses the effect of corresponding interleaver 111 in the transmitter system. Deinterleaving may be implemented prior to or subsequent to bit estimation. In many embodiments, it is preferable to implement deinterleavers 347, 351 prior to bit estimating in order to reduce the amount of digital memory, especially for higher order modulations, for example, 16-ary PSK. In FIG. 18, deinterleavers 347, 351 operate on modulation symbol estimates, which are typically correlation sums (e.g. determined I and Q scalar value pairs) or equivalent amplitude and/or phase estimates, instead of bit estimates. After deinterleaving 347, 351, redundant estimated modulation symbol codewords 343, 345 are propagated to bit estimators 359, 355, respectively. Bit estimators 359, 355 determine source bit estimates 361, 357, respectively, from the received modulation symbol estimates, which are, or may be mapped directly to codeword estimates. Determined bit estimates 361, 357 represent substantially the same transmitted codeword (and source bit) information in the absence of errors because of the replication of part of the codeword information in both the lower outer and upper outer sideband digital signals, with inner sideband digital signal codeword information common to both determined estimates. Bit estimators 359, 355 implement forward error correction (FEC) decoding methods in the receiver system which correspond to the FEC encoding methods implemented in ECC encoder 107 in the transmitter system, for example, pragmatic trellis coded modulation (PTCM) in the transmitter system and PTCM decoding in the receiver system as accomplished with a Qualcomm Q1875 decoder integrated circuit, referenced previously.

Bit estimates from estimators 359, 355, and in certain embodiments, side-information determined as the result of the bit estimating, is used in codeword diversity selector 363 to determine which of the determined estimates 361, 357 is less likely to be erroneous for each transmitted codeword. In certain embodiments of the receiver system, for each transmitted codeword (i.e. on a codeword-by-codeword basis), codeword diversity selector 363 determines whether to i) propagate either the source bit information for determined estimate 361 or the source bit information for determined estimate 357 as source bit information estimate 365, or whether to ii) combine modulation symbol (codeword) information from estimates 343, 355, and re-estimate (by re-decoding) the source bits from the combined modulation symbol information. In certain embodiments, re-estimation of the combined modulation symbol information is not implemented to simplify receiver implementation; in other words, in these embodiments, codeword diversity selector 363 always selects between one of the two determined estimates for each redundantly transmitted codeword. After codeword diversity selector 363, determined source bit estimate 365 is de-scrambled 367 to determine final source bit estimate 369, which in the absence of bit errors, is substantially the same as source message 101. Unscrambling in descrambler 367 reverses the effect of corresponding scrambler 103 in the transmitter system. When the source bit information represents further source-encoded information, for example, compressed digital audio, source message 369 is further decoded (not shown) according to the source encoding method.

Methods for implementing bit estimators 359, 355 and codeword diversity selector 363 are described in U.S. Pat. No. 5,949,796. The U.S. Pat. No. 5,949,796 patent describes a digital broadcasting system preferably in the VHF/FM-band of frequencies. However, the methods described in the '985 application for implementing codeword diversity selection are applicable to this AM-band invention because both systems involve source bit estimation from at least two determined codeword estimates with replicated source bit information for each transmitted codeword, with or without diversity delay between the transmitted replicas. One method described in the '985 application for implementing a codeword diversity selector is the use of the accumulated Viterbi decoding algorithm branch metrics, determined at the (known) terminal state for each transmitted codeword. The metrics are compared in order to determine whether to select between decoded codewords or combine codeword information and re-decode. When differential modulation methods are implemented, for example, differential m-ary PTCM, the phase-ambiguity is resolved prior to comparison of accumulated branch metrics for codeword diversity selection. Methods for resolving phase ambiguities in differential m-ary PTCM are known; see U.S. Pat. No. 5,428,631 to Zehavi and No. 5,233,630 to Wolf the disclosures of which are incorporated herein by reference.

In certain embodiments of the receiver system when PTCM demodulation is implemented, trellis decoding in the receiver system for those bits which are not convolutional-encoded in the transmitter system (i.e. the half-plane bit for rate $\frac{2}{3}$ 8-ary PTCM or the two quarter-plane bits for rate $\frac{3}{4}$ 16-ary PTCM, for each modulation symbol) is not performed until after codeword diversity selector 363. The convolutional-encoded bits are first decoded and Viterbi metric information is used in the implementation of diversity selector 363 as described above and in the '985 application. After the determination whether to select between or, in certain embodiments, to combine codeword information and re-decode is made in diversity selector 363, the corresponding non-convolutional-encoded trellis bits are decoded.

Figure 20:
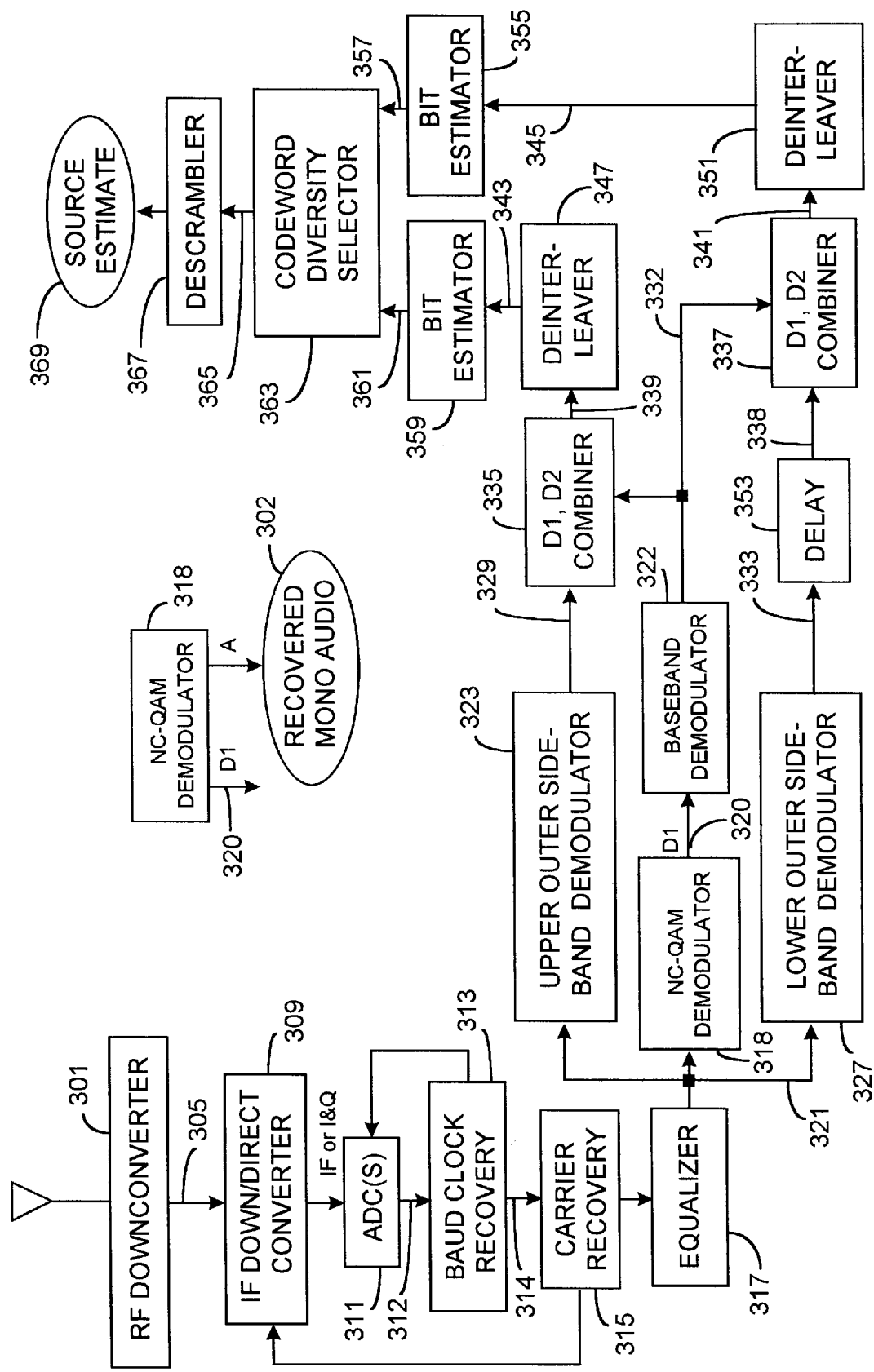
FIG. 20 is a block diagram of the receiver system according to another embodiment of the invention when nonlinear compatible quadrature amplitude modulation (NC-QAM) is implemented in the corresponding transmitter system. The combined inner sideband digital and analog signals are separated by NC-QAM demodulation. The demodulation of the outer sideband digital signals and remaining processes, after inner sideband combined signal demodulation, are as in the FIG. 18 receiver system.

FIG. 20 is a block diagram of the receiver system for the FIG. 17 transmitter system, where the analog signal is neither SSB-LC nor VSB-LC. In FIG. 17, a baseband digital signal is combined with the monophonic audio signal using NC-QAM modulation to determine combined analog and digital signals in the inner sidebands. In FIG. 20, steps and processes related to the RF-downconversion, synchronization, equalization, demodulation and determination of the outer sideband digital signals are as in the FIG. 18 receiver system. Once codeword estimates are determined, processes of deinterleaving, bit estimation, codeword diversity selection, and descrambling are also as in FIG. 18. The difference between the FIG. 18 and FIG. 20 receiver system embodiments is that inner sideband demodulator 325 in FIG. 18 is replaced with NC-QAM demodulator 318 and baseband digital signal demodulator 322 in FIG. 20. Baseband digital signal demodulator 322 corresponds to baseband digital signal generator 56 in the FIG. 17 transmitter system and is implemented similar to inner sideband demodulator 325 (see FIG. 19) except that the subcarrier waveforms are substantially confined with the baseband spectrum.

In order to recover baseband digital signal estimate 320 for the transmitted D1 message, (equalized) received composite signal 321 is demodulated in NC-QAM demodulator 318, which is preferably implemented at the final IF frequency. NC-QAM demodulator 318 corresponds to NC-QAM modulator 60 in the transmitter system. NC-QAM demodulator 318 may be implemented by modifying a conventional C-QUAM™ analog AM-band stereo demodulator when corresponding NC-QAM modulator 60 is implemented with a corresponding C-QUAM™ modulator, as described previously. Methods of implementing C-QUAM™ demodulation for analog stereo in the AM-band are known; see M. Temerinac, et. al., ibid., FIG. 1, and U.S. Pat. No. 5,014,316 to Marrah, et. al. Because steps preceding and subsequent to NC-QAM demodulator 318, which may be a modified C-QUAM™ demodulator, are preferably implemented with digital circuits, digital embodiments of NC-QAM demodulator 318 are also preferred. In certain embodiments, signal 321 is bandpass filtered (not shown), preferably with a linear phase filter, to substantially attenuate frequency components at offsets greater than about ±10 kHz from $f_{IF}$ prior to demodulation 318. The C-QUAM™ demodulator generates two signals, a left (L) audio signal estimate and a right (R) audio signal estimate. However, the generated signals are not audio signals when the C-QUAM™ demodulator is driven by composite signal 321, which is not a conventional analog stereo AM-band signal. The arithmetic sum of the determined L and R signal estimates (L+R) is recovered monophonic audio signal 302. The arithmetic difference of the L and R signal estimates (L−R) is estimated D1 baseband digital signal 320. In many implementations, the L−R and L+R signals are determined within the C-QUAM™ demodulator and may be propagated directly to baseband demodulator 322 (digital signal) or as recovered monophonic audio signal 302 (analog signal), respectively, bypassing stereo matrix decoding.

When NC-QAM modulation is implemented, the carrier frequency component of the combined analog and baseband digital signals in the inner sidebands is not used for determination of the carrier frequency of the outer sideband digital signals in the receiver system, because of the presence of phase-modulation on the combined signal carrier frequency, which is caused by the NC-QAM modulation.

Once given the above disclosure, therefore, various other modifications, features or improvements will become apparent to the skilled artisan. Such other features, modifications, and improvements are thus considered a part of this invention, the scope of which is to be determined by the following claims:

I claim:

1. An in-band on-channel (IBOC) digital broadcast receiver for receiving redundantly transmitted source bit information, the receiver comprising:

receiving means for receiving a transmitted IBOC digital signal that is at least partially redundantly transmitted, said IBOC digital signal including encoded source bit information, said receiving means for receiving a first portion of said encoded source bit information that is duplicated by modulation of signals in each of upper outer and lower outer sidebands of a predetermined radio frequency (RF) mask, thereby attaining at least partial codeword redundancy, said receiving means for also receiving a second portion of said encoded source bit information that is used to modulate a signal in at least one of an upper inner sideband and a lower inner sideband of said mask;

demodulation means for demodulating the received IBOC digital signals in the upper outer sideband, the lower outer sideband, and said at least one inner sideband, in order to determine duplicate demodulated source bit information for each at least partially redundantly transmitted codeword that is made up of source bit information;

determination means for determining for each codeword whether the source bit information for the codeword that is at least partially redundantly transmitted in the upper outer sideband or source bit information for the codeword that is at least partially redundantly transmitted in the lower outer sideband is less likely to be erroneous; and selection means for selecting the demodulated source bit information determined by said determination means to be less likely erroneous.

2. The IBOC receiver of claim 1, wherein said receiving means is further for simultaneously receiving within said mask said IBOC signal and an analog AM-compatible monophonic signal in a central region of said mask about a center frequency.

3. The IBOC receiver of claim 1, further including processing means for processing the demodulated and selected source bit information and forwarding same to a user.

4. The IBOC receiver of claim 1, further comprising means for combining demodulated source bit or codeword information from (i) said at least one of an upper inner and lower inner sideband digital signal, and the upper outer sideband digital signal, with (ii) demodulated codeword information from said at least one of an upper inner and lower inner sideband digital signal and the lower outer sideband digital signal, when said determination means determines that the likelihood of error in the demodulated or recovered codeword with part of the codeword information in the upper outer sideband is substantially equal to the likelihood of error for the recovered codeword with part of the codeword information in the lower outer sideband.

5. The IBOC receiver of claim 1, further comprising upper outer and lower outer sideband digital signal demodulators and at least one of an upper inner and a lower inner sideband digital signal demodulator, and time diversity delay means located prior to said determination means for compensating for a corresponding delay in a corresponding IBOC transmitter thereby rendering the receiver robust against deleterious events which may affect both the upper outer and lower outer sideband signals at substantially the same time.

6. The IBOC receiver of claim 1, wherein said determination means is further for comparing accumulated branch metrics at a codeword terminating state from Viterbi decoding of duplicate codeword estimates determined from (i) demodulation of said upper outer sideband and said at least one of upper inner and lower inner sideband digital signals, and (ii) demodulation of said at least one of upper inner and lower inner sideband, and said lower outer sideband, digital signals.

7. The IBOC receiver of claim 1, wherein said determination means is further for comparing Hamming distances for codeword estimates determined from (i) demodulation of upper outer sideband and said at least one of upper inner and lower inner sideband digital signals, and (ii) demodulation of said at least one of upper inner and lower inner sideband and lower outer sideband digital signals and corresponding re-encoded decoded codewords.

8. The IBOC receiver of claim 1, wherein the receiver includes only one antenna, and wherein the upper outer and lower outer sideband signals representing redundant codeword information are one of (i) identical modulated upper outer and lower outer sideband RF signals; and (ii) differently modulated upper outer and lower outer sideband signals representing substantially the same information.

9. A method of receiving an in-band on-channel (IBOC) digital broadcast radio frequency (RF) signal that is at least partially redundantly transmitted in upper and lower outer sidebands of a mask, the method comprising the steps of:

receiving via a receiver the IBOC digital broadcast signal that has a first portion of codeword information replicated in each of an upper outer sideband and a lower outer sideband that are positioned relative to a center frequency, and receiving a second portion of codeword information in at least one of an upper inner sideband and a lower inner sideband;

determining, in the receiver, whether the source bit information for the codeword at least partially in the upper outer sideband is less likely to have errors in a determined source bit estimate than the replicated source bit information for the codeword that is at least partially in the lower outer sideband; and selecting, in the receiver, the source bit information for the codeword determined in said determining step to be less likely to have source bit errors, whereby the method of receiving is robust against adjacent channel interference.

10. The method of claim 9, wherein said receiving step further includes receiving an analog AM-compatible monophonic signal located between the upper outer and the lower outer sidebands, along with said IBOC signal that is present in the upper outer sideband, the lower outer sideband, and said at least one inner sideband.

11. The method of claim 10, further comprising the step of separating the received analog AM-compatible monophonic signal from the IBOC digital signal and thereafter separately demodulating said IBOC signal and said analog AM-compatible monophonic signal independently from one another; and wherein the replicated codeword information in the upper outer sideband is received at a different point in time than the corresponding codeword information in the lower outer sideband.

12. The method of claim 9, further comprising the step of time delaying demodulated information prior to source bit determination of one of the received upper outer and lower outer sideband IBOC signals in the receiver, thereby rendering the receiver robust against certain deleterious effects which may affect both outer sideband signals at once.

13. The method of claim 9, further comprising the step of time delaying demodulated information prior to source bit determination of said received at least one of an upper inner and lower inner sideband digital signal and at least one of the received upper outer and lower outer sideband IBOC DAB signals in the receiver, thereby rendering the receiver robust against certain deleterious effects which may affect both outer sideband signals at once.

14. The method of claim 9, wherein said determining step combines demodulator information from (i) said at least one of upper inner and lower inner sideband digital signal and the upper outer sideband digital signal with demodulator information from (ii) said at least one of upper inner and lower inner sideband digital signal and lower outer sideband digital signal when it is determined that the likelihood of error in the recovered source bit information from the redundantly transmitted demodulated codewords is approximately equal, and thereafter combines the demodulator information from the upper outer, lower outer, and said at least one of upper inner and lower inner sidebands in order to recover source bits.

15. An in-band on-channel (IBOC) digital audio broadcast (DAB) communication system including a transmitter and at least one IBOC DAB receiver, the IBOC DAB system comprising:

signal generator means in the transmitter including analog AM-compatible monophonic signal generator means, upper outer sideband digital signal generator means, lower outer sideband digital signal generator means, and at least one of upper inner sideband digital signal generator means and lower inner sideband digital signal generator means, said transmitter for combining an analog AM-compatible monophonic signal generated by said AM-compatible signal generator means together with digital sideband signals from said upper outer sideband generator means, said lower outer sideband generator means, and said at least one of upper inner sideband digital signal generator means and lower inner sideband digital signal generator means, into a composite signal to be transmitted to said one receiver, and wherein said sideband digital signals each include source bit information;

means for transmitting said composite signal to said receiver;

said IBOC DAB receiver for receiving said composite signal, said receiver including analog AM monophonic demodulator means, upper outer sideband digital demodulator means, lower outer sideband digital demodulator means, and at least one of upper inner and lower inner sideband digital demodulator means;

said receiver further including a comparing device for determining which of i) recovered source bit information from demodulation of inner sideband IBOC DAB signals and upper outer sideband IBOC DAB signals, and (ii) recovered source bit information from demodulation of said inner sideband IBOC DAB signals and lower outer sideband IBOC DAB signals, is less likely to be erroneous; and said receiver further including a selector for selecting, for further processing and forwarding to a user, recovered source bit information determined by said comparing device to be less likely to be erroneous.

16. The system of claim 15, wherein said transmitter includes at least one time delay device for delaying the information in the inner sideband digital signals and one of the upper outer and lower outer sideband digital signals, and wherein said receiver includes a corresponding delay mechanism for delaying demodulated information in the other one of the upper outer and lower outer sidebands, so that the system is robust against unexpected deleterious effects which may affect the upper outer and lower outer sideband signals at once.

17. The system of claim 15, wherein said transmitter transmits part of the information redundantly in said upper outer and lower outer sidebands and wherein the upper outer and lower outer sideband signals representing said redundant information may or may not be identical although the information therein is redundant.

18. The system of claim 15, wherein each of the upper outer, lower outer, and the inner sideband digital signals includes an additive plurality of orthogonal or approximately orthogonal subcarrier signals.

19. The system of claim 18, wherein the subcarrier signals in upper outer, lower outer, and inner sideband digital signals are modulated, in said transmitter, as pairs with m-ary pragmatic trellis coded modulation (PTCM) where each transmitted codeword has a finite-length and is terminated in the transmitter encoder at a predetermined state.

20. The system of claim 15, wherein said comparing device further determines whether to (i) select recovered source bit information from demodulation and determination of the inner sideband digital signal originating from said at least one of upper inner sideband digital signal generator means and lower inner sideband digital signal generator means, together with only one of the upper outer and lower outer sideband digital signals, or to (ii) combine codeword information determined from the upper outer and lower outer sideband digital signals and recover source bit information from the combined information.

21. The system of claim 15, wherein said upper outer sideband generator means, said lower outer sideband generator means, said inner sideband generator means, and said monophonic generator means are one of (i) separate and distinct generators, (ii) combined into a single generator means, and (iii) at least two of said generator means are combined.

22. A method of receiving a digitally modulated signal including at least partially redundantly transmitted codeword information, the method comprising the steps of:

receiving the digitally modulated signal which has a first part of the codeword information redundant in modulation of signals in each of an upper outer sideband and a lower outer sideband relative to a center frequency of a predetermined mask so as to result in redundancy of at least part of the codeword information, and receiving a second part of the codeword information in only one of an upper inner sideband and a lower inner sideband, whereby the codeword information in said upper outer sideband is redundant to the codeword information in the lower outer sideband;

demodulating received signals from said upper outer, said lower outer, and said one inner sidebands;

determining which of source bit information from recovered at least partially redundant codewords, from (i) demodulation of said one inner sideband and upper outer sideband signals, and (ii) demodulation of said one inner sideband and lower outer sideband signals, is less likely to be erroneous; and selecting recovered source bit information determined in said determining step as being less likely to be erroneous.

23. The method of claim 22, wherein said receiving step further includes receiving redundantly modulated upper outer sideband signals at a different point in time than the corresponding redundantly modulated lower outer sideband signals whereby the method is robust certain deleterious effects which may affect both outer sideband signals at once.

24. A method of transmitting a redundant IBOC-DAB radio frequency (RF) signal in an IBOC DAB RF communication system which is robust to certain deleterious effects, the method comprising the steps of:

providing a source message which is to be at least partially redundantly transmitted to a corresponding receiver;

using the source message to generate codeword information, a first part of which is used to redundantly data-modulate a set of subcarrier signals in each of an upper outer sideband and a lower outer sideband of a predetermined RF mask over a plurality of baud intervals so that the respective outer sideband signals include redundant codeword information thus providing frequency diversity, and a second part of the codeword information is used to data-modulate a set of subcarrier signals in at least one of an upper inner and a lower inner sideband resulting in at least one inner sideband signal;

time-delaying the codeword information used for the modulation of only one of the upper outer and lower outer sideband digital signals relative to the other;

generating an analog AM-compatible monophonic signal to be transmitted; and transmitting together, via an antenna, the analog AM-compatible monophonic signal, the inner sideband signal, and the redundant outer sideband digital signals to an IBOC-DAB receiver.

25. A method of receiving a digitally modulated signal including codeword information, the method comprising the steps of:

receiving the digitally modulated signal that has a first part of the codeword information redundant in an upper outer sideband and a lower outer sideband relative to a center frequency of a predetermined mask, and a second part of the codeword information non-linearly modulated in inner sidebands of the mask;

demodulating received signals from the upper outer, lower outer, and non-linearly modulated inner sidebands;

determining which of recovered duplicated codewords from (i) demodulation of the inner sideband signals and upper outer sideband signals, and (ii) demodulation of the said inner sideband signals and lower outer sideband signals, is less likely to be erroneous; and selecting recovered source bit information from the demodulated codeword determined in said determining step has to be likely to be erroneous.

26. An in-band on-channel (IBOC) digital broadcast receiver comprising:

receiving means for receiving a redundantly transmitted IBOC digital RF signal including encoded source bit information, said receiving means for receiving a first portion of said encoded source bit information that is duplicated by modulation of signals in each of an upper outer and a lower outer sideband of a predetermined mask, and for receiving a second portion of said encoded source bit information that is used to non-linearly modulate signals in each of an upper inner sideband and a lower inner sideband, whereby the upper outer sideband signal is redundant to the lower outer sideband signal;

demodulation means for demodulating the received IBOC digital signal in the upper outer sideband, the lower outer sideband, the upper inner sideband, and the lower inner sideband in order to determine at least partially duplicated demodulated source bit information for each at least partially redundantly transmitted codeword made up of said source bit information;

determination means for determining whether the source bit information for the codeword having a portion thereof in the at least partially upper outer sideband or the at least partially duplicate codeword having a similar portion thereof in the lower outer sideband is less likely to be erroneous; and selection means for selecting the source bit information determined by said determination means to be less likely erroneous.

27. The IBOC receiver of claim 26, wherein said receiving means is further for simultaneously receiving within said mask said IBOC signal and together with an analog AM-compatible monophonic signal located in a central region of said mask about a center frequency.

* * * * *